(12) United States Patent
Or-Bach et al.

(10) Patent No.: US 11,881,443 B2
(45) Date of Patent: *Jan. 23, 2024

(54) 3D SEMICONDUCTOR DEVICE AND STRUCTURE WITH METAL LAYERS AND A CONNECTIVE PATH

(71) Applicant: Monolithic 3D Inc., Klamath Falls, OR (US)

(72) Inventors: Zvi Or-Bach, Haifa (IL); Deepak C. Sekar, Sunnyvale, CA (US); Brian Cronquist, Klamath Falls, OR (US)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/215,631

(22) Filed: Jun. 28, 2023

(65) Prior Publication Data
US 2023/0343679 A1     Oct. 26, 2023

Related U.S. Application Data

(63) Continuation-in-part of application No. 18/136,336, filed on Apr. 19, 2023, now Pat. No. 11,735,501,
(Continued)

(51) Int. Cl.
*H01L 23/48* (2006.01)
*H01L 27/06* (2006.01)
(Continued)

(52) U.S. Cl.
CPC .......... *H01L 23/481* (2013.01); *H01L 21/743* (2013.01); *H01L 23/34* (2013.01);
(Continued)

(58) Field of Classification Search
CPC ..... H01L 23/481; H01L 21/743; H01L 23/34; H01L 23/50; H01L 23/544;
(Continued)

(56) References Cited

U.S. PATENT DOCUMENTS 3,007,090 A    10/1961   Rutz
3,819,959 A     6/1974   Chang et al.
(Continued)

FOREIGN PATENT DOCUMENTS

EP            1267594 A2    12/2002
WO   PCT/US2008/063483      5/2008

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.
(Continued)

*Primary Examiner* — John P. Dulka
(74) *Attorney, Agent, or Firm* — PowerPatent; Bao Tran

(57) ABSTRACT

A 3D semiconductor device, the device including: a first level including a plurality of first metal layers; a second level, where the second level overlays the first level, where the second level includes at least one single crystal silicon layer, where the second level includes a plurality of transistors, where each transistor of the plurality of transistors includes a single crystal channel, where the second level includes a plurality of second metal layers, where the plurality of second metal layers include interconnections between the transistors of the plurality of transistors, and where the second level is overlaid by a first isolation layer; and a connective path from the plurality of transistors to the plurality of first metal layers, where the connective path includes a via disposed through at least the single crystal silicon layer, and where at least one of the via includes a contact to at least one of the transistors.

15 Claims, 73 Drawing Sheets

Related U.S. Application Data which is a continuation-in-part of application No. 18/109,254, filed on Feb. 13, 2023, now Pat. No. 11,694,944, which is a continuation-in-part of application No. 18/070,422, filed on Nov. 28, 2022, now Pat. No. 11,616,004, which is a continuation-in-part of application No. 17/941,891, filed on Sep. 9, 2022, now Pat. No. 11,594,473, which is a continuation-in-part of application No. 17/850,819, filed on Jun. 27, 2022, now Pat. No. 11,476,181, which is a continuation-in-part of application No. 17/492,577, filed on Oct. 2, 2021, now Pat. No. 11,410,912, which is a continuation-in-part of application No. 17/313,986, filed on May 6, 2021, now Pat. No. 11,164,811, which is a continuation-in-part of application No. 16/852,506, filed on Apr. 19, 2020, now Pat. No. 11,088,050, which is a continuation-in-part of application No. 16/536,606, filed on Aug. 9, 2019, now Pat. No. 10,665,695, which is a continuation-in-part of application No. 16/004,404, filed on Jun. 10, 2018, now Pat. No. 10,600,888, which is a continuation-in-part of application No. 15/917,629, filed on Mar. 10, 2018, now Pat. No. 10,038,073, which is a continuation-in-part of application No. 15/622,124, filed on Jun. 14, 2017, now Pat. No. 9,954,080, which is a continuation-in-part of application No. 14/880,276, filed on Oct. 11, 2015, now Pat. No. 9,691,869, which is a continuation-in-part of application No. 14/472,108, filed on Aug. 28, 2014, now Pat. No. 9,305,867, which is a continuation of application No. 13/959,994, filed on Aug. 6, 2013, now Pat. No. 8,836,073, which is a continuation of application No. 13/441,923, filed on Apr. 9, 2012, now Pat. No. 8,557,632.

(51) Int. Cl.

| | |
|---|---|
| *H01L 27/088* | (2006.01) |
| *H01L 29/66* | (2006.01) |
| *H01L 23/544* | (2006.01) |
| *H01L 29/732* | (2006.01) |
| *H01L 27/118* | (2006.01) |
| *H01L 29/10* | (2006.01) |
| *H01L 29/808* | (2006.01) |
| *H01L 27/02* | (2006.01) |
| *H01L 29/78* | (2006.01) |
| *H01L 21/74* | (2006.01) |
| *H10B 12/00* | (2023.01) |
| *H10B 41/20* | (2023.01) |
| *H10B 41/40* | (2023.01) |
| *H10B 43/20* | (2023.01) |
| *H10B 43/40* | (2023.01) |
| *H01L 23/34* | (2006.01) |
| *H01L 23/50* | (2006.01) |
| *H10B 63/00* | (2023.01) |

(52) U.S. Cl.
CPC ............ *H01L 23/50* (2013.01); *H01L 23/544* (2013.01); *H01L 27/0207* (2013.01); *H01L 27/0688* (2013.01); *H01L 27/088* (2013.01); *H01L 27/0886* (2013.01); *H01L 27/11807* (2013.01); *H01L 29/1066* (2013.01); *H01L 29/66272* (2013.01); *H01L 29/66704* (2013.01); *H01L 29/66825* (2013.01); *H01L 29/66901* (2013.01); *H01L 29/732* (2013.01); *H01L 29/7841* (2013.01); *H01L 29/808* (2013.01); *H10B 12/09* (2023.02); *H10B 12/20* (2023.02); *H10B 12/50* (2023.02); *H10B 41/20* (2023.02); *H10B 41/40* (2023.02); *H10B 43/20* (2023.02); *H10B 43/40* (2023.02); *H01L 27/0623* (2013.01); *H01L 2224/16225* (2013.01); *H01L 2224/73253* (2013.01); *H01L 2924/12032* (2013.01); *H01L 2924/1305* (2013.01); *H01L 2924/13062* (2013.01); *H01L 2924/13091* (2013.01); *H01L 2924/1461* (2013.01); *H01L 2924/16152* (2013.01); *H10B 63/30* (2023.02); *H10B 63/845* (2023.02)

(58) Field of Classification Search
CPC ............ H01L 27/0207; H01L 27/0688; H01L 27/088; H01L 27/0886; H01L 27/11807; H01L 29/1066; H01L 29/66272; H01L 29/66704; H01L 29/66825; H01L 29/66901; H01L 29/732; H01L 29/7841; H01L 29/808; H01L 27/0623; H01L 2224/16225; H01L 2224/73253; H01L 2924/12032; H01L 2924/1305; H01L 2924/13062; H01L 2924/13091; H01L 2924/1461; H01L 2924/16152; H10B 12/09; H10B 12/20; H10B 12/50; H10B 41/20; H10B 41/40; H10B 43/20; H10B 43/40; H10B 63/30; H10B 63/845
See application file for complete search history.

(56) References Cited

U.S. PATENT DOCUMENTS

| | | |
|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |

(56) References Cited

U.S. PATENT DOCUMENTS

| | | |
|---|---|---|
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B2 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |

(56) References Cited

U.S. PATENT DOCUMENTS

| | | |
|---|---|---|
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,615,462 B2 | 11/2009 | Kim et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,670,912 B2 | 3/2010 | Yeo |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |

(56) References Cited

U.S. PATENT DOCUMENTS

| | | |
|---|---|---|
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 7,983,065 B2 | 7/2011 | Samachisa |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,264,065 B2 | 9/2012 | Su et al. |
| 8,266,560 B2 | 9/2012 | McIlrath |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,374,033 B2 | 2/2013 | Kito et al. |
| 8,426,294 B2 | 4/2013 | Lung et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |
| 8,514,623 B2 | 8/2013 | Widjaja et al. |
| 8,516,408 B2 | 8/2013 | Dell |
| 8,566,762 B2 | 8/2013 | Morimoto et al. |
| 8,525,342 B2 | 10/2013 | Chandrasekaran |
| 8,546,956 B2 | 10/2013 | Nguyen |
| 8,603,888 B2 | 12/2013 | Liu |
| 8,611,388 B2 | 12/2013 | Krasulick et al. |
| 8,619,490 B2 | 12/2013 | Yu |
| 8,630,326 B2 | 1/2014 | Krasulick et al. |
| 8,643,162 B2 | 2/2014 | Madurawe |
| 8,650,516 B2 | 2/2014 | McIlrath |
| 8,654,584 B2 | 2/2014 | Kim et al. |
| 8,679,861 B2 | 3/2014 | Bose |
| 8,736,068 B2 | 5/2014 | Bartley et al. |
| 8,773,562 B1 | 7/2014 | Fan |
| 8,775,998 B2 | 7/2014 | Morimoto |
| 8,824,183 B2 | 9/2014 | Samachisa et al. |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,105,689 B1 | 8/2015 | Fanelli |
| 9,172,008 B2 | 10/2015 | Hwang |
| 9,227,456 B2 | 1/2016 | Chien |
| 9,230,973 B2 | 1/2016 | Pachamuthu et al. |
| 9,269,608 B2 | 2/2016 | Fanelli |
| 9,334,582 B2 | 5/2016 | See |
| 9,391,090 B2 | 7/2016 | Manorotkul et al. |
| 9,472,568 B2 | 10/2016 | Shin et al. |
| 9,564,450 B2 | 2/2017 | Sakuma et al. |
| 9,570,683 B1 | 2/2017 | Jo |
| 9,589,982 B1 | 3/2017 | Cheng et al. |
| 9,595,530 B1 | 3/2017 | Zhou |
| 9,627,287 B2 | 4/2017 | Engelhardt et al. |
| 9,673,257 B1 | 6/2017 | Takaki |
| 9,997,530 B2 | 6/2018 | Yon et al. |
| 10,199,354 B2 | 2/2019 | Modi et al. |
| 11,694,944 B1 * | 7/2023 | Or-Bach ............ H10B 41/20 257/499 |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonelli et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |

(56) References Cited

U.S. PATENT DOCUMENTS

| | | |
|---|---|---|
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0108627 A1 | 5/2006 | Choi et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0176214 A1 | 8/2007 | Kwon et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0123418 A1 | 5/2008 | Widjaja |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |

(56) References Cited

U.S. PATENT DOCUMENTS

| | | |
|---|---|---|
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0294990 A1 | 12/2009 | Ishino et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0059864 A1 | 3/2010 | Mahler et al. |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |

(56) References Cited

U.S. PATENT DOCUMENTS

| | | |
|---|---|---|
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0128777 A1 | 6/2011 | Yamazaki |
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1* | 1/2012 | Sadaka ............... H01L 24/83 257/773 |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0146193 A1 | 6/2012 | Stuber et al. |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |
| 2012/0241919 A1 | 9/2012 | Mitani |
| 2012/0286124 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2013/0207243 A1 | 8/2013 | Fuergut et al. |
| 2013/0263393 A1 | 10/2013 | Mazumder |
| 2013/0337601 A1 | 12/2013 | Kapur |
| 2014/0015136 A1 | 1/2014 | Gan et al. |
| 2014/0030871 A1 | 1/2014 | Arriagada et al. |
| 2014/0035616 A1 | 2/2014 | Oda et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0357054 A1 | 12/2014 | Son et al. |
| 2015/0021785 A1 | 1/2015 | Lin |
| 2015/0034898 A1 | 2/2015 | Wang |
| 2015/0243887 A1 | 8/2015 | Saitoh |
| 2015/0255418 A1 | 9/2015 | Gowda |
| 2015/0279829 A1 | 10/2015 | Kuo |
| 2015/0340369 A1 | 11/2015 | Lue |
| 2016/0049201 A1 | 2/2016 | Lue |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0343687 A1 | 11/2016 | Vadhavkar |
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2017/0278858 A1 | 9/2017 | Walker et al. |
| 2018/0090219 A1 | 3/2018 | Harari |
| 2018/0090368 A1 | 3/2018 | Kim |
| 2018/0108416 A1 | 4/2018 | Harari |
| 2018/0294284 A1 | 10/2018 | Tarakji |
| 2019/0006009 A1 | 1/2019 | Harari |
| 2019/0043836 A1 | 2/2019 | Fastow et al. |
| 2019/0067327 A1 | 2/2019 | Herner et al. |
| 2019/0157296 A1 | 5/2019 | Harari et al. |
| 2020/0020408 A1 | 1/2020 | Norman et al. |
| 2020/0020718 A1 | 1/2020 | Harari et al. |
| 2020/0051990 A1 | 2/2020 | Harari et al. |
| 2020/0105773 A1 | 4/2020 | Morris et al. |
| 2020/0227123 A1 | 7/2020 | Salahuddin et al. |
| 2020/0243486 A1 | 7/2020 | Quader et al. |

OTHER PUBLICATIONS

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et. al., "Direct bonding for wafer level 3D integration", ICICDT 2010, pp. 110-113.

(56) References Cited

OTHER PUBLICATIONS

Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.
Celler, G.K. et al., "Frontiers of silicon-on-insulator," J. App. Phys., May 1, 2003, pp. 4955-4978, vol. 93, No. 9.
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Hui, K. N., et al., "Design of vertically-stacked polychromatic light-emitting diodes," Optics Express, Jun. 8, 2009, pp. 9873-9878, vol. 17, No. 12.
Chuai, D. X., et al., "A Trichromatic Phosphor-Free White Light-Emitting Diode by Using Adhesive Bonding Scheme," Proc. SPIE, 2009, vol. 7635.
Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Flamand, G. et al., "Towards Highly Efficient 4-Terminal Mechanical Photovoltaic Stacks," III-Vs Review, Sep.-Oct. 2006, pp. 24-27, vol. 19, Issue 7.
Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.

Franzon, P.D. et al., "Design and CAD for 3D Integrated Circuits," 45th ACM/IEEE Design, Automation Conference (DAC), Jun. 8-13, 2008, pp. 668-673.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," Chptr. 13.4, pp. 407-410, in "Integrated Interconnect Technologies for 3D Nano Electronic Systems", 2009, Artech House.
Weis, M. et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "CELONCEL: Effective Design Technique for 3-D Monolithic Integration targeting High Performance Integrated Circuits", Asia pacific DAC 2011, paper 4A-4.
Choudhury, D., "3D Integration Technologies for Emerging Microsystems", IEEE Proceedings of the IMS 2010, pp. 1-4.
Lee, Y.-J., et. al, "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.

(56) References Cited

OTHER PUBLICATIONS

Radu, I., et al., "Recent Developments of Cu—Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., ""Three Dimensionally Stacked NAND Flash Memory Technology Using Stacking Single Crystal Si Layers on ILD and TANOS Structure for Beyond 30nm Node"", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J. et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.

Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration", www.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, P-E., et al., "Can We Go Towards True 3-D Architectures? ," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunties in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.

(56) References Cited

OTHER PUBLICATIONS

Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.
Kuroda, T., "ThruChip Interface for Heterogeneous Chip Stacking," ElectroChemicalSociety Transactions, 50 (14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J.-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.
Wu, B., et al., "Extreme ultraviolet lithography and three dimensional circuits," Applied Physics Reviews, 1, 011104 (2014).
Delhougne, R., et al., "First Demonstration of Monocrystalline Silicon Macaroni Channel for 3-D NAND Memory Devices" IEEE VLSI Tech Digest, 2018, pp. 203-204.
Kim, J., et al.; "A stacked memory device on logic 3D technology for ultra-high-density data storage"; Nanotechnology 22 (2011) 254006 (7pp).
Hsieh, P-Y, et al., "Monolithic 3D BEOL FinFET switch arrays using location-controlled-grain technique in voltage regulator with better FOM than 2D regulators", IEDM paper 3.1, pp. IEDM19-46 to IEDM19-49.
Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402 to IEDM19-405.
Rachmady, W., et al., "300mm Heterogeneous 3D Integration of Record Performance Layer Transfer Germanium PMOS with Silicon NMOS for Low Power High Performance Logic Applications", IEDM 2019, paper 29.7, pp. IEDM19-697 to IEDM19-700.

Colinge, J. P., et al., "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.
Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.
Abramovici, Breuer and Friedman, Digital Systems Testing and Testable Design, Computer Science Press, 1990, pp. 432-447.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T. et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.
Burr, G. W., et al., "Overview of candidate device technologies for storage-class memory," IBM Journal of Research and Development, vol. 52, No. 4.5, pp. 449-464, Jul. 2008.
Bez, R., et al., "Introduction to Flash memory," Proceedings IEEE, 91(4), 489-502 (2003).
Auth, C., et al., "45nm High-k + Metal Gate Strain-Enchanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et.al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International, pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.

(56) References Cited

OTHER PUBLICATIONS

Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Wierer, J.J. et al., "High-power AlGaInN flip-chip light-emitting diodes, " Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.

(56) References Cited

OTHER PUBLICATIONS

Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings DATE, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Meindl, J. D., "Beyond Moore's Law: the Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.

(56) References Cited

OTHER PUBLICATIONS

Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+" Applied Physics Letters, vol. 72, No. 9, Mar. 1998, pp. 1086-1088.

Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IEEE International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C.," Japanese Journal of Applied Physics, vol. 46, No. 3B, 2007, pp. 1245-1249.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.
Yang, M., et al., "High Performance CMOS Fabricated on Hybrid Substrate with Different Crystal Orientation," Proceedings IEDM 2003.
Yin, H., et al., "Scalable 3-D finlike poly-Si TFT and its nonvolatile memory application," IEEE Trans. Electron Devices, vol. 55, No. 2, pp. 578-584, Feb. 2008.
Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Applied Physics, vol. 46, No. 1, 2007, pp. 21-23.
Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.
Khakifirooz, A., "ETSOI Technology for 20nm and Beyond", SOI Consortium Workshop: Fully Depleted SOI, Apr. 28, 2011, Hsinchu Taiwan.
Kim, I.-K., et al., "Advanced Integration Technology for a Highly Scalable SOI DRAM with SOC (Silicon-On-Capacitors)", IEDM 1996, pp. 96-605-608, 22.5.4.
Lee, B.H., et al., "A Novel CMP Method for cost-effective Bonded SOI Wafer Fabrication," Proceedings 1995 IEEE International SOI Conference, Oct. 1995, pp. 60-61.
Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.
Chang, Wei, et al., "Drain-induced Schottky barrier source-side hot carriers and its application to program local bits of nanowire

(56) References Cited

OTHER PUBLICATIONS charge-trapping memories," Japanese Journal of Applied Physics 53, 094001 (2014) pp. 094001-1 to 094001-5.

* cited by examiner

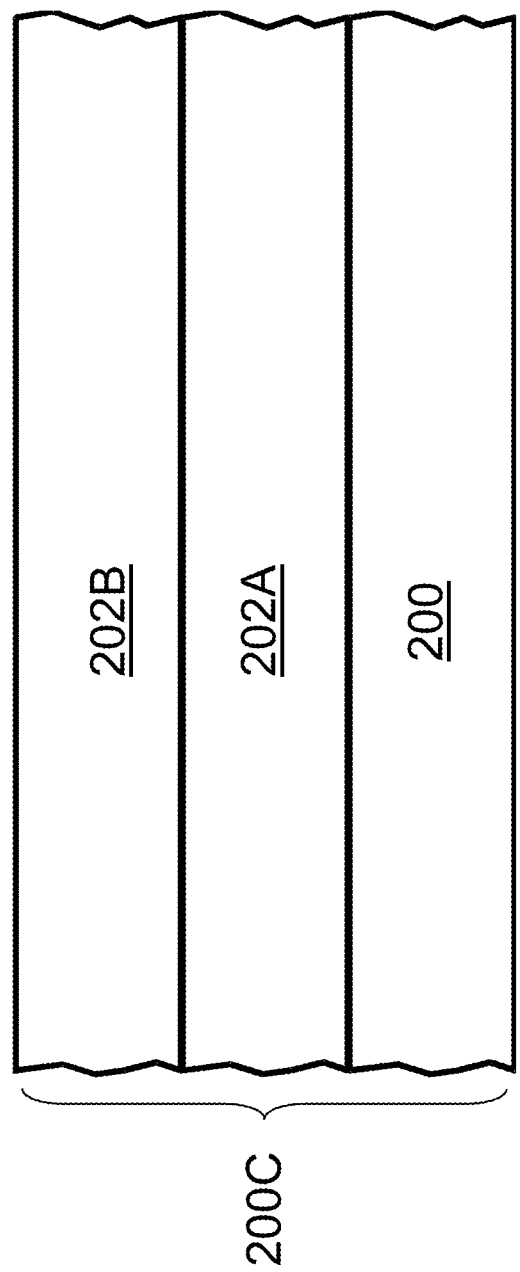

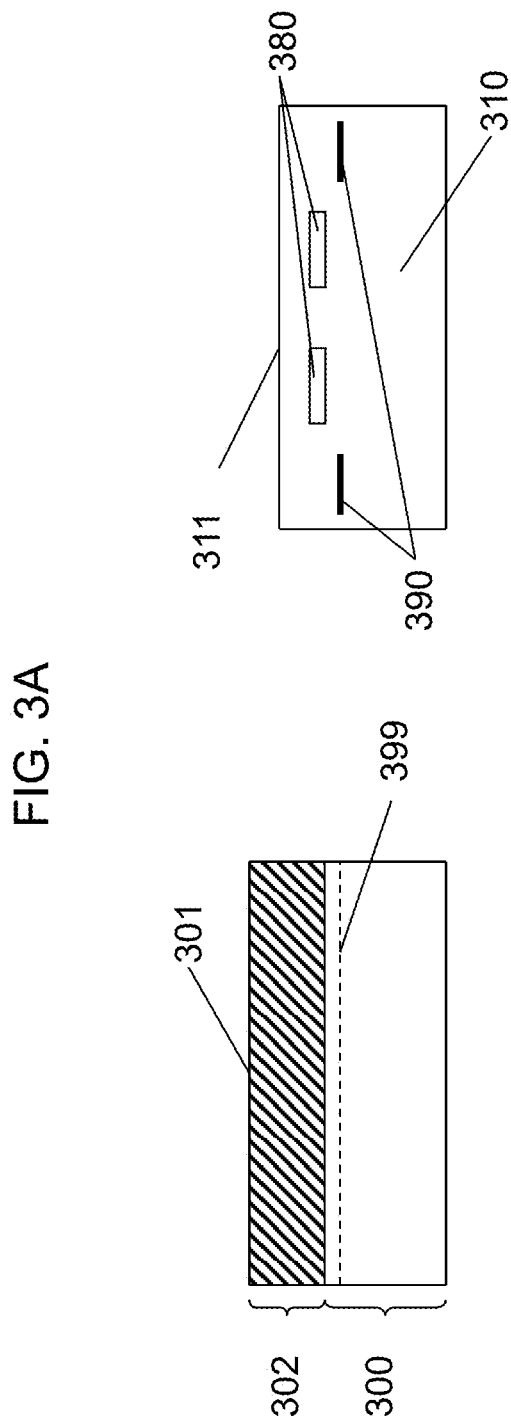

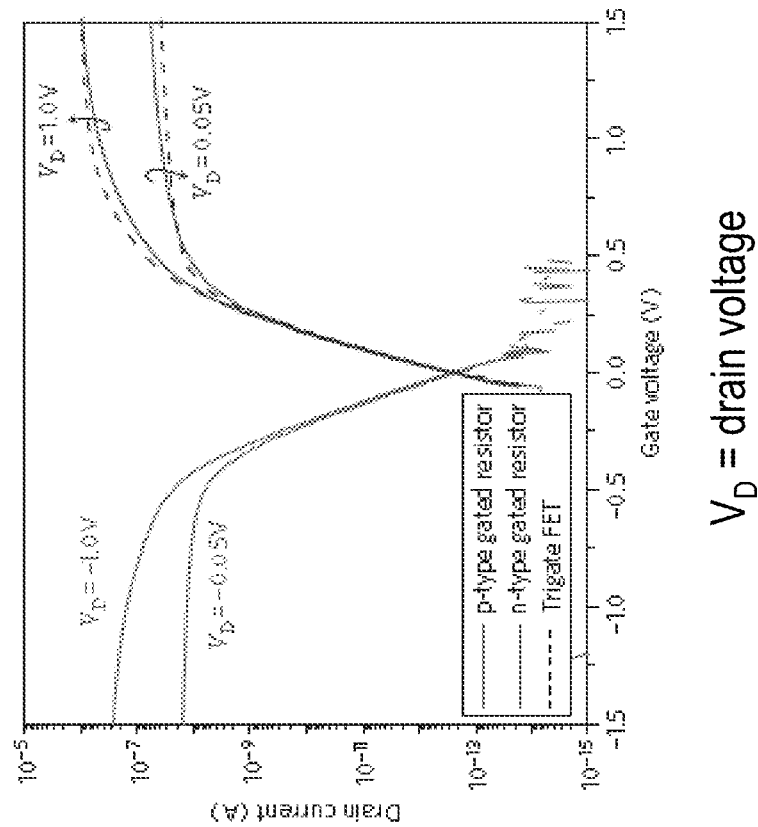
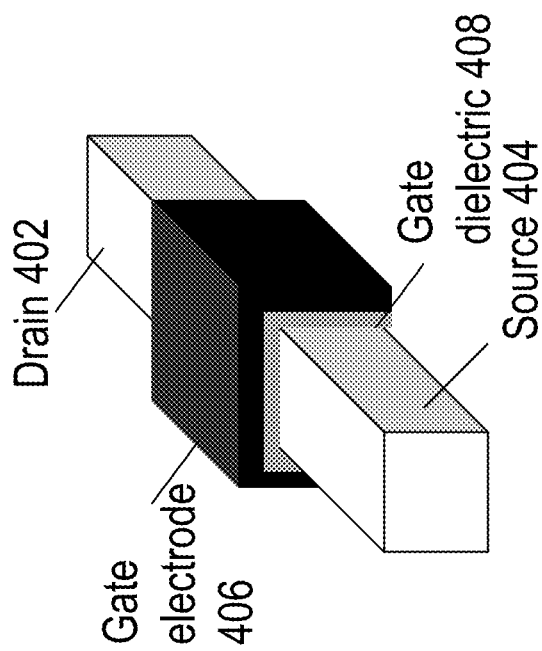
Fig. 4

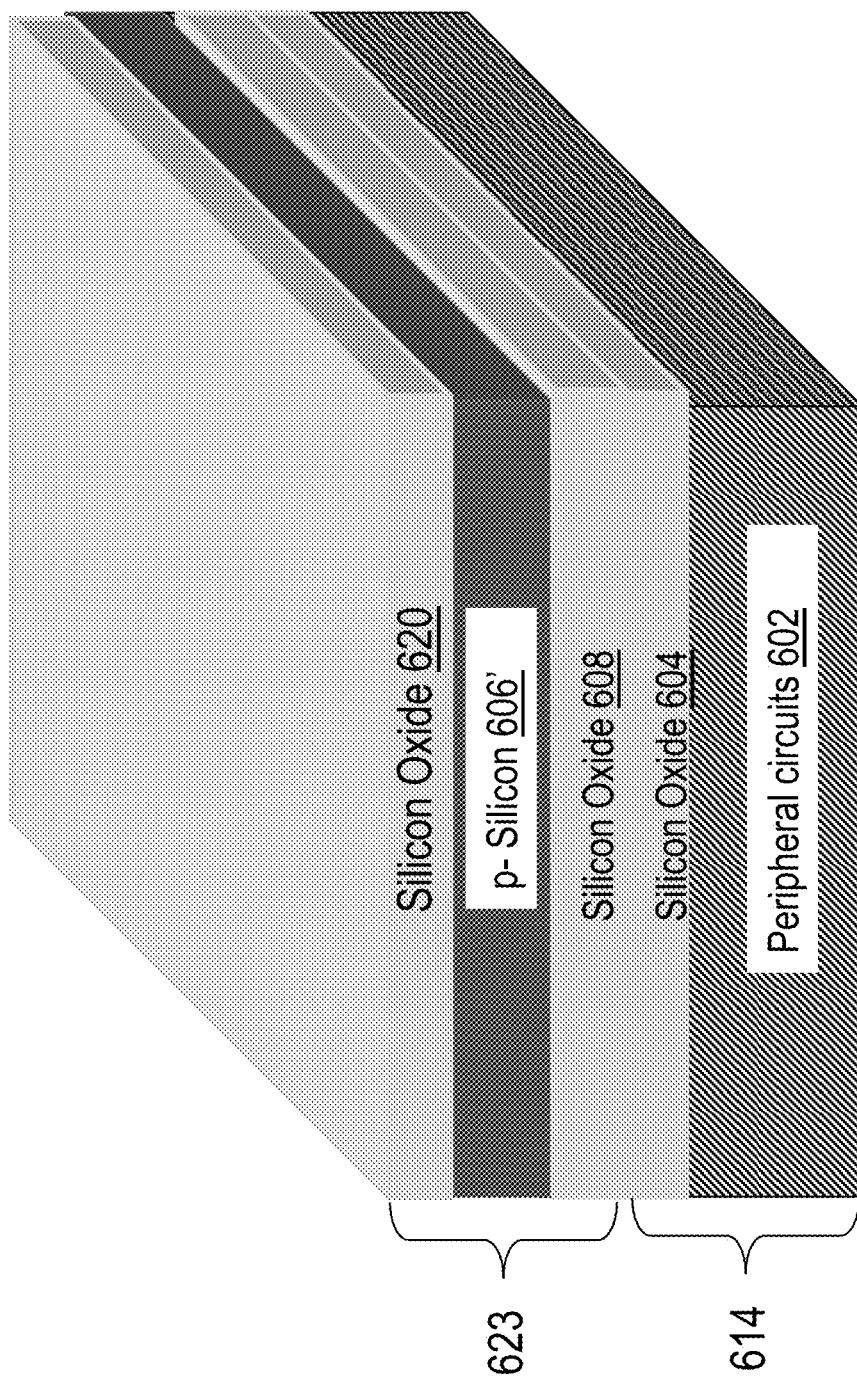

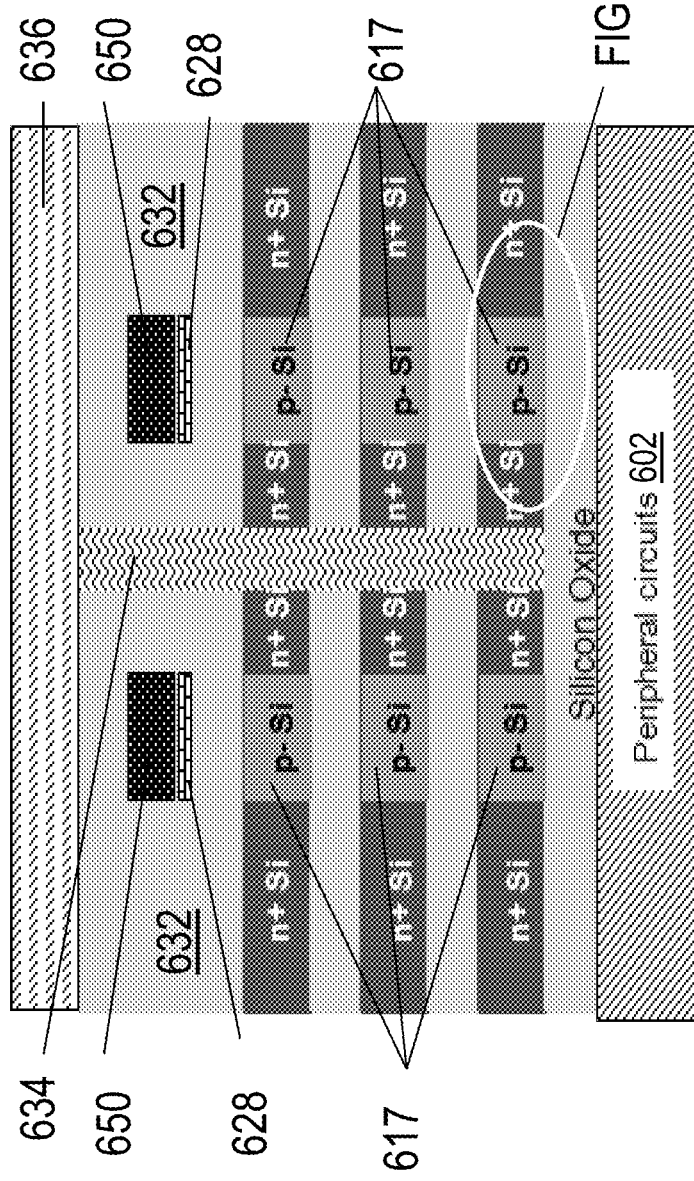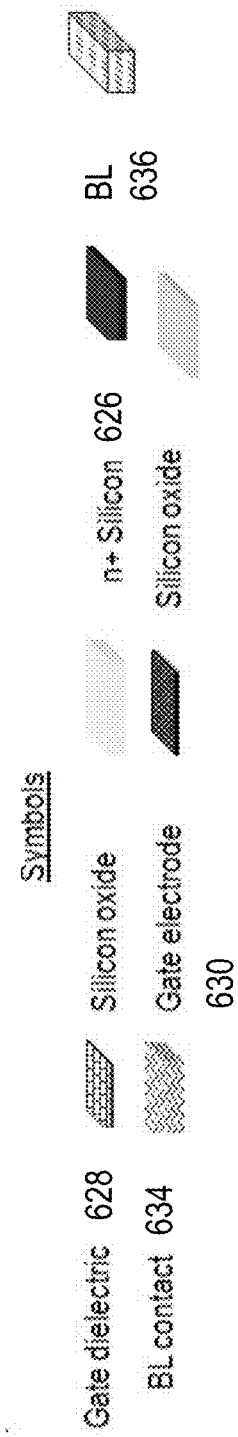

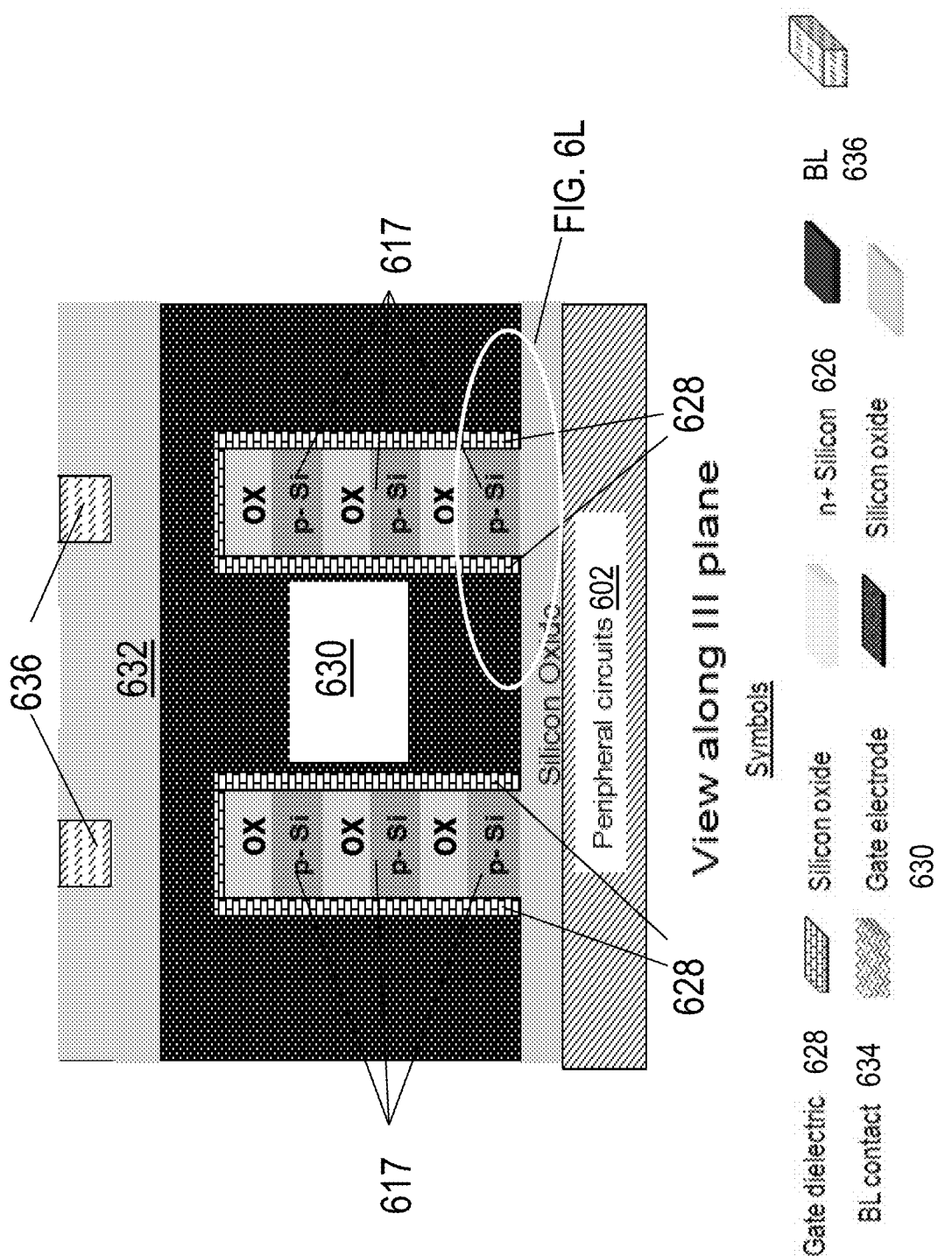
FIG. 6K2

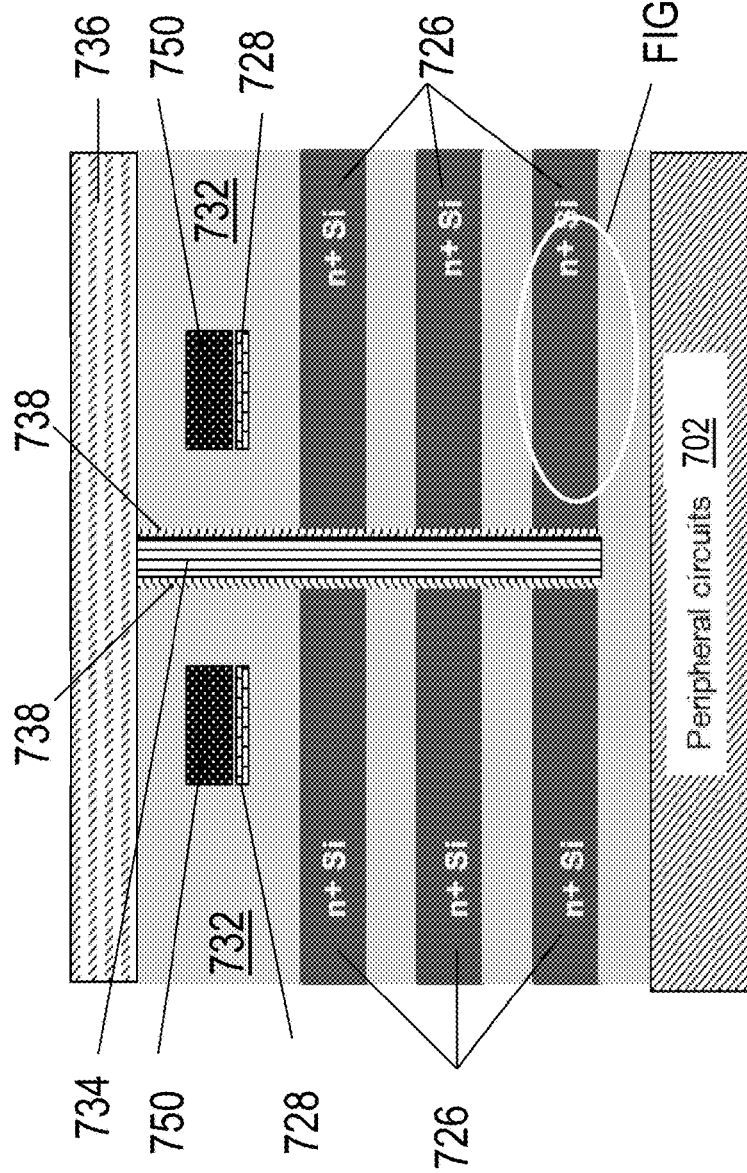
FIG. 7J1

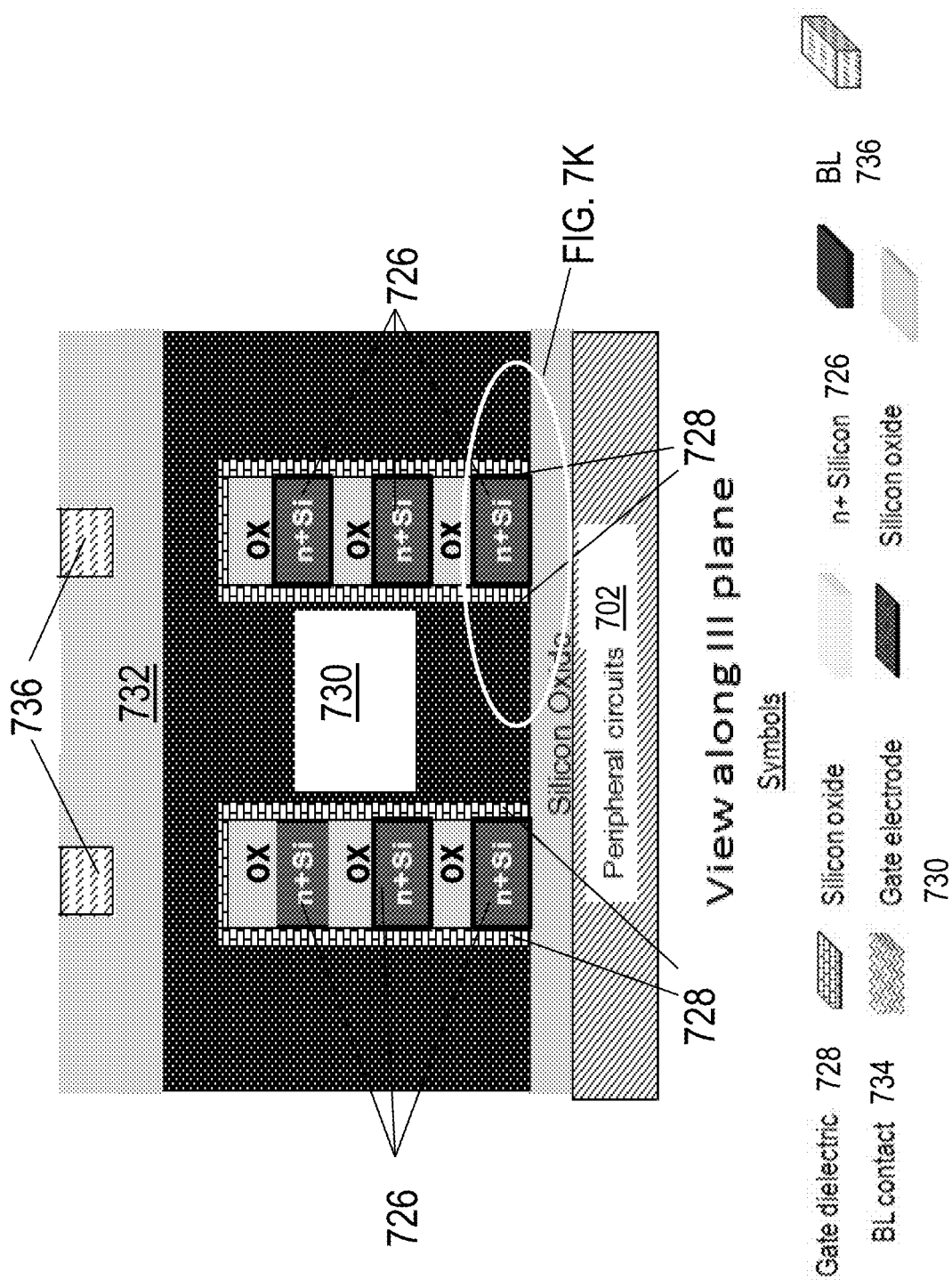
FIG. 7J2

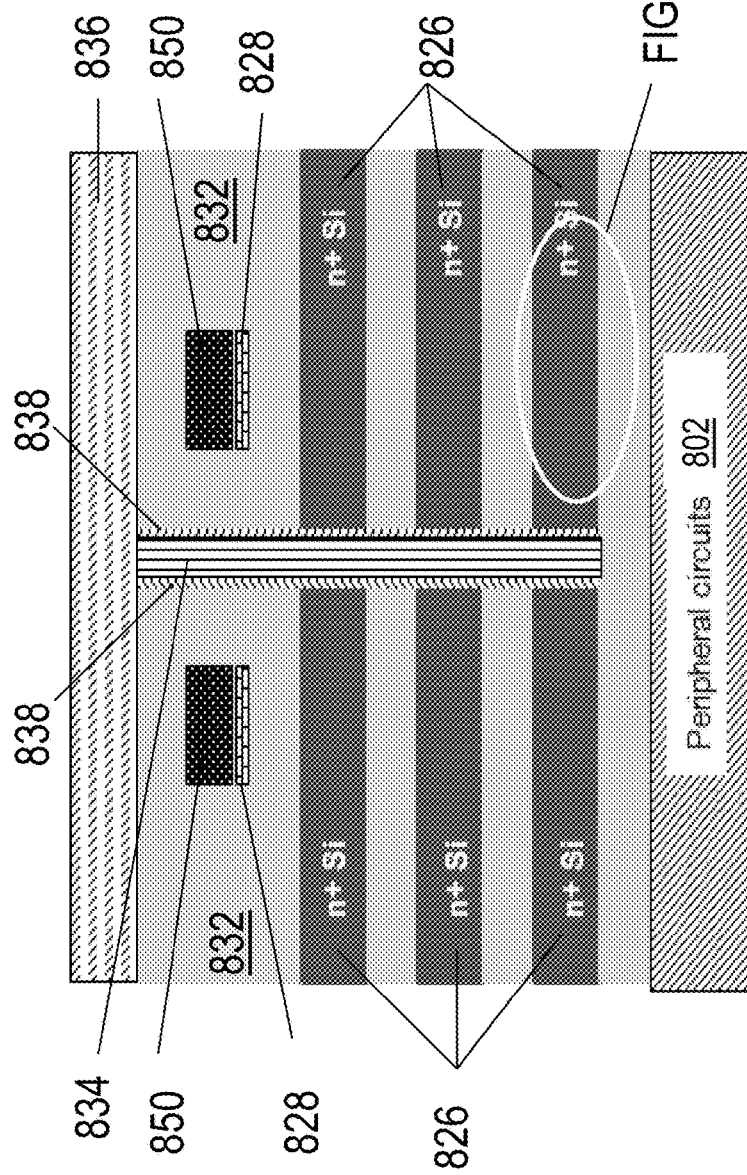
FIG. 8J1

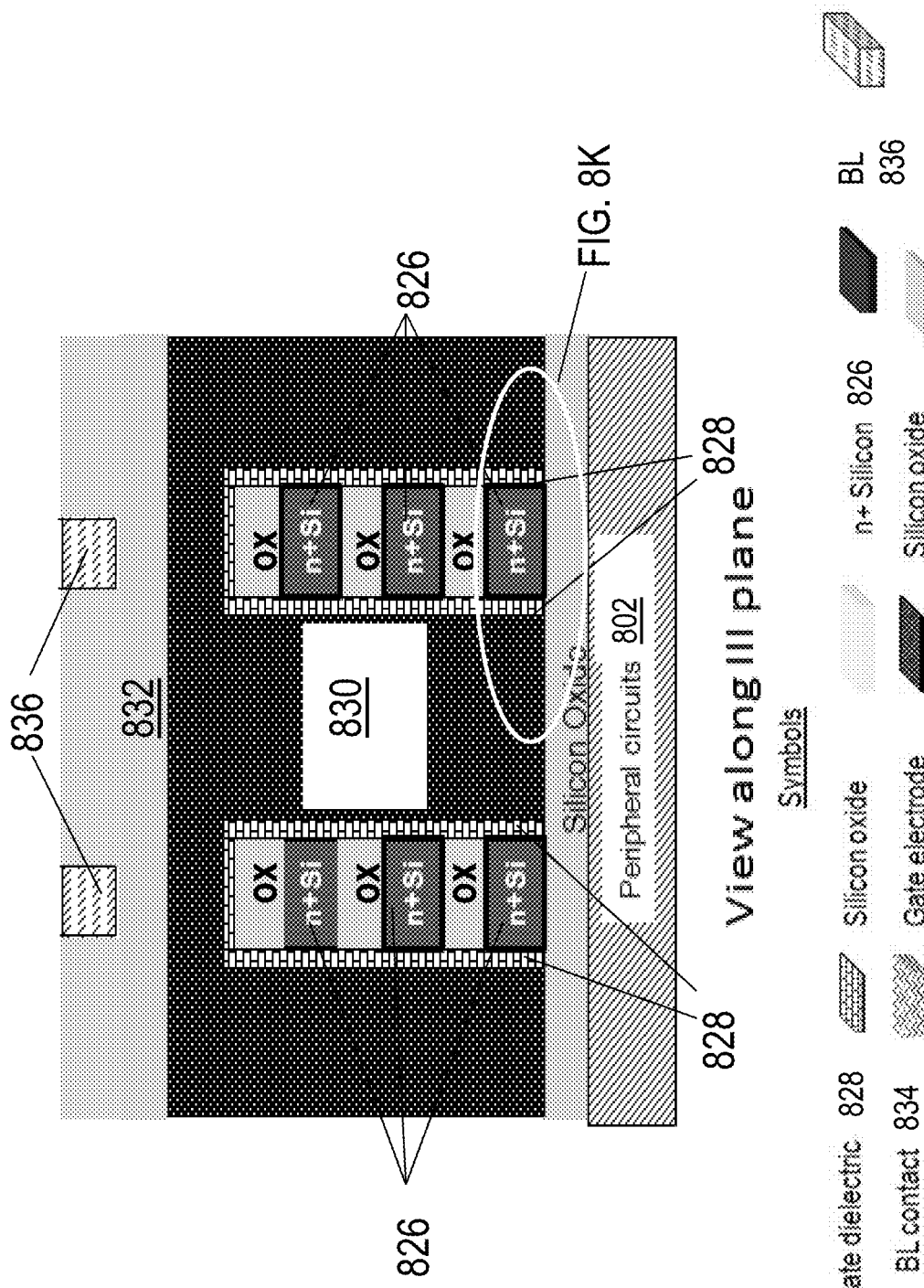

3D SEMICONDUCTOR DEVICE AND STRUCTURE WITH METAL LAYERS AND A CONNECTIVE PATH

CROSS-REFERENCE OF RELATED APPLICATION

This application is a continuation-in-part application of U.S. patent application Ser. No. 18/136,336 which was filed on Apr. 19, 2023 (now U.S. Pat. No. 11,735,501 issued on Aug. 22, 2023), is a continuation-in-part application of U.S. patent application Ser. No. 18/109,254 which was filed on Feb. 13, 2023 (now U.S. Pat. No. 11,694,944 issued on Jul. 4, 2023), which is a continuation-in-part application of U.S. patent application Ser. No. 18/070,422 which was filed on Nov. 28, 2022 (now U.S. Pat. No. 11,616,004 issued on Mar. 28, 2023), which is a continuation-in-part application of U.S. patent application Ser. No. 17/941,891 which was filed on Sep. 9, 2022 (now U.S. Pat. No. 11,594,473 issued on Feb. 28, 2023), which is a continuation-in-part application of U.S. patent application Ser. No. 17/850,819 which was filed on Jun. 27, 2022 (now U.S. Pat. No. 11,476,181 issued on Oct. 18, 2022), which is a continuation-in-part application of U.S. patent application Ser. No. 17/492,577 which was filed on Oct. 2, 2021 (now U.S. Pat. No. 11,410,912 issued on Aug. 9, 2022), which is a continuation-in-part application of U.S. patent application Ser. No. 17/313,986, which was filed on May 6, 2021 (now U.S. Pat. No. 11,164,811 issued on Nov. 2, 2021), which is a continuation-in-part application of U.S. patent application Ser. No. 16/852,506, which was filed on Apr. 19, 2020 (now U.S. Pat. No. 11,088,050 issued on Aug. 10, 2021), which is a continuation-in-part application of U.S. patent application Ser. No. 16/536,606, which was filed on Aug. 9, 2019 (now U.S. Pat. No. 10,665,695 issued on May 26, 2020), which is a continuation-in-part application of U.S. patent application Ser. No. 16/004,404, which was filed on Jun. 10, 2018 (now U.S. Pat. No. 10,600,888 issued on Mar. 24, 2020), which is a continuation-in-part application of U.S. patent application Ser. No. 15/917,629, which was filed on Mar. 10, 2018 (now U.S. Pat. No. 10,038,073 issued on Jul. 31, 2018), which is a continuation-in-part application of U.S. patent application Ser. No. 15/622,124, which was filed on Jun. 14, 2017 (now U.S. Pat. No. 9,954,080 issued on Apr. 24, 2018), which is a continuation-in-part application of U.S. patent application Ser. No. 14/880,276, which was filed on Oct. 11, 2015 (now U.S. Pat. No. 9,691,869 issued on Jun. 27, 2017), which is a continuation-in-part application of U.S. patent application Ser. No. 14/472,108, which was filed on Aug. 28, 2014 (now U.S. Pat. No. 9,305,867 issued on Apr. 5, 2016), which is a continuation application of U.S. patent application Ser. No. 13/959,994, which was filed on Aug. 6, 2013 (now U.S. Pat. No. 8,836,073 issued on Sep. 25, 2014), which is a continuation application of U.S. patent application Ser. No. 13/441,923, which was filed on Apr. 9, 2012 (now U.S. Pat. No. 8,557,632 issued on Oct. 15, 2013); the entire contents of the foregoing are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D IC) devices and fabrication methods.

2. Discussion of Background Art

Performance enhancements and cost reductions in generations of electronic device technology has generally been achieved by reducing the size of the device, resulting in an enhancement in device speed and a reduction in the area of the device, and hence, its cost. This may be generally referred to as 'device scaling'. The dominant electronic device technology in use today may be the Metal-Oxide-Semiconductor field effect transistor (MOSFET) technology.

Performance and cost are driven by transistor scaling and the interconnection, or wiring, between those transistors. As the dimensions of the device elements have approached the nanometer scale, the interconnection wiring now dominates the performance, power, and density of integrated circuit devices as described in J. A. Davis, et. al., Proc. IEEE, vol. 89, no. 3, pp. 305-324, March 2001 (Davis).

Davis further teaches that three dimensional integrated circuits (3D ICs), i.e. electronic chips in which active layers of transistors are stacked one above the other, separated by insulating oxides and connected to each other by metal interconnect wires, may be the best way to continue Moore's Law, especially as device scaling slows, stops, or becomes too costly to continue. 3D integration would provide shorter interconnect wiring and hence improved performance, lower power consumption, and higher density devices.

One approach to a practical implementation of a 3D IC independently processes two fully interconnected integrated circuits including transistors and wiring, thins one of the wafers, bonds the two wafers together, and then makes electrical connections between the bonded wafers with Thru Silicon Vias (TSV) that may be fabricated prior to or after the bonding. This approach may be less than satisfactory as the density of TSVs may be limited, because they may require large landing pads for the TSVs to overcome the poor wafer to wafer alignment and to allow for the large (about one to ten micron) diameter of the TSVs as a result of the thickness of the wafers bonded together. Additionally, handling and processing thinned silicon wafers may be very difficult and prone to yield loss. Current prototypes of this approach only obtain TSV densities of 10,000s per chip, in comparison to the millions of interconnections currently obtainable within a single chip.

By utilizing Silicon On Insulator (SOI) wafers and glass handle wafers, A. W. Topol, et. al, in the IEDM Tech Digest, p 363-5 (2005), describe attaining TSVs of tenths of microns. The TSV density may be still limited as a result from misalignment issues resulting from pre-forming the random circuitry on both wafers prior to wafer bonding. In addition, SOI wafers are more costly than bulk silicon wafers.

Another approach may be to monolithically build transistors on top of a wafer of interconnected transistors. The utility of this approach may be limited by the requirement to maintain the reliability of the high performance lower layer interconnect metallization, such as, for example, aluminum and copper, and low-k intermetal dielectrics, and hence limits the allowable temperature exposure to below approximately 400° C. Some of the processing steps to create useful transistor elements may require temperatures above about 700° C., such as activating semiconductor doping or crystallization of a previously deposited amorphous material such as silicon to create a poly-crystalline silicon (polysilicon or poly) layer. It may be very difficult to achieve high performance transistors with only low temperature processing and without mono-crystalline silicon channels. However, this approach may be useful to construct memory devices where the transistor performance may not be critical.

Bakir and Meindl in the textbook "Integrated Interconnect Technologies for 3D Nanosystems", Artech House, 2009, Chapter 13, illustrate a 3D stacked Dynamic Random Access Memory (DRAM) where the silicon for the stacked transistors is produced using selective epitaxy technology or laser recrystallization. This concept may be unsatisfactory as the silicon processed in this manner may have a higher defect density when compared to single crystal silicon and hence may suffer in performance, stability, and control. It may also require higher temperatures than the underlying metallization or low-k intermetal dielectric could be exposed to without reliability concerns.

Sang-Yun Lee in U.S. Pat. No. 7,052,941 discloses methods to construct vertical transistors by preprocessing a single crystal silicon wafer with doping layers activated at high temperature, layer transferring the wafer to another wafer with preprocessed circuitry and metallization, and then forming vertical transistors from those doping layers with low temperature processing, such as etching silicon. This may be less than satisfactory as the semiconductor devices in the market today utilize horizontal or horizontally oriented transistors and it would be very difficult to convince the industry to move away from the horizontal. Additionally, the transistor performance may be less than satisfactory as a result from large parasitic capacitances and resistances in the vertical structures, and the lack of self-alignment of the transistor gate.

A key technology for 3D IC construction may be layer transfer, whereby a thin layer of a silicon wafer, called the donor wafer, may be transferred to another wafer, called the acceptor wafer, or target wafer. As described by L. DiCioccio, et. al., at ICICDT 2010 pg 110, the transfer of a thin (about tens of microns to tens of nanometers) layer of mono-crystalline silicon at low temperatures (below approximately 400° C.) may be performed with low temperature direct oxide-oxide bonding, wafer thinning, and surface conditioning. This process is called "Smart Stacking" by Soitec (Crolles, France). In addition, the "SmartCut" process is a well understood technology used for fabrication of SOI wafers. The "SmartCut" process employs a hydrogen implant to enable cleaving of the donor wafer after the layer transfer. These processes with some variations and under different names may be commercially available from SiGen (Silicon Genesis Corporation, San Jose, CA). A room temperature wafer bonding process utilizing ion-beam preparation of the wafer surfaces in a vacuum has been recently demonstrated by Mitsubishi Heavy Industries Ltd., Tokyo, Japan. This process allows room temperature layer transfer.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219,005, 9,385,058, 9,406,670, 9,460,978, 9,509,313, 9,640,531, 9,691,760, 9,711,407, 9,721,927, 9,799,761, 9,871,034, 9,953,870, 9,953,994, 10,014,292, 10,014,318, 10,515,981, 10,892,016, 10,991,675, 11,121,121, 11,502, 095, 10,892,016, 11,270,988; and U.S. Patent Application Publications and applications, Ser. Nos. 14/642,724, 15/150, 395, 15/173,686, 62/651,722; 62/681,249, 62/713,345, 62/770,751, 62/952,222, 62/824,288, 63/075,067, 63/091, 307, 63/115,000, 63/220,443, 2021/0242189, 2020/ 0013791; and PCT Applications (and Publications): PCT/ US2010/052093, PCT/US2011/042071 (WO2012/015550), PCT/US2016/52726 (WO2017053329), PCT/US2017/ 052359 (WO2018/071143), PCT/US2018/016759 (WO2018144957), PCT/US2018/52332 (WO 2019/ 060798), PCT/US2021/44110, and PCT/US22/44165. The entire contents of all of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679,977, 10,943,934, 10,998,374, 11,063,071, and 11,133,344. The entire contents of all of the foregoing patents, publications, and applications are incorporated herein by reference.

In addition, the entire contents of U.S. Pat. Nos. 10,600, 888, 10,038,073, 9,954,080, 9,691,869, 9,305,867, 8,836, 073, 8,557,632, U.S. patent application publication 2019/ 0363179 and U.S. patent application Ser. No. 17/151,867 are incorporated herein by reference.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, a 3D semiconductor device, the device including: a first level including a plurality of first metal layers; a second level, where the second level overlays the first level, where the second level includes at least one single crystal silicon layer, where the second level includes a plurality of transistors, where each transistor of the plurality of transistors includes a single crystal channel, where the second level includes a plurality of second metal layers, where the plurality of second metal layers include interconnections between the transistors of the plurality of transistors, and where the second level is overlaid by a first isolation layer; and a connective path between the plurality of transistors and the plurality of first metal layers, where the connective path includes a via disposed through at least the single crystal silicon layer, and where the via includes contact with at least one of the plurality of transistors.

In another aspect, a 3D semiconductor device, the device including: a first level including a plurality of first metal layers; a second level, where the second level overlays the first level, where the second level includes at least one single crystal silicon layer, where the second level includes a plurality of transistors, where each transistor of the plurality of transistors includes a single crystal channel, where the second level includes a plurality of second metal layers, where the plurality of second metal layers include interconnections between the transistors of the plurality of transistors, and where the second level is overlaid by a first isolation layer; and a connective path between the plurality of transistors and the plurality of first metal layers, where the connective path includes a via disposed through at least the single crystal silicon layer, where the via is part of connective path between at least one of the transistors to at least one of the first metal layers, and where the transistors of the plurality of transistors are aligned to the first metal layers with a less than 40 nm alignment error.

In another aspect, a 3D semiconductor device, the device including: a first level including a plurality of first metal layers; a second level, where the second level overlays the first level, where the second level includes at least one single crystal silicon layer, where the second level includes a plurality of transistors, where each transistor of the plurality of transistors includes a single crystal channel, where the second level includes a plurality of second metal layers, where the plurality of second metal layers include interconnections between the transistors of the plurality of transistors, and where the second level is overlaid by a first isolation layer; and a connective path between the plurality of transistors and the plurality of first metal layers, where the connective path includes a via disposed through at least the single crystal silicon layer, and where the device include plurality of capacitors.

In another aspect, a 3D semiconductor device, the device including: a first level including a single crystal silicon layer and a plurality of first transistors, the plurality of first transistors each including a single crystal channel; a first metal layer overlaying the plurality of first transistors; a second metal layer overlaying the first metal layer; a third metal layer overlaying the second metal layer; a second level, where the second level overlays the first level, where the second level includes a plurality of second transistors; a fourth metal layer overlaying the second level; and a connective path between the fourth metal layer and either the third metal layer or the second metal layer, where the connective path includes a via disposed through the second level, where the via has a diameter of less than 500 nm and greater than 5 nm, and where the third metal layer is connected to provide a power or ground signal to at least one of the plurality of second transistors.

In another aspect, a 3D semiconductor device, the device including: a first level including a single crystal silicon layer and a plurality of first transistors, the plurality of first transistors each including a single crystal channel; a first metal layer overlaying the plurality of first transistors; a second metal layer overlaying the first metal layer; a third metal layer overlaying the second metal layer; a second level, where the second level overlays the first level, where the second level includes a plurality of second transistors; a fourth metal layer overlaying the second level; a connective path between the fourth metal layer and the third metal layer or the second metal layer, where the connective path includes a via disposed through the second level, where the via has a diameter of less than 500 nm and greater than 5 nm, where at least one of the plurality of second transistors is vertically oriented, and where the third metal layer is connected to provide a power or a ground signal to at least one of the plurality of second transistors.

In another aspect, a 3D semiconductor device, the device including: a first level including a single crystal silicon layer and plurality of first transistors, the plurality of first transistors each including a single crystal channel; a first metal layer overlaying the plurality of first transistors; a second metal layer overlaying the first metal layer; a third metal layer overlaying the second metal layer; a second level, where the second level overlays the first level, where the second level includes a plurality of second transistors; a fourth metal layer overlaying the second level; and a connective path between the fourth metal layer and the third metal layer or the second metal layer, where the connective path includes a via disposed through the second level, where the via has a diameter of less than 500 nm and greater than 5 nm, where at least one of the plurality of second transistors includes a metal gate, and where the third metal layer is connected to provide a power or a ground signal to at least one of the plurality of second transistors.

In another aspect, a 3D semiconductor device, the device including: a first level including a plurality of first metal layers; a second level, where the second level overlays the first level, where the second level includes at least one single crystal silicon layer, where the second level includes a plurality of transistors, where each transistor of the plurality of transistors includes a single crystal channel, where the second level includes a plurality of second metal layers, where the plurality of second metal layers include interconnections between the transistors of the plurality of transistors, and where the second level is overlaid by a first isolation layer; and a connective path between the plurality of transistors and the plurality of first metal layers, where the connective path includes a via disposed through at least the single crystal silicon layer, and where at least one of the transistors includes a four sided gate.

In another aspect, a 3D semiconductor device, the device including: a first level including a plurality of first metal layers; a second level, where the second level overlays the first level, where the second level includes at least one single crystal silicon layer, where the second level includes a plurality of transistors, where each transistor of the plurality of transistors includes a single crystal channel, where the second level includes a plurality of second metal layers, where the plurality of second metal layers include interconnections between the transistors of the plurality of transistors, and where the second level is overlaid by a first isolation layer; and a connective path between the plurality of transistors and the plurality of first metal layers, where the connective path includes a via disposed through at least the single crystal silicon layer, where the via include tungsten, and where the transistors of the plurality of transistors are aligned to the first metal layers with a less than 40 nm alignment error.

In another aspect, a 3D semiconductor device, the device including: a first level including a plurality of first metal layers; a second level, where the second level overlays the first level, where the second level includes at least one single crystal silicon layer, where the second level includes a plurality of transistors, where each transistor of the plurality of transistors includes a single crystal channel, where the second level includes a plurality of second metal layers, where the plurality of second metal layers include interconnections between the transistors of the plurality of transistors, and where the second level is overlaid by a first isolation layer; and a connective path between the plurality of transistors and the plurality of first metal layers, where the connective path includes a via disposed through at least the single crystal silicon layer, and where the first metal layers include Vdd supply lines and Vss supply lines.

In another aspect, a 3D semiconductor device, the device including: a first level including a plurality of first metal layers; a second level, where the second level overlays the first level, where the second level includes at least one single crystal silicon layer, where the second level includes a plurality of transistors, where each transistor of the plurality of transistors includes a single crystal channel, where the second level includes a plurality of second metal layers, where the plurality of second metal layers include interconnections between the transistors of the plurality of transistors, and where the second level is overlaid by a first isolation layer; and a connective path from the plurality of transistors to the plurality of first metal layers, where the connective path includes a via disposed through at least the single crystal silicon layer, and where at least one of the via includes a contact to at least one of the transistors.

In another aspect, a 3D semiconductor device, the device including: a first level including a plurality of first metal layers; a second level, where the second level overlays the first level, where the second level includes at least one single crystal silicon layer, where the second level includes a plurality of transistors, where each transistor of the plurality of transistors includes a single crystal channel, where the second level includes a plurality of second metal layers, where the plurality of second metal layers include interconnections between the transistors of the plurality of transistors, and where the second level is overlaid by a first isolation layer; and a connective path from the plurality of transistors to the plurality of first metal layers, where the connective path includes a via disposed through at least the single crystal silicon layer, where the via includes tungsten, and where the single crystal silicon layer thickness is less than two microns.

In another aspect, a 3D semiconductor device, the device including: a first level including a plurality of first metal layers; a second level, where the second level overlays the first level, where the second level includes at least one single crystal silicon layer, where the second level includes a plurality of transistors, where each transistor of the plurality of transistors includes a single crystal channel, where the second level includes a plurality of second metal layers, where the plurality of second metal layers include interconnections between the transistors of the plurality of transistors, and where the second level is overlaid by a first isolation layer; and a connective path from the plurality of transistors to the plurality of first metal layers, where the connective path includes a via disposed through at least the single crystal silicon layer, where the second level includes a plurality of capacitors, and where the first metal layers include Vdd supply lines and Vss supply lines.

BRIEF DESCRIPTION OF THE DRAWINGS

Various embodiments of the invention will be understood and appreciated more fully from the following detailed description, taken in conjunction with the drawings in which:

FIGS. 2A-2H are exemplary drawing illustrations of the preprocessed wafers and layers and generalized layer transfer;

FIGS. 3A-3D are exemplary drawing illustrations of a generalized layer transfer process flow;

FIG. 4 is an exemplary drawing illustration and a transistor characteristic graph of a junction-less transistor;

FIGS. 6A-6K, 6K1, 6K2, and 6L are exemplary drawing illustrations of the formation of a floating body DRAM transistor and device;

FIGS. 7A-7J, 7J1, 7J2, and 7K are exemplary drawing illustrations of the formation of a resistive memory transistor and device;

FIGS. 8A-8J, 8J1, 8J2, and 8K are exemplary drawing illustrations of the formation of a resistive memory transistor and device;

DESCRIPTION

Figure 1:
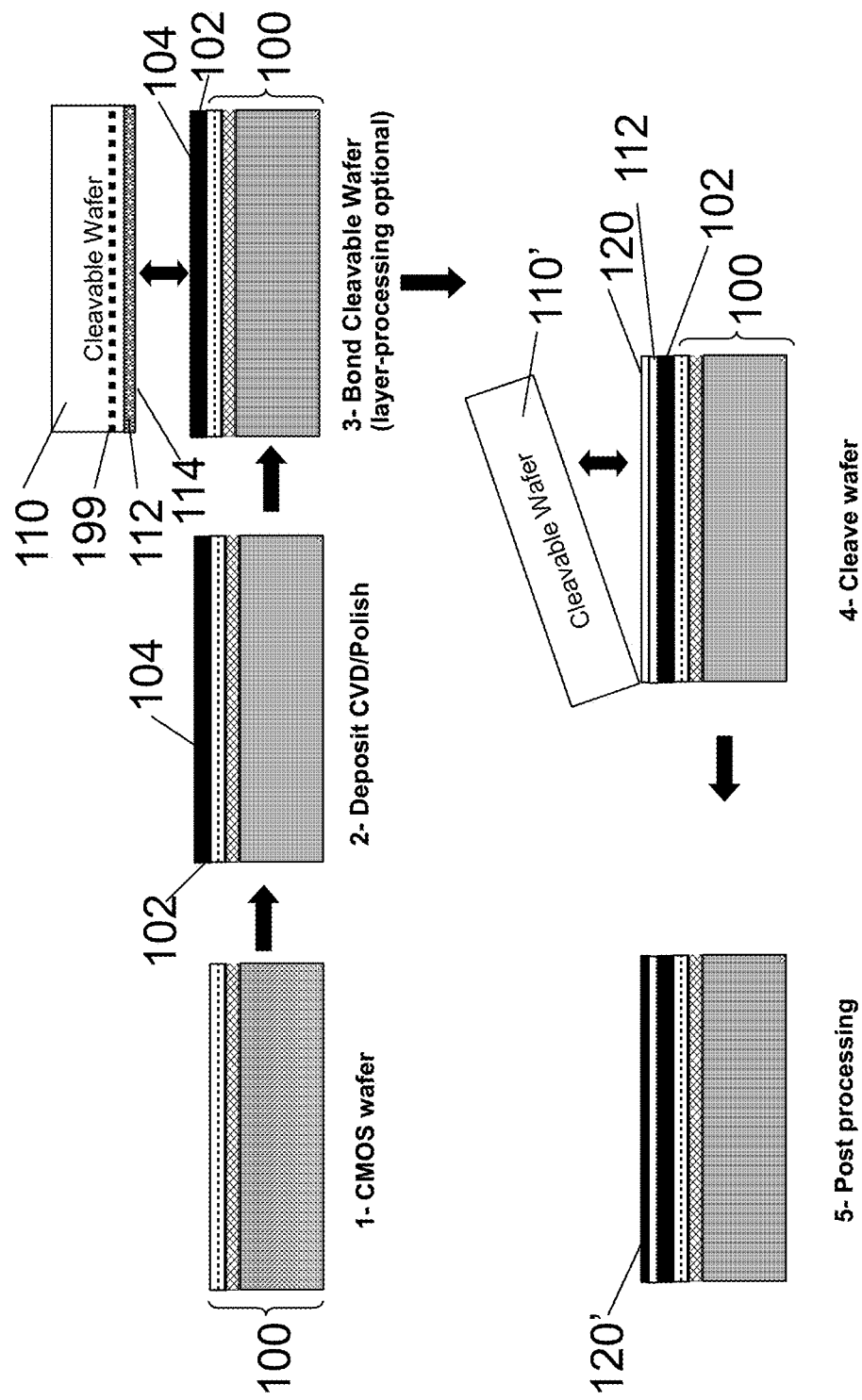
FIG. 1 is an exemplary drawing illustration of a layer transfer process flow.

Some embodiments of the invention are described herein with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Many figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

As illustrated in FIG. 1, a generalized single layer transfer procedure that utilizes the above techniques may begin with acceptor substrate 100, which may be a preprocessed CMOS silicon wafer, or a partially processed CMOS, or other prepared silicon or semiconductor substrate. CMOS may include n-type transistors and p-type transistors. Acceptor substrate 100 may include elements such as, for example, transistors, alignment marks, metal layers, and metal connection strips. The metal layers may be utilized to interconnect the transistors. The acceptor substrate may also be called target wafer. The acceptor substrate 100 may be prepared for oxide to oxide wafer bonding by a deposition of an oxide 102, and the acceptor substrate surface 104 may be made ready for low temperature bonding by various surface treatments, such as, for example, an RCA pre-clean that may include dilute ammonium hydroxide or hydrochloric acid, and may include plasma surface preparations, wherein gases such as oxygen, argon, and other gases or combinations of gases and plasma energies that changes the oxide surfaces so to lower the oxide to oxide bonding energy. In addition, polishes may be employed to achieve satisfactory flatness.

A donor wafer or substrate 110 may be prepared for cleaving by an implant or implants of atomic species, such as, for example, Hydrogen and Helium, to form a layer transfer demarcation plane 199, shown as a dashed line. Layer transfer demarcation plane 199 may be formed before or after other processing on the donor wafer or substrate 110. The donor wafer or substrate 110 may be prepared for oxide to oxide wafer bonding by a deposition of an oxide 112, and the donor wafer surface 114 may be made ready for low temperature bonding by various surface treatments, such as, for example, an RCA pre-clean that may include dilute ammonium hydroxide or hydrochloric acid, and may include plasma surface preparations, wherein gases such as oxygen, argon, and other gases or combinations of gases and plasma energies that change the oxide surfaces so to lower the oxide to oxide bonding energy. In addition, polishes may be employed to achieve satisfactory flatness. The donor wafer or substrate 110 may have prefabricated layers, structures, alignment marks, transistors or circuits.

Donor wafer or substrate 110 may be bonded to acceptor substrate 100, or target wafer, by bringing the donor wafer surface 114 in physical contact with acceptor substrate surface 104, and then applying mechanical force and/or thermal annealing to strengthen the oxide to oxide bond. Alignment of the donor wafer or substrate 110 with the acceptor substrate 100 may be performed immediately prior to the wafer bonding. Acceptable bond strengths may be obtained with bonding thermal cycles that do not exceed approximately 400° C.

The donor wafer or substrate 110 may be cleaved at or near the layer transfer demarcation plane 199 and removed leaving transferred layer 120 bonded and attached to acceptor substrate 100, or target wafer. The cleaving may be accomplished by various applications of energy to the layer transfer demarcation plane, such as, for example, a mechanical strike by a knife, or jet of liquid or jet of air, or by local laser heating, or other suitable cleaving methods that propagate a fracture or separation approximately at the layer transfer demarcation plane 199. The transferred layer 120 may be polished chemically and mechanically to provide a suitable surface for further processing. The transferred layer 120 may be of thickness approximately 200 nm or less to enable formation of nanometer sized thru layer vias and create a high density of interconnects between the donor wafer and acceptor wafer. The thinner the transferred layer 120, the smaller the thru layer via diameter obtainable, as a result of maintaining manufacturable via aspect ratios. Thus, the transferred layer 120 may be, for example, less than about 2 microns thick, less than about 1 micron thick, less than about 0.4 microns thick, less than about 200 nm thick, less than about 150 nm thick, or less than about 100 nm thick. The thickness of the layer or layers transferred according to some embodiments of the invention may be designed as such to match and enable the most suitable lithographic resolution capability of the manufacturing process employed to create the thru layer vias or any other structures on the transferred layer or layers. The donor wafer or substrate 110 may now also be processed and reused for more layer transfers.

Transferred layer 120 may then be further processed to create a monolithic layer of interconnected devices 120' and the formation of thru layer vias (TLVs, or through-layer vias) to electrically couple (connection path) donor wafer circuitry with acceptor wafer circuitry. Alignment marks in acceptor substrate 100 and/or in transferred layer 120 may be utilized to contact transistors and circuitry in transferred layer 120 and electrically couple them to transistors and circuitry in the acceptor substrate 100. The use of an implanted atomic species, such as, for example, Hydrogen or Helium or a combination, to create a cleaving plane, such as, for example, layer transfer demarcation plane 199, and the subsequent cleaving at or near the cleaving plane as described above may be referred to in this document as "ion-cut", and may be the typically illustrated layer transfer method. As the TLVs are formed through the transferred layer 120, the thickness of the TLVs may be, for example, less than about 2 microns thick, less than about 1 micron thick, less than about 0.4 microns thick, less than about 200 nm thick, less than about 150 nm thick, or less than about 100 nm thick. TLVs may be constructed mostly out of electrically conductive materials including, for example, copper, aluminum, conductive carbon, or tungsten. Barrier metals, including, for example, TiN and TaN, may be utilized to form TLVs.

Persons of ordinary skill in the art will appreciate that the illustrations in FIG. 1 are exemplary only and are not drawn to scale. Such skilled persons will further appreciate that many variations are possible such as, for example, a heavily doped (greater than 1e20 atoms/cm3) boron layer or a silicon germanium (SiGe) layer may be utilized as an etch stop layer either within the ion-cut process flow, wherein the layer transfer demarcation plane may be placed within the etch stop layer or into the substrate material below, or the etch stop layers may be utilized without an implant cleave or ion-cut process and the donor wafer may be preferentially etched away until the etch stop layer may be reached. Such skilled persons will further appreciate that the oxide layer within an SOI or GeOI donor wafer may serve as the etch stop layer. Many other modifications within the scope of the invention will suggest themselves to such skilled persons after reading this specification. Thus the invention is to be limited only by the appended claims.

Alternatively, other technologies and techniques may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) may be selectively etched off. The now thinned donor wafer may be subsequently aligned and low-temperature oxide-to-oxide bonded to the acceptor wafer topside. A low temperature release of the glass handle wafer from the thinned donor wafer may be next performed, and then thru layer via (or layer to layer) connections may be made.

Additionally, the inventors contemplate that other technology can be used. For example, an epitaxial liftoff (ELO) technology as shown by P. Demeester, et. al, of IMEC in Semiconductor Science Technology 1993 may be utilized for layer transfer. ELO makes use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, etches the exposed release layer, such as, for example, the silicon oxide in SOI or a layer of AlAs. After liftoff, the transferred layer may be then aligned and bonded to the desired acceptor substrate or wafer. The manufacturability of the ELO process for multilayer layer transfer use was recently improved by J. Yoon, et. al., of the University of Illinois at Urbana-Champaign as described in Nature May 20, 2010.

Canon developed a layer transfer technology called ELTRAN—Epitaxial Layer TRANsfer from porous silicon. ELTRAN may be utilized as a layer transfer method. The Electrochemical Society Meeting abstract No. 438 from year 2000 and the JSAP International July 2001 paper show a seed wafer being anodized in an HF/ethanol solution to create pores in the top layer of silicon, the pores may be treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 2A:
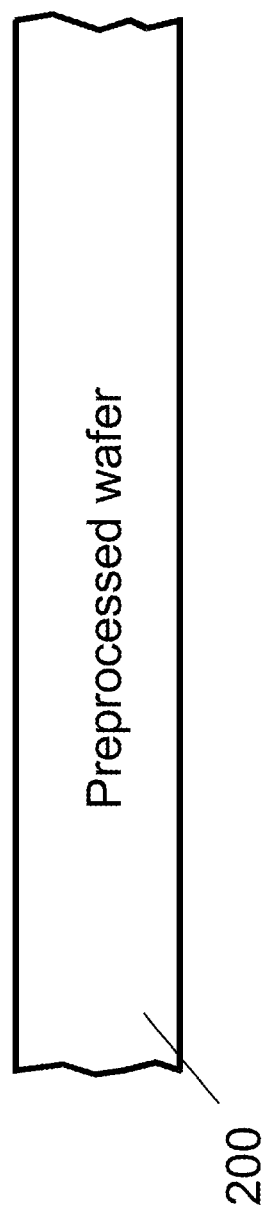

FIG. 2A is a drawing illustration of a generalized preprocessed wafer or layer 200. The wafer or layer 200 may have preprocessed circuitry, such as, for example, logic circuitry, microprocessors, circuitry including transistors of various types, and other types of digital or analog circuitry including, but not limited to, the various embodiments described herein. Preprocessed wafer or layer 200 may have preprocessed metal interconnects, such as, for example, of copper or aluminum. The preprocessed metal interconnects, such as, for example, metal strips pads, or lines, may be designed and prepared for layer transfer and electrical coupling from preprocessed wafer or layer 200 to the layer or layers to be transferred.

Figure 2B:
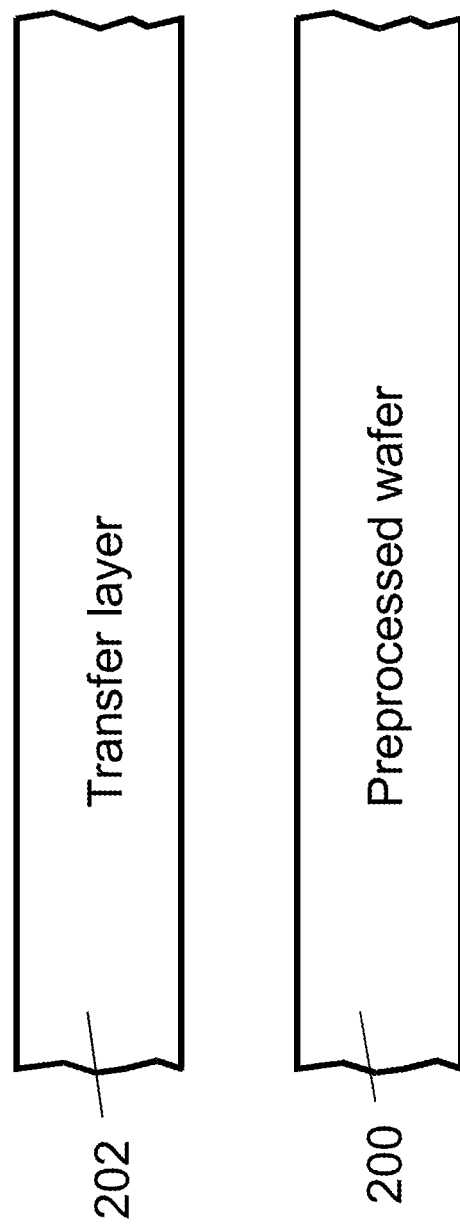

FIG. 2B is a drawing illustration of a generalized transfer layer 202 prior to being attached to preprocessed wafer or layer 200. Preprocessed wafer or layer 200 may be called a target wafer or acceptor substrate. Transfer layer 202 may be attached to a carrier wafer or substrate during layer transfer. Transfer layer 202 may have metal interconnects, such as, for example, metal strips, pads, or lines, designed and prepared for layer transfer and electrical coupling to preprocessed wafer or layer 200. Transfer layer 202, which may also be called the second semiconductor layer, may include mono-crystalline silicon, or doped mono-crystalline silicon layer or layers, or other semiconductor, metal (including such as aluminum or copper interconnect layers), and insulator materials, layers; or multiple regions of single crystal silicon, or mono-crystalline silicon, or dope mono-crystalline silicon, or other semiconductor, metal, or insulator materials. A preprocessed wafer that can withstand subsequent processing of transistors on top at high temperatures may be a called the "Foundation" or a foundation wafer, layer or circuitry. The terms 'mono-crystalline silicon' and 'single crystal silicon' may be used interchangeably.

Figure 2C:
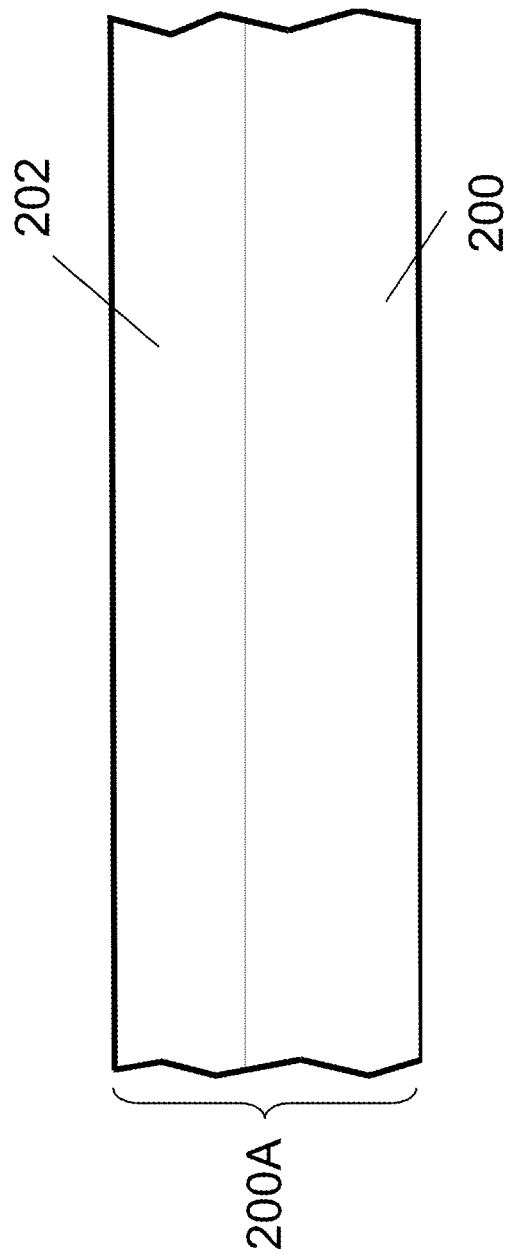

FIG. 2C is a drawing illustration of a preprocessed wafer or layer 200A created by the layer transfer of transfer layer 202 on top of preprocessed wafer or layer 200. The top of preprocessed wafer or layer 200A may be further processed with metal interconnects, such as, for example, metal strips, pads, or lines, designed and prepared for layer transfer and electrical coupling from preprocessed wafer or layer 200A to the next layer or layers to be transferred.

Figure 2D:
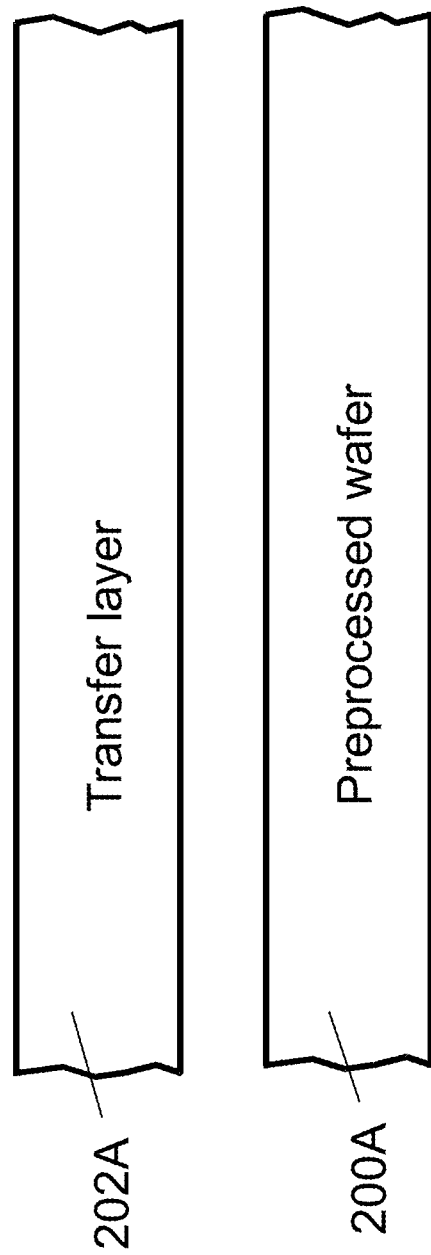

FIG. 2D is a drawing illustration of a generalized transfer layer 202A prior to being attached to preprocessed wafer or layer 200A. Transfer layer 202A may be attached to a carrier wafer or substrate during layer transfer. Transfer layer 202A may have metal interconnects, such as, for example, metal strips, pads, or lines, designed and prepared for layer transfer and electrical coupling to preprocessed wafer or layer 200A. Transfer layer 202A may include mono-crystalline silicon, or doped mono-crystalline silicon layer or layers, or other semiconductor, metal, and insulator materials, layers; or multiple regions of single crystal silicon, or mono-crystalline silicon, or dope mono-crystalline silicon, or other semiconductor, metal, or insulator materials.

Figure 2E:
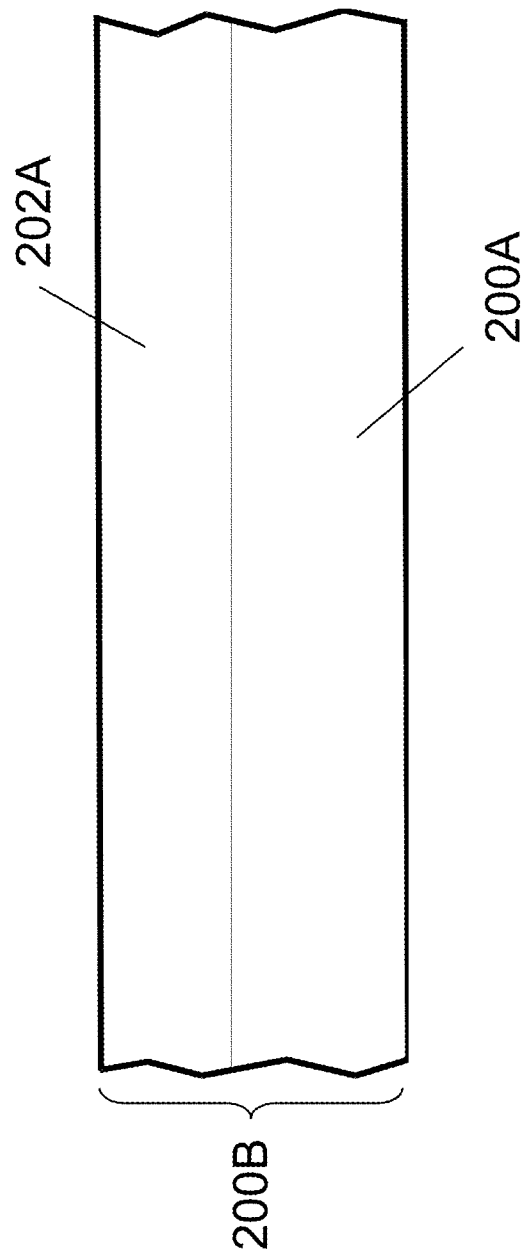

FIG. 2E is a drawing illustration of a preprocessed wafer or layer 200B created by the layer transfer of transfer layer 202A on top of preprocessed wafer or layer 200A. Transfer layer 202A may also be called the third semiconductor layer. The top of preprocessed wafer or layer 200B may be further processed with metal interconnects, such as, for example, metal strips, pads, or lines, designed and prepared for layer transfer and electrical coupling from preprocessed wafer or layer 200B to the next layer or layers to be transferred.

Figure 2F:
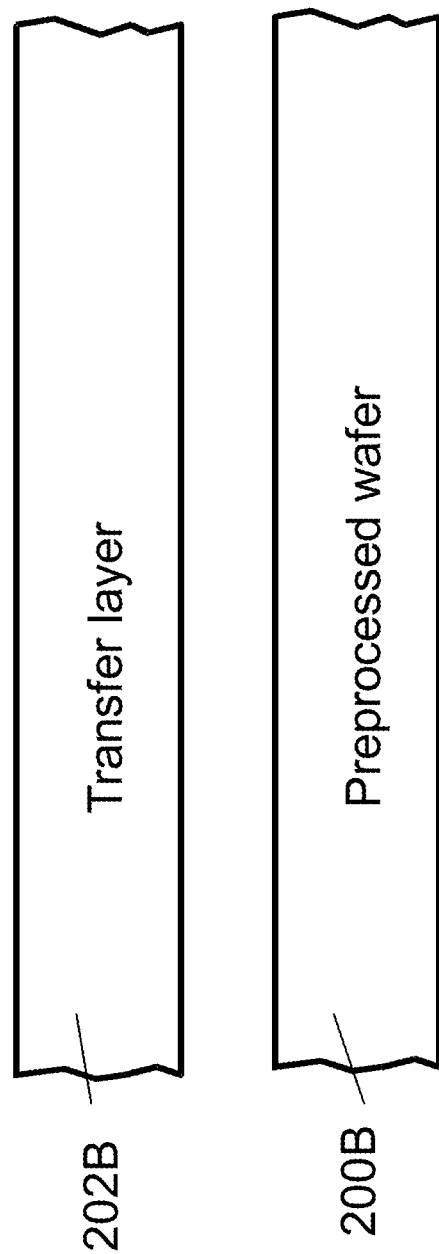

FIG. 2F is a drawing illustration of a generalized transfer layer 202B prior to being attached to preprocessed wafer or layer 200B. Transfer layer 202B may be attached to a carrier wafer or substrate during layer transfer. Transfer layer 202B may have metal interconnects, such as, for example, metal strips, pads, or lines, designed and prepared for layer transfer and electrical coupling to preprocessed wafer or layer 200B. Transfer layer 202B may include mono-crystalline silicon, or doped mono-crystalline silicon layer or layers, or other semiconductor, metal, and insulator materials, layers; or multiple regions of single crystal silicon, or mono-crystalline silicon, or dope mono-crystalline silicon, or other semiconductor, metal, or insulator materials.

Figure 2G:
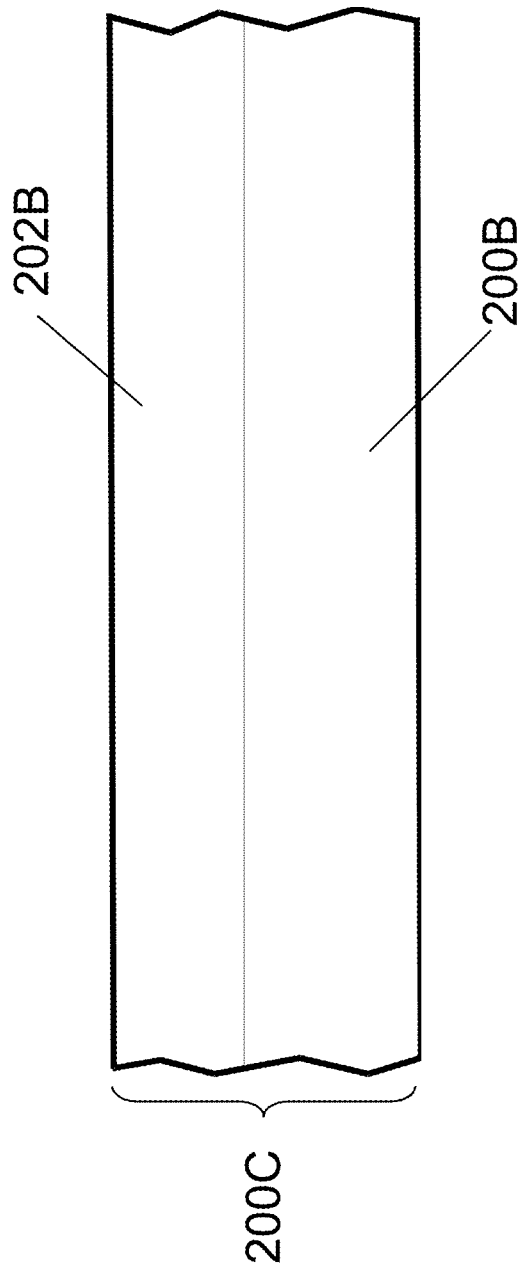

FIG. 2G is a drawing illustration of preprocessed wafer or layer 200C created by the layer transfer of transfer layer 202B on top of preprocessed wafer or layer 200B. The top of preprocessed wafer or layer 200C may be further processed with metal interconnect, such as, for example, metal strips, pads, or lines, designed and prepared for layer transfer and electrical coupling from preprocessed wafer or layer 200C to the next layer or layers to be transferred.

FIG. 2H is a drawing illustration of preprocessed wafer or layer 200C, a 3D IC stack, which may include transferred layers 202A and 202B on top of the original preprocessed wafer or layer 200. Transferred layers 202A and 202B and the original preprocessed wafer or layer 200 may include transistors of one or more types in one or more layers, metallization such as, for example, copper or aluminum in one or more layers, interconnections to and among layers above and below (connection paths, such as TLVs or TSVs), and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be, for example, junction-less transistors or recessed channel transistors or other types of transistors described in this document. Transferred layers 202A and 202B and the original preprocessed wafer or layer 200 may further include semiconductor devices such as, for example, resistors and capacitors and inductors, one or more programmable interconnects, memory structures and devices, sensors, radio frequency devices, or optical interconnect with associated transceivers. The terms carrier wafer or carrier substrate may also be called holder wafer or holder substrate.

This layer transfer process can be repeated many times, thereby creating preprocessed wafers that may include many different transferred layers which, when combined, can then become preprocessed wafers or layers for future transfers. This layer transfer process may be sufficiently flexible that preprocessed wafers and transfer layers, if properly prepared, can be flipped over and processed on either side with further transfers in either direction as a matter of design choice.

Persons of ordinary skill in the art will appreciate that the illustrations in FIGS. 2A through 2H are exemplary only and are not drawn to scale. Such skilled persons will further appreciate that many variations are possible such as, for example, the preprocessed wafer or layer 200 may act as a base or substrate layer in a wafer transfer flow, or as a preprocessed or partially preprocessed circuitry acceptor wafer in a wafer transfer process flow. Many other modifications within the scope of the invention will suggest themselves to such skilled persons after reading this specification. Thus the invention is to be limited only by the appended claims.

One industry method to form a low temperature gate stack may be called a high-k metal gate (HKMG) and may be referred to in later discussions. The high-k metal gate structure may be formed as follows. Following an industry standard HF/SC1/SC2 cleaning to create an atomically smooth surface, a high-k dielectric may be deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, may have a dielectric constant twice as much as that of hafnium silicate/hafnium silicon oxynitride (HfSiO/HfSiON k~15). The choice of the metal may be critical for the device to perform properly. A metal replacing $N^+$ poly as the gate electrode may need to have a work function of approximately 4.2 eV for the device to operate properly and at the right threshold voltage. Alternatively, a metal replacing $P^+$ poly as the gate electrode may need to have a work function of approximately 5.2 eV to operate properly. The TiAl and TiAlN based family of metals, for example, could be used to tune the work function of the metal from 4.2 eV to 5.2 eV.

Alternatively, a low temperature gate stack may be formed with a gate oxide formed by a microwave oxidation technique, such as, for example, the TEL SPA (Tokyo Electron Limited Slot Plane Antenna) oxygen radical plasma, that grows or deposits a low temperature Gate Dielectric to serve as the MOSFET gate oxide, or an atomic layer deposition (ALD) deposition technique may be utilized. A metal gate of proper work function, such as, for example, aluminum or tungsten, or low temperature doped amorphous silicon gate electrode, may then be deposited.

Transistors constructed in this document can be considered "planar transistors" when the current flow in the transistor channel may be substantially in the horizontal direction. The horizontal direction may be defined as the direction being parallel to the largest area of surface of the substrate or wafer that the transistor may be built or layer transferred onto. These transistors can also be referred to as horizontal transistors, horizontally oriented transistors, or lateral transistors. In some embodiments of the invention the horizontal transistor may be constructed in a two-dimensional plane where the source and the drain are in the same two dimensional horizontal plane.

An embodiment of the invention is to pre-process a donor wafer by forming wafer sized layers of various materials without a process temperature restriction, then layer transferring the pre-processed donor wafer to the acceptor wafer, and processing at either low temperature (below approximately 400° C.) or high temperature (greater than approximately 400° C.) after the layer transfer to form device structures, such as, for example, transistors and metal interconnect, on or in the donor wafer that may be physically aligned and may be electrically coupled or connected to the acceptor wafer. A wafer sized layer denotes a continuous layer of material or combination of materials that may extend across the wafer to substantially the full extent of the wafer edges and may be approximately uniform in thickness. If the wafer sized layer compromises dopants, then the dopant concentration may be substantially the same in the x and y direction across the wafer, but can vary in the z direction perpendicular to the wafer surface.

As illustrated in FIG. 3A, a generalized process flow may begin with a donor wafer 300 that may be preprocessed with wafer sized layers 302 of conducting, semi-conducting or insulating materials that may be formed by deposition, ion implantation and anneal, oxidation, epitaxial growth, combinations of above, or other semiconductor processing steps and methods. The donor wafer 300 may be preprocessed with a layer transfer demarcation plane (shown as dashed line) 399, such as, for example, a hydrogen implant cleave plane, before or after layers 302 are formed. Acceptor wafer 310 may be a preprocessed wafer that may have fully functional circuitry including metal layers (including aluminum or copper metal interconnect layers that may connect acceptor wafer 310 transistors) or may be a wafer with previously transferred layers, or may be a blank carrier or holder wafer, or other kinds of substrates suitable for layer transfer processing. Acceptor wafer 310 may have alignment marks 390 and metal connect pads or strips 380. Acceptor wafer 310 and the donor wafer 300 may be a bulk monocrystalline silicon wafer or a Silicon On Insulator (SOI) wafer or a Germanium on Insulator (GeOI) wafer.

Both bonding surfaces 301 and 311 may be prepared for wafer bonding by depositions, polishes, plasma, or wet chemistry treatments to facilitate successful wafer to wafer bonding.

Figure 3B:
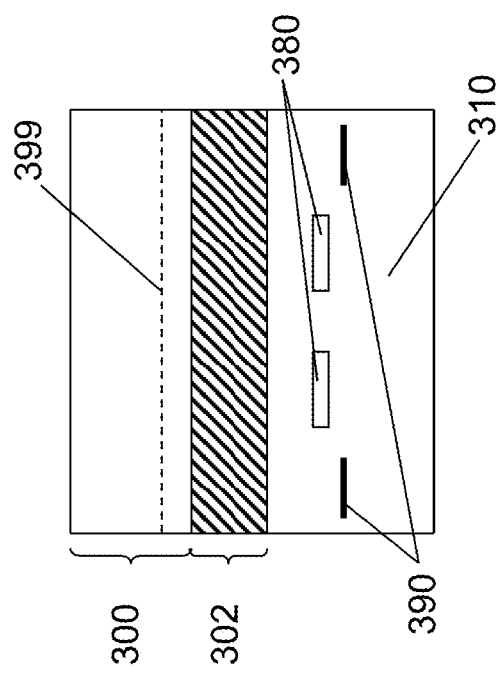

As illustrated in FIG. 3B, the donor wafer 300 with layers 302 and layer transfer demarcation plane 399 may then be flipped over, aligned, and bonded to the acceptor wafer 310. The donor wafer 300 with layers 302 may have alignment marks (not shown).

Figure 3C:
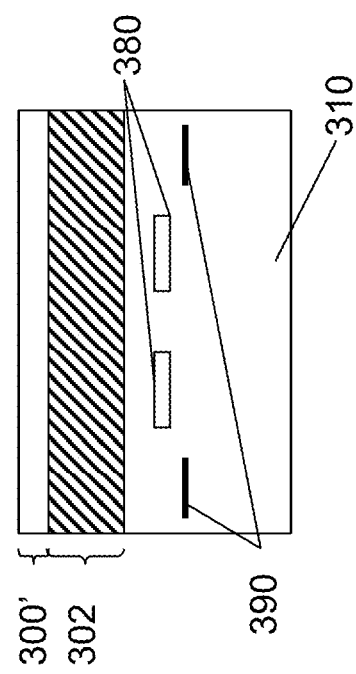

As illustrated in FIG. 3C, the donor wafer 300 may be cleaved at or thinned to the layer transfer demarcation plane 399, leaving a portion of the donor wafer 300' and the pre-processed layers 302 bonded to the acceptor wafer 310, by methods such as, for example, ion-cut or other layer transfer methods.

Figure 3D:
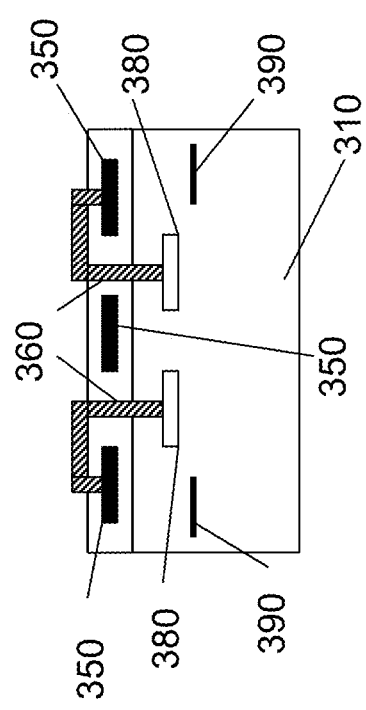

As illustrated in FIG. 3D, the remaining donor wafer portion 300' may be removed by polishing or etching and the transferred layers 302 may be further processed to create donor wafer device structures 350 that may be precisely aligned to the acceptor wafer alignment marks 390. Donor wafer device structures 350 may include, for example, CMOS transistors such as N type and P type transistors, or any of the other transistor or device types discussed herein this document. These donor wafer device structures 350 may utilize thru layer vias (TLVs) 360 to electrically couple (connection paths) the donor wafer device structures 350 to the acceptor wafer metal connect pads or strips 380. TLVs 360 may be formed through the transferred layers 302. As the transferred layers 302 may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers 302, the smaller the thru layer via diameter obtainable, which may result from maintaining manufacturable via aspect ratios. Thus, the transferred layers 302 (and hence, TLVs 360) may be, for example, less than about 2 microns thick, less than about 1 micron thick, less than about 0.4 microns thick, less than about 200 nm thick, less than about 150 nm thick, or less than about 100 nm thick. The thickness of the layer or layers transferred according to some embodiments of the invention may be designed as such to match and enable the most suitable obtainable lithographic resolution, such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers. Transferred layers 302 may be considered to be overlying the metal layer or layers of acceptor wafer 310. Alignment marks in acceptor substrate 310 and/or in transferred layers 302 may be utilized to enable reliable contact to transistors and circuitry in transferred layers 302 and donor wafer device structures 350 and electrically couple them to the transistors and circuitry in the acceptor substrate 310. The donor wafer 300 may now also be processed and reused for more layer transfers.

There may be multiple methods by which a transistor or other devices may be formed to enable a 3D IC.

Junction-less Transistors (JLTs) are another transistor family that may utilize layer transfer and etch definition to construct a low-temperature monolithic 3D IC. The junction-less transistor structure avoids the increasingly sharply graded junctions necessary for sufficient separation between source and drain regions as silicon technology scales. This allows the JLT to have a thicker gate oxide than a conventional MOSFET for an equivalent performance. The junction-less transistor may also be known as a nanowire transistor without junctions, or gated resistor, or nanowire transistor as described in a paper by Jean-Pierre Colinge, et. al., (Colinge) published in Nature Nanotechnology on Feb. 21, 2010.

As illustrated in FIG. 4 the junction-less transistor may be constructed whereby the transistor channel may be a thin solid piece of evenly and heavily doped single crystal silicon. Single crystal silicon may also be referred to as mono-crystalline silicon. The doping concentration of the channel underneath the gate 406 and gate dielectric 408 may be identical to that of the source 404 and drain 402. As a result of the high channel doping, the channel must be thin and narrow enough to allow for full depletion of the carriers when the device may be turned off. Additionally, the channel doping must be high enough to allow a reasonable current to flow when the device may be on. A multi-sided gate may provide increased control of the channel. The JLT may have a very small channel area (typically less than about 20 nm on one or more sides), so the gate can deplete the channel of charge carriers at approximately 0V and turn the source to drain current substantially off. I-V curves from Colinge of n channel and p channel junction-less transistors are shown in FIG. 4. This illustrates that the JLT can obtain comparable performance to the tri-gate transistor (junction-ed) that may be commonly researched and reported by transistor developers.

Turning the channel off with minimal leakage at an approximately zero gate bias may be a major challenge for a junction-less transistor device. To enhance gate control over the transistor channel, the channel may be doped unevenly; whereby the heaviest doping may be closest to the gate or gates and the channel doping may be lighter farther away from the gate electrode. For example, the cross-sectional center of a 2, 3, or 4 gate sided junction-less transistor channel may be more lightly doped than the edges. This may enable much lower transistor off currents for the same gate work function and control.

Figures 5A, 5B:
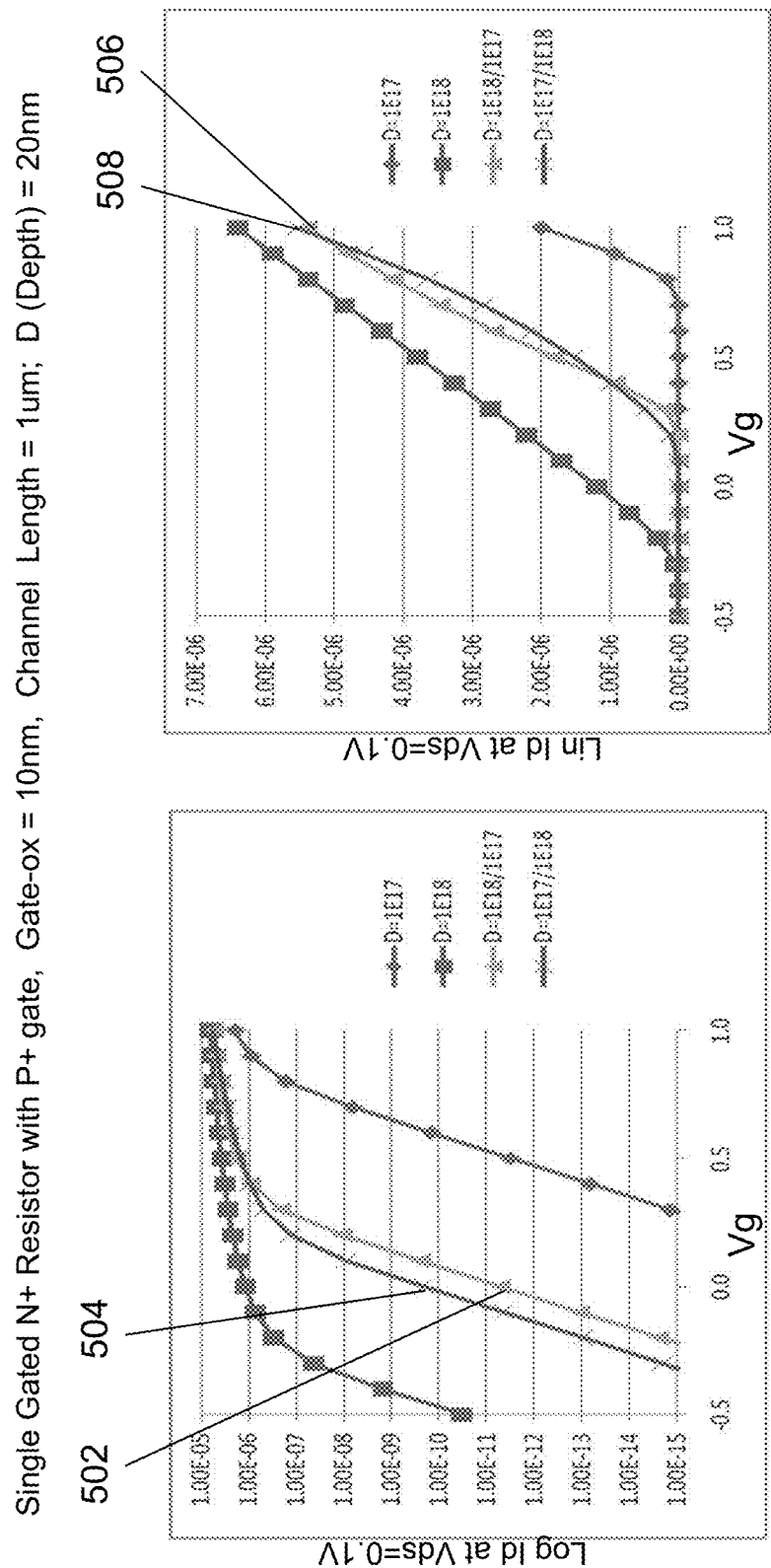
FIGS. 5A-5B are exemplary device simulations of a junction-less transistor.

As illustrated in FIGS. 5A and 5B, drain to source current (Ids) as a function of the gate voltage (Vg) for various junction-less transistor channel doping levels may be simulated where the total thickness of the n-type channel may be about 20 nm. The y-axis of FIG. 5A is plotted as logarithmic and FIG. 5B as linear. Two of the four curves in each figure correspond to evenly doping the 20 nm channel thickness to 1E17 and 1E18 atoms/cm3, respectively. The remaining two curves show simulation results where the 20 nm channel has two layers of 10 nm thickness each. In the legend denotations for the remaining two curves, the first number corresponds to the 10 nm portion of the channel that is the closest to the gate electrode. For example, the curve D=1E18/1E17 illustrates the simulated results where the 10 nm channel portion doped at 1E18 is closest to the gate electrode while the 10 nm channel portion doped at 1E17 is farthest away from the gate electrode. In FIG. 5A, curves 502 and 504 correspond to doping patterns of D=1E18/1E17 and D=1E17/1E18, respectively. According to FIG. 5A, at a Vg of 0 volts, the off current for the doping pattern of D=1E18/1E17 is approximately 50 times lower than that of the reversed doping pattern of D=1E17/1E18. Likewise, in FIG. 5B, curves 506 and 508 correspond to doping patterns of D=1E18/1E17 and D=1E17/1E18, respectively. FIG. 5B illustrates that at a Vg of 1 volt, the Ids of both doping patterns are within a few percent of each other.

The junction-less transistor channel may be constructed with even, graded, or discrete layers of doping. The channel may be constructed with materials other than doped mono-crystalline silicon, such as, for example, poly-crystalline silicon, or other semi-conducting, insulating, or conducting material, such as, for example, graphene or other graphitic material, and may be in combination with other layers of similar or different material. For example, the center of the channel may include a layer of oxide, or of lightly doped silicon, and the edges more heavily doped single crystal silicon. This may enhance the gate control effectiveness for the off state of the resistor, and may increase the on-current as a result of strain effects on the other layer or layers in the channel. Strain techniques may be employed from covering and insulator material above, below, and surrounding the transistor channel and gate. Lattice modifiers may be employed to strain the silicon, such as, for example, an embedded SiGe implantation and anneal. The cross section of the transistor channel may be rectangular, circular, or oval shaped, to enhance the gate control of the channel. Alternatively, to optimize the mobility of the P-channel junction-less transistor in the 3D layer transfer method, the donor wafer may be rotated with respect to the acceptor wafer prior to bonding to facilitate the creation of the P-channel in the <110> silicon plane direction or may include other silicon crystal orientations such as <511>.

3D memory device structures may also be constructed in layers of mono-crystalline silicon and utilize pre-processing a donor wafer by forming wafer sized layers of various materials without a process temperature restriction, then layer transferring the pre-processed donor wafer to the acceptor wafer, followed by some processing steps, and repeating this procedure multiple times, and then processing with either low temperature (below approximately 400° C.) or high temperature (greater than approximately 400° C.) after the final layer transfer to form memory device structures, such as, for example, transistors, capacitors, resistors, or memristors, on or in the multiple transferred layers that may be physically aligned and may be electrically coupled to the acceptor wafer.

Novel monolithic 3D Dynamic Random Access Memories (DRAMs) may be constructed in the above manner. Some embodiments of the invention utilize the floating body DRAM type.

Further details of a floating body DRAM and its operation modes can be found in U.S. Pat. Nos. 7,541,616, 7,514,748, 7,499,358, 7,499,352, 7,492,632, 7,486,563, 7,477,540, and 7,476,939. Background information on floating body DRAM and its operation is given in "Floating Body RAM Technology and its Scalability to 32 nm Node and Beyond," *Electron Devices Meeting*, 2006. *IEDM '06. International,* vol., no., pp. 1-4, 11-13 Dec. 2006 by T. Shino, et. al.; "Overview and future challenges of floating body RAM (FBRAM) technology for 32 nm technology node and beyond", Solid-State Electronics, Volume 53, Issue 7; "Papers Selected from the 38th European Solid-State Device Research Conference"—ESSDERC'08, July 2009, pages 676-683, ISSN 0038-1101, DOI: 10.1016/j.sse.2009.03.010 by Takeshi Hamamoto, et al.; "New Generation of Z-RAM," *Electron Devices Meeting*, 2007. *IEDM* 2007. *IEEE International*, vol., no., pp. 925-928, 10-12 Dec. 2007 by Okhonin, S., et al. Prior art for constructing monolithic 3D DRAMs used planar transistors where crystalline silicon layers were formed with either selective epitaxy technology or laser recrystallization. Both selective epitaxy technology and laser recrystallization may not provide perfectly monocrystalline silicon and often may require a high thermal budget. A description of these processes is given in the book entitled "Integrated Interconnect Technologies for 3D Nanoelectronic Systems" by Bakir and Meindl. The contents of these documents are incorporated in this specification by reference.

As illustrated in FIGS. 6A to 6L, a horizontally-oriented monolithic 3D DRAM that utilizes zero additional masking steps per memory layer by sharing mask steps after substantially all the layers have been transferred may be constructed that may be suitable for 3D IC manufacturing.

Figure 6A:
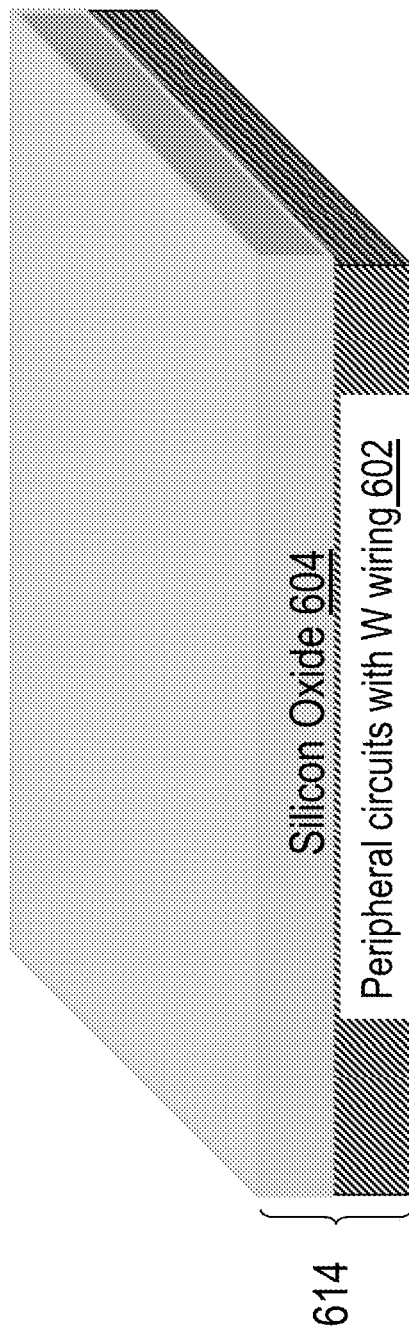

As illustrated in FIG. 6A, a silicon substrate with peripheral circuitry 602 may be constructed with high temperature (greater than approximately 400° C.) resistant wiring, such as, for example, Tungsten. The peripheral circuitry substrate 602 may include memory control circuits as well as circuitry for other purposes and of various types, such as, for example, analog, digital, RF, or memory. The peripheral circuitry substrate 602 may include peripheral circuits that can withstand an additional rapid-thermal-anneal (RTA) and still remain operational and retain good performance. For this purpose, the peripheral circuits may be formed such that they have not been subjected to a weak RTA or no RTA for activating dopants in anticipation of anneals later in the process flow. The top surface of the peripheral circuitry substrate 602 may be prepared for oxide wafer bonding with a deposition of a silicon oxide layer 604, thus forming acceptor wafer 614.

Figure 6B:
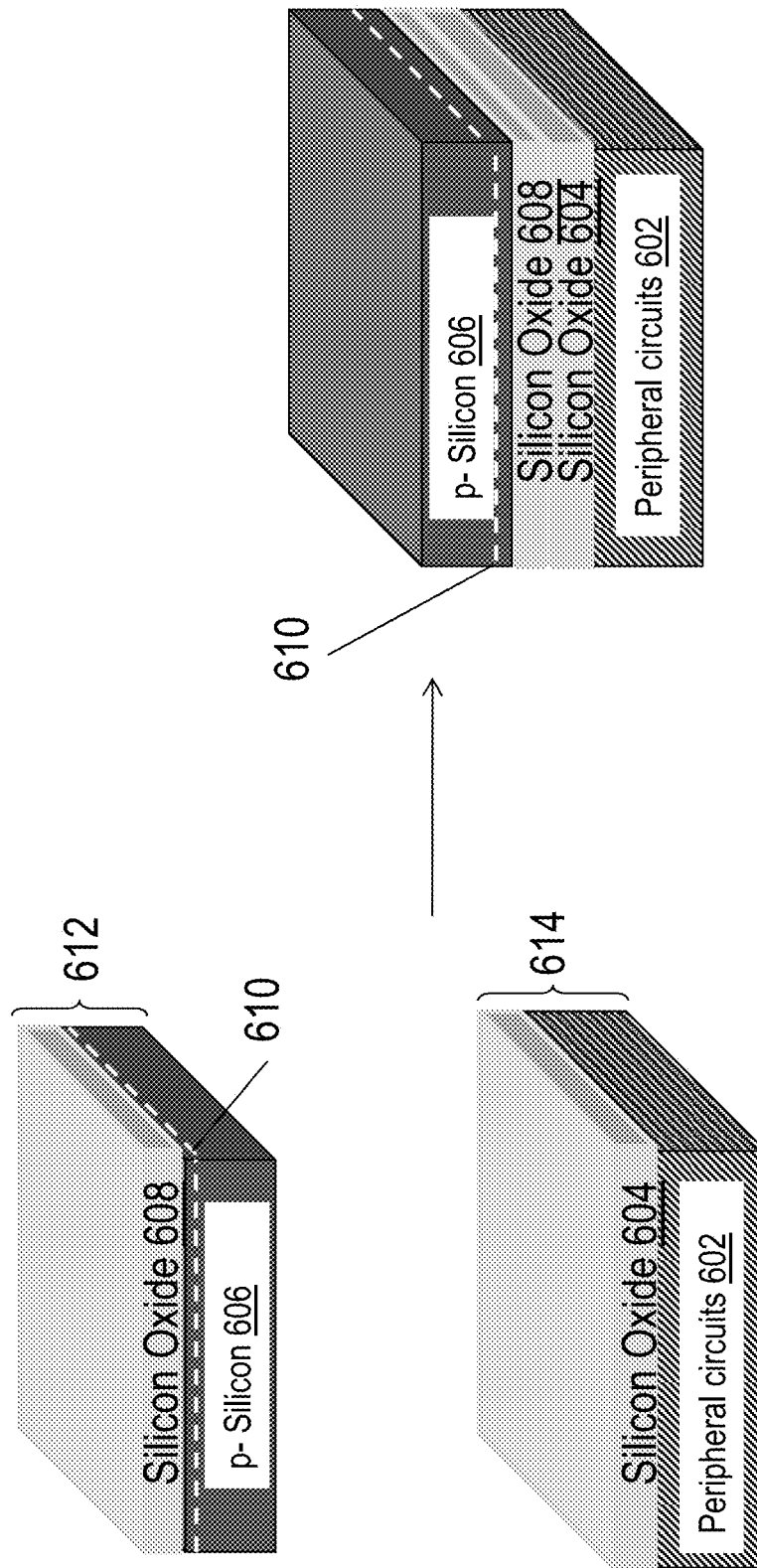

As illustrated in FIG. 6B, a mono-crystalline silicon donor wafer 612 may be processed to include a wafer sized layer of P− doping (not shown) which may have a different dopant concentration than the P− substrate 606. The P− doping layer may be formed by ion implantation and thermal anneal. A screen oxide layer 608 may be grown or deposited prior to the implant to protect the silicon from implant contamination and to provide an oxide surface for later wafer to wafer bonding. A layer transfer demarcation plane 610 (shown as a dashed line) may be formed in donor wafer 612 within the P− substrate 606 or the P− doping layer (not shown) by hydrogen implantation or other methods as previously described. Both the donor wafer 612 and acceptor wafer 614 may be prepared for wafer bonding as previously described and then bonded at the surfaces of oxide layer 604 and oxide layer 608, for example, at a low temperature (less than approximately 400° C.) for lowest stresses, or a moderate temperature (less than approximately 900° C.).

As illustrated in FIG. 6C, the portion of the P− layer (not shown) and the P− substrate 606 that may be above the layer transfer demarcation plane 610 may be removed by cleaving and polishing, or other processes as previously described, such as, for example, ion-cut or other methods, thus forming the remaining mono-crystalline silicon P− layer 606'. Remaining P− layer 606' and oxide layer 608 have been layer transferred to acceptor wafer 614. The top surface of P− layer 606' may be chemically or mechanically polished smooth and flat. Now transistors or portions of transistors may be formed and aligned to the acceptor wafer 614 alignment marks (not shown). Oxide layer 620 may be deposited to prepare the surface for later oxide to oxide bonding. This now forms the first Si/SiO$_2$ layer 623 which includes silicon oxide layer 620, P− layer 606', and oxide layer 608.

Figure 6D:
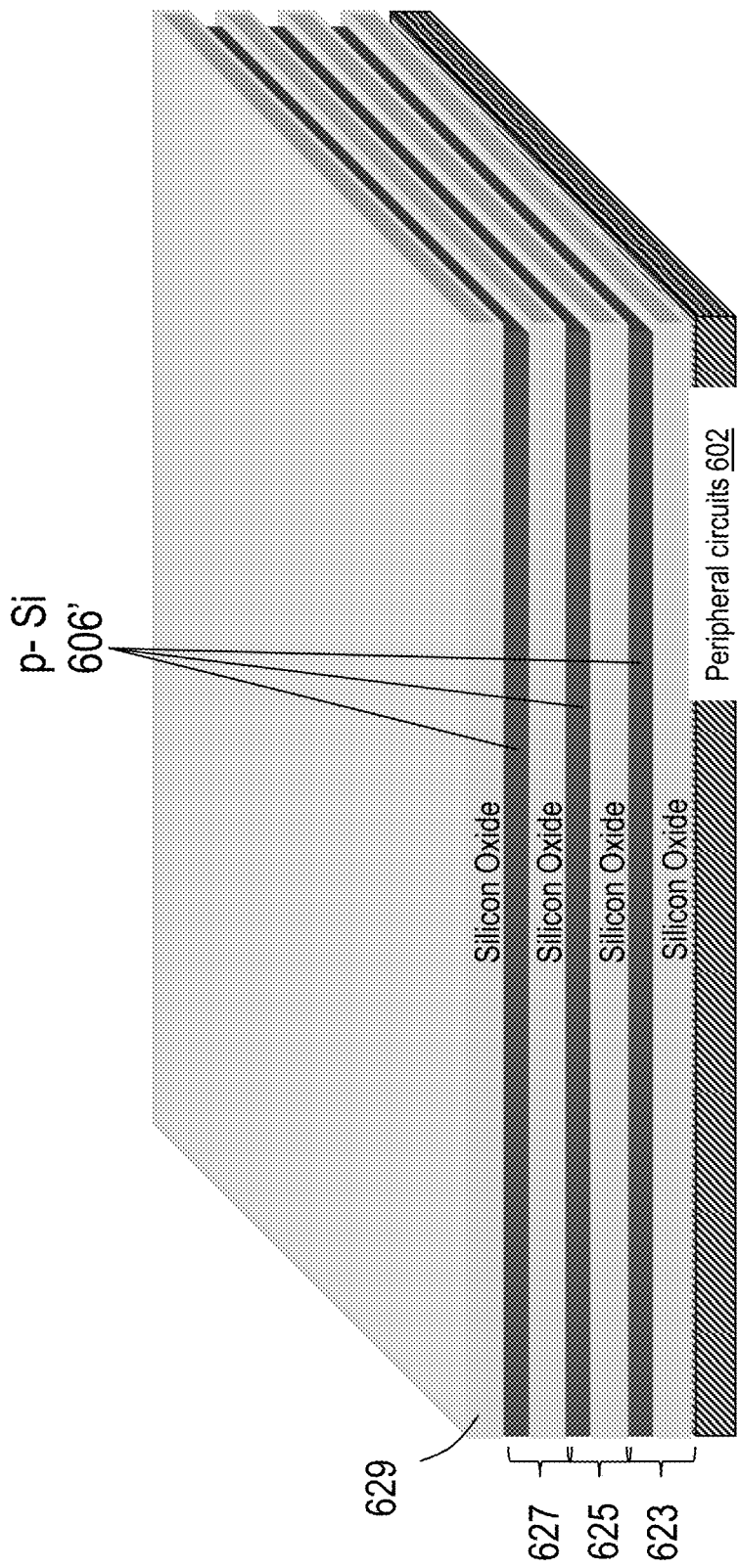

As illustrated in FIG. 6D, additional Si/SiO$_2$ layers, such as, for example, second Si/SiO$_2$ layer 625 and third Si/SiO$_2$ layer 627, may each be formed as described in FIGS. 6A to 6C. Oxide layer 629 may be deposited to electrically isolate the top silicon layer.

Figure 6E:
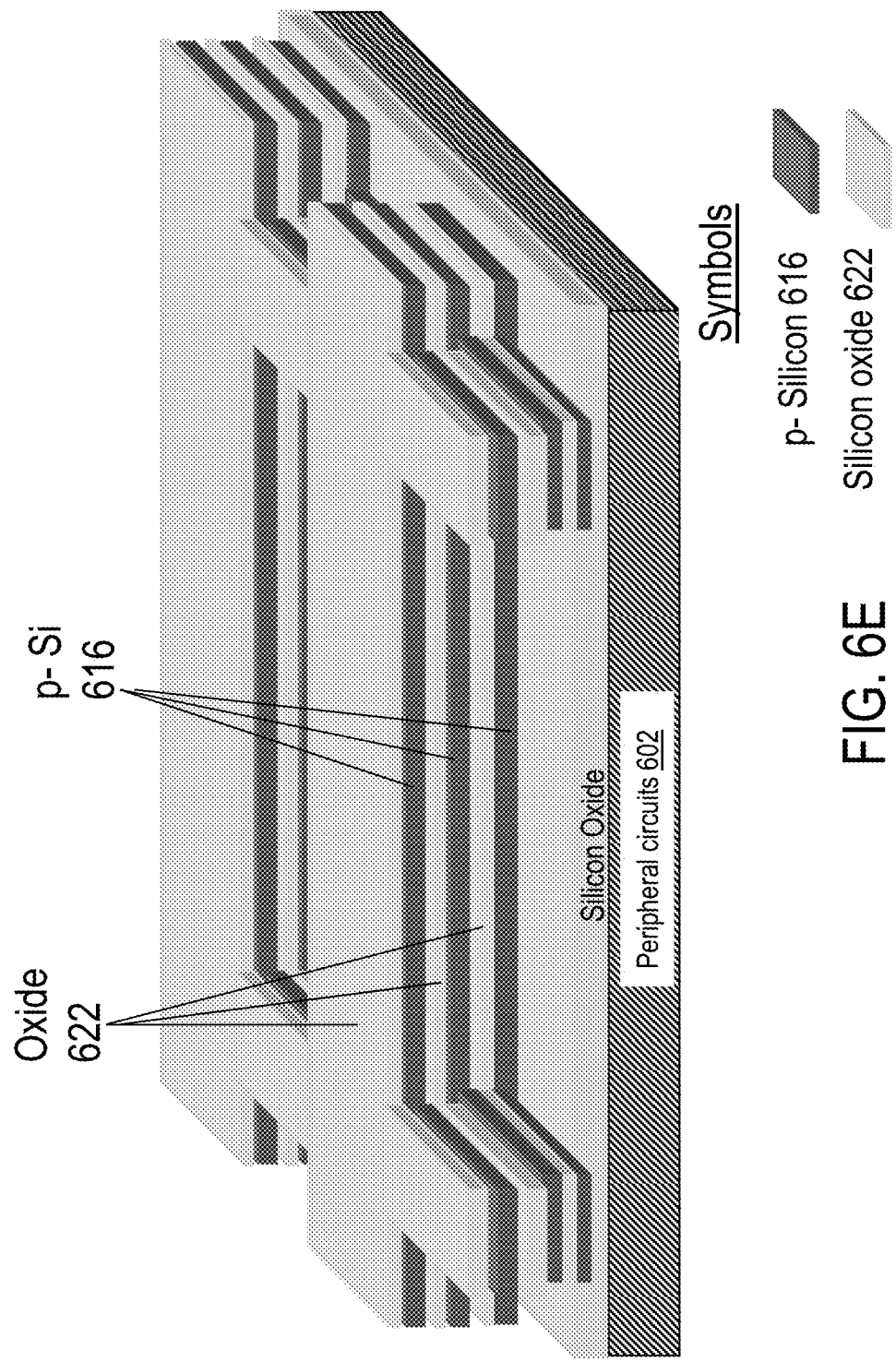

As illustrated in FIG. 6E, oxide layer 629, third Si/SiO$_2$ layer 627, second Si/SiO$_2$ layer 625 and first Si/SiO$_2$ layer 623 may be lithographically defined and plasma/RIE etched to form a portion of the memory cell structure, which may include regions of P− silicon 616 and oxide 622.

Figure 6F:
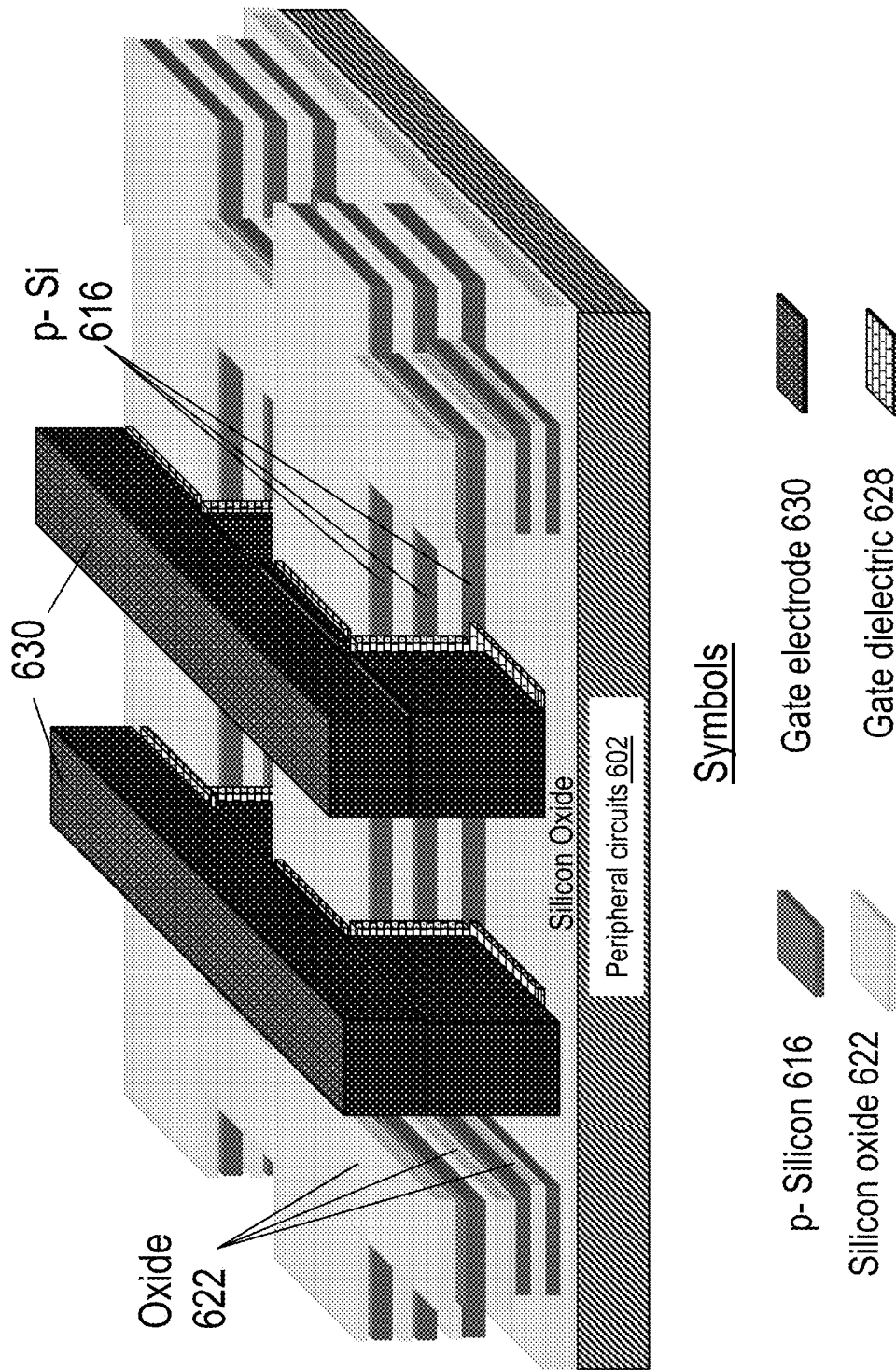

As illustrated in FIG. 6F, a gate dielectric and gate electrode material may be deposited, planarized with a chemical mechanical polish (CMP), and then lithographically defined and plasma/RIE etched to form gate dielectric regions 628 which may either be self-aligned to and substantially covered by gate electrodes 630 (shown), or substantially cover the entire silicon/oxide multi-layer structure. The gate stack including gate electrode 630 and gate dielectric regions 628 may be formed with a gate dielectric, such as, for example, thermal oxide, and a gate electrode material, such as, for example, poly-crystalline silicon. Alternatively, the gate dielectric may be an atomic layer deposited (ALD) material that may be paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 6G:
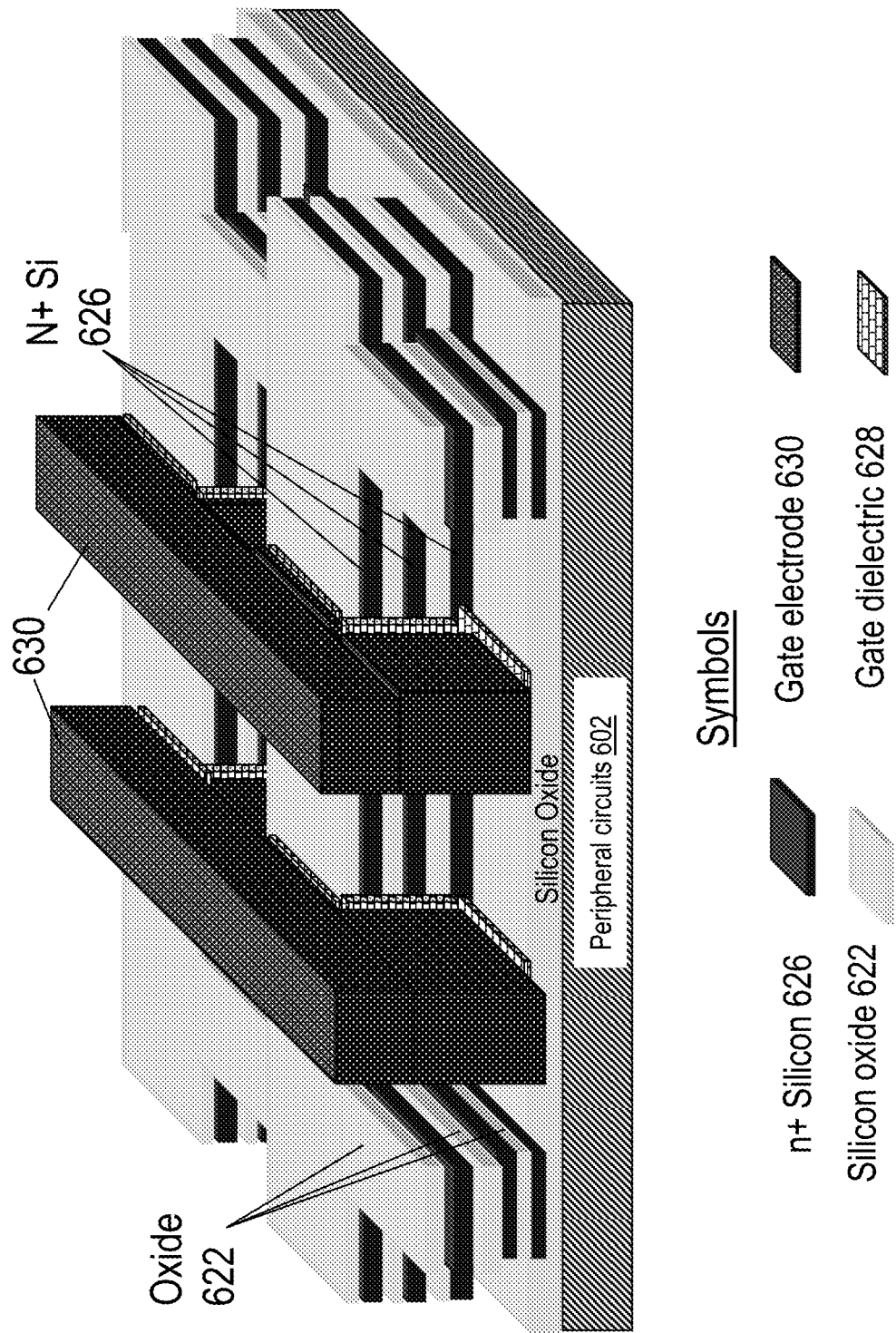

As illustrated in FIG. 6G, N+ silicon regions 626 may be formed in a self-aligned manner to the gate electrodes 630 by ion implantation of an N type species, such as, for example, Arsenic, into the portions of P− silicon regions 616 that may not be blocked by the gate electrodes 630. This forms remaining regions of P− silicon 617 (not shown) in the gate electrode 630 blocked areas. Different implant energies or angles, or multiples of each, may be utilized to place the N type species into each layer of P− silicon regions 616. Spacers (not shown) may be utilized during this multi-step implantation process and layers of silicon present in different layers of the stack may have different spacer widths to account for the differing lateral straggle of N type species implants. Bottom layers, such as, for example, first Si/SiO$_2$ layer 623, could have larger spacer widths than top layers, such as, for example, third Si/SiO$_2$ layer 627. Alternatively, angular ion implantation with substrate rotation may be utilized to compensate for the differing implant straggle. The top layer implantation may have a steeper angle than perpendicular to the wafer surface and hence land ions slightly underneath the gate electrode 630 edges and closely match a more perpendicular lower layer implantation which may land ions slightly underneath the gate electrode 630 edge as a result of the straggle effects of the greater implant energy necessary to reach the lower layer. A rapid thermal anneal (RTA) may be conducted to activate the dopants in substantially all of the memory layers 623, 625, 627 and in the peripheral circuitry substrate 602. Alternatively, optical anneals, such as, for example, a laser based anneal, may be performed.

Figure 6H:
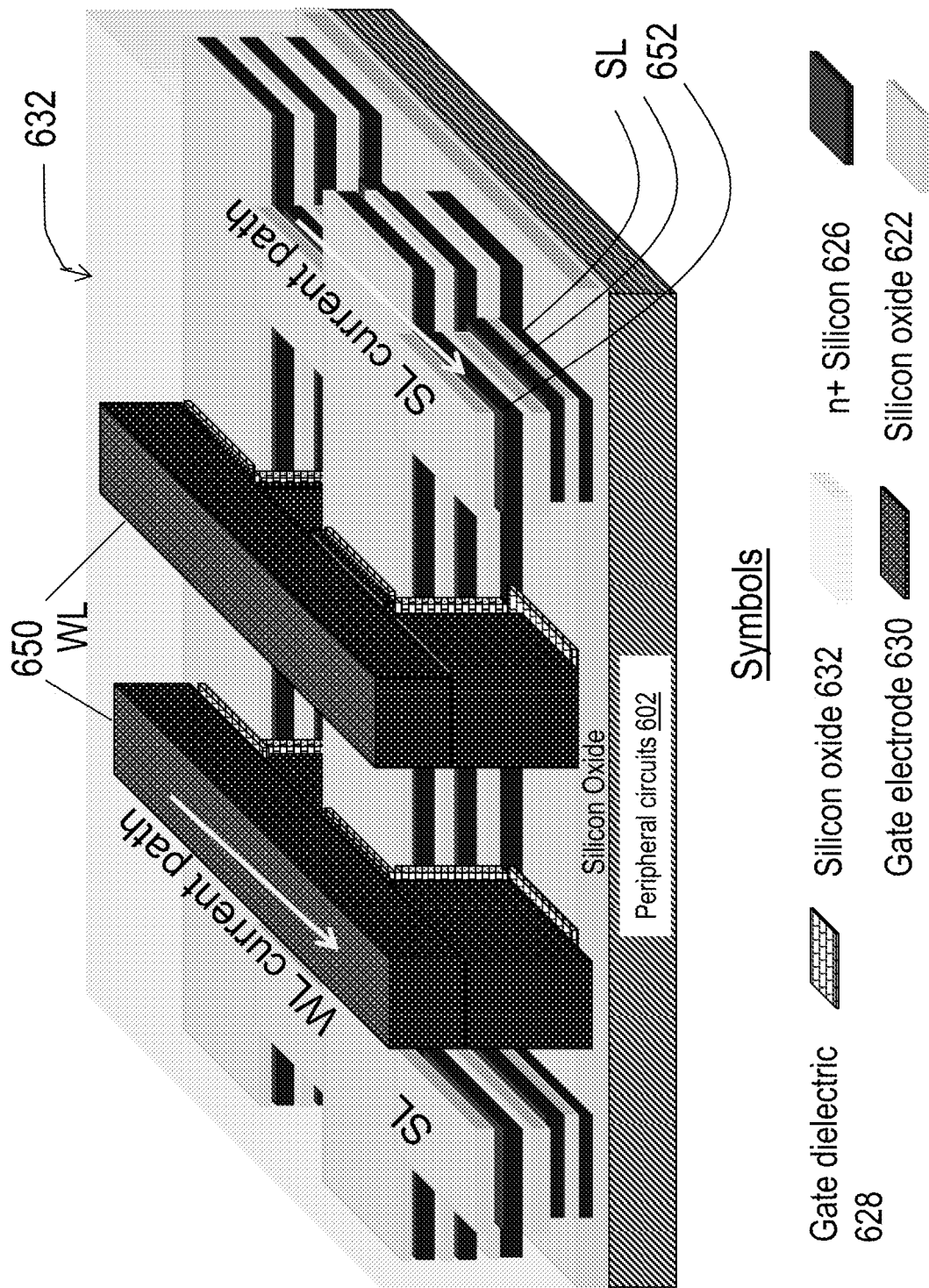
Figure 61:
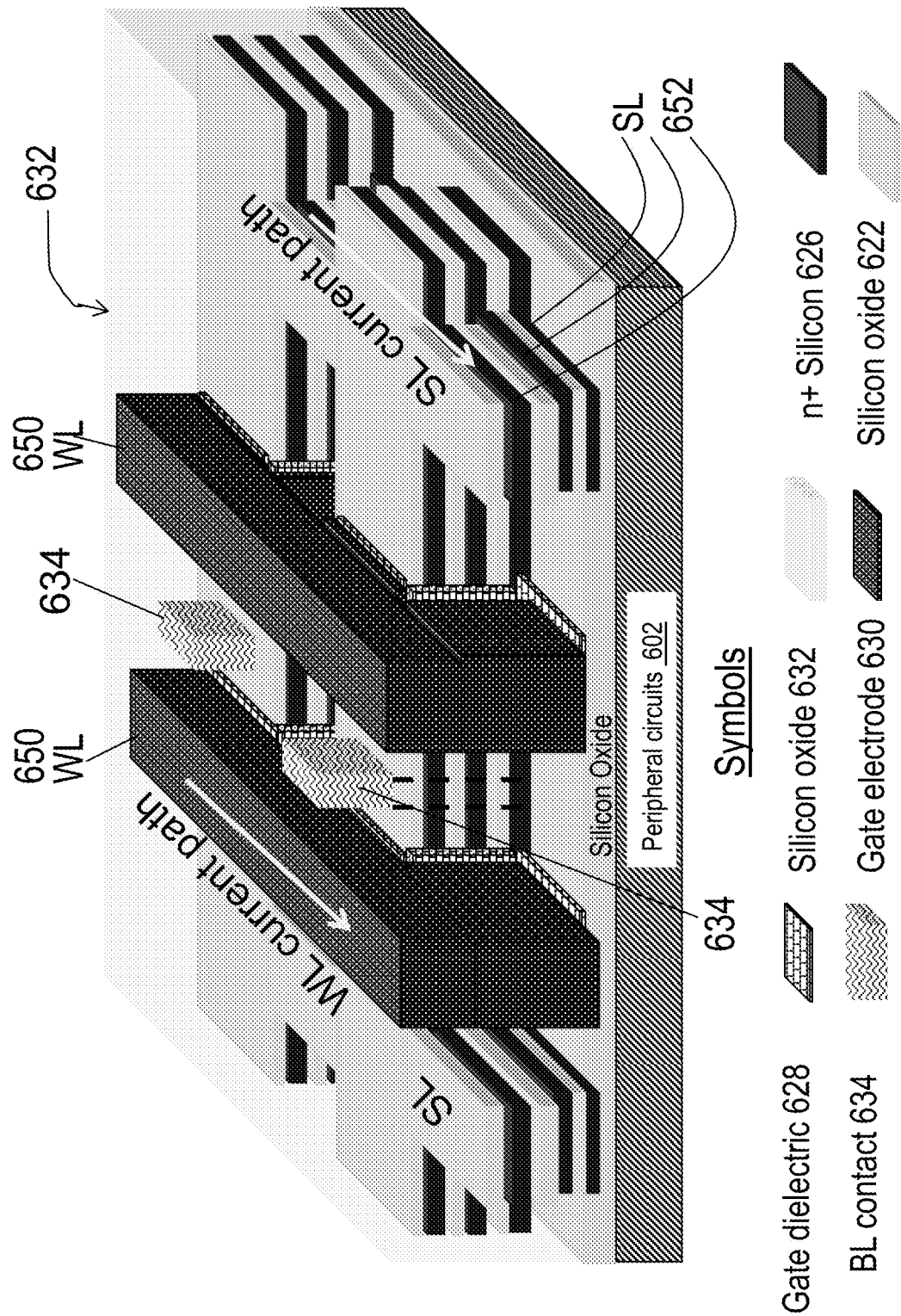

As illustrated in FIG. 6H, the entire structure may be substantially covered with a gap fill oxide 632, which be planarized with chemical mechanical polishing. The oxide 632 is shown transparent in the figure for clarity. Word-line regions (WL) 650, coupled with and composed of gate electrodes 630, and source-line regions (SL) 652, composed of indicated N+ silicon regions 626, are shown.

As illustrated in FIG. 6I, bit-line (BL) contacts 634 may be lithographically defined, etched with plasma/RIE, photoresist removed, and then metal, such as, for example, copper, aluminum, or tungsten, may be deposited to fill the contact and etched or polished to the top of oxide 632. Each BL contact 634 may be shared among substantially all layers of memory, shown as three layers of memory in FIG. 6I. A thru layer via (not shown) may be formed to electrically couple the BL, SL, and WL metallization to the acceptor wafer 614 peripheral circuitry via an acceptor wafer metal connect pad (not shown).

Figure 6J:
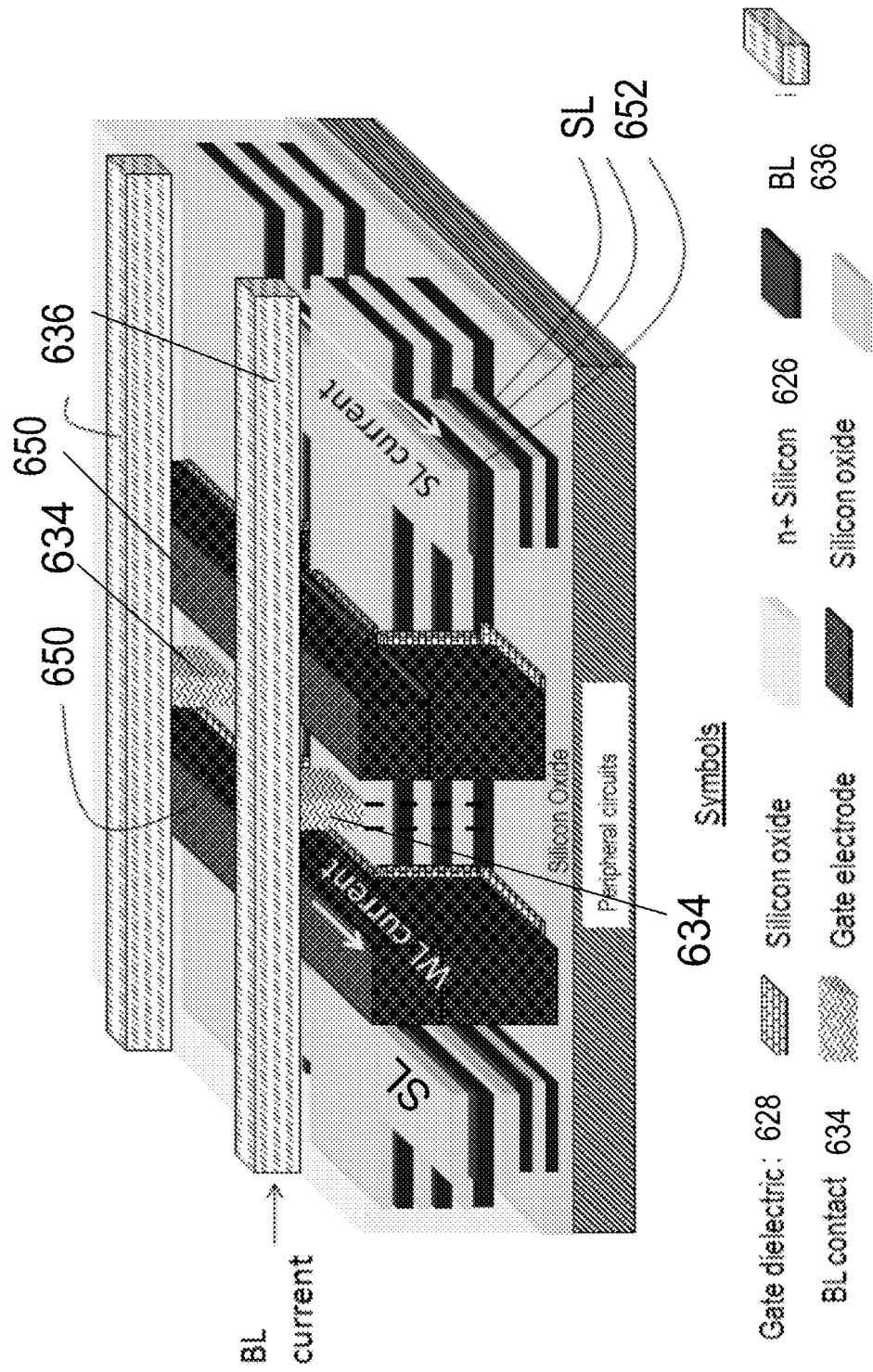

As illustrated in FIG. 6J, BL metal lines 636 may be formed and connect to the associated BL contacts 634. Contacts and associated metal interconnect lines (not shown) may be formed for the WL and SL at the memory array edges.

Figure 6K:
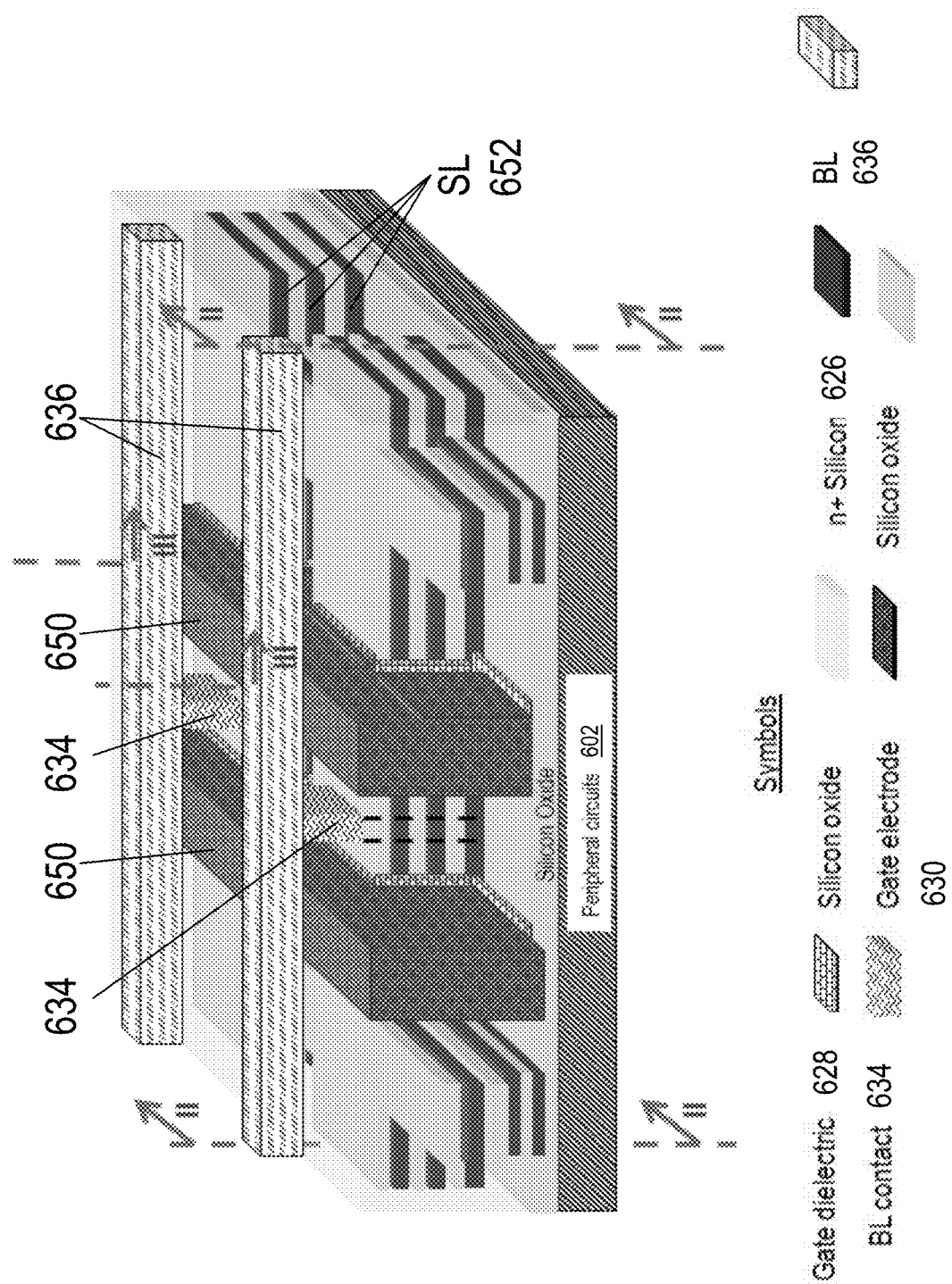

As illustrated in FIGS. 6K, 6K1 and 6K2, cross section cut II of FIG. 6K is shown in FIG. 6K1, and cross section cut III of FIG. 6K is shown in FIG. 6K2. BL metal lines 636, oxide 632, BL contact 634, WL regions 650, gate dielectric regions 628, N+ silicon regions 626, P− silicon regions 617, and peripheral circuitry substrate 602 are shown in FIG. 6K1. The BL contact 634 couples to one side of the three levels of floating body transistors that may include two N+ silicon regions 626 in each level with their associated P− silicon region 617. BL metal lines 636, oxide 632, gate electrode 630, gate dielectric regions 628, P− silicon regions 617, interlayer oxide region ('ox'), and peripheral circuitry substrate 602 are shown in FIG. 6K2. The gate electrode 630 may be common to substantially all six P− silicon regions 617 and forms six two-sided gated floating body transistors.

Figure 6L:
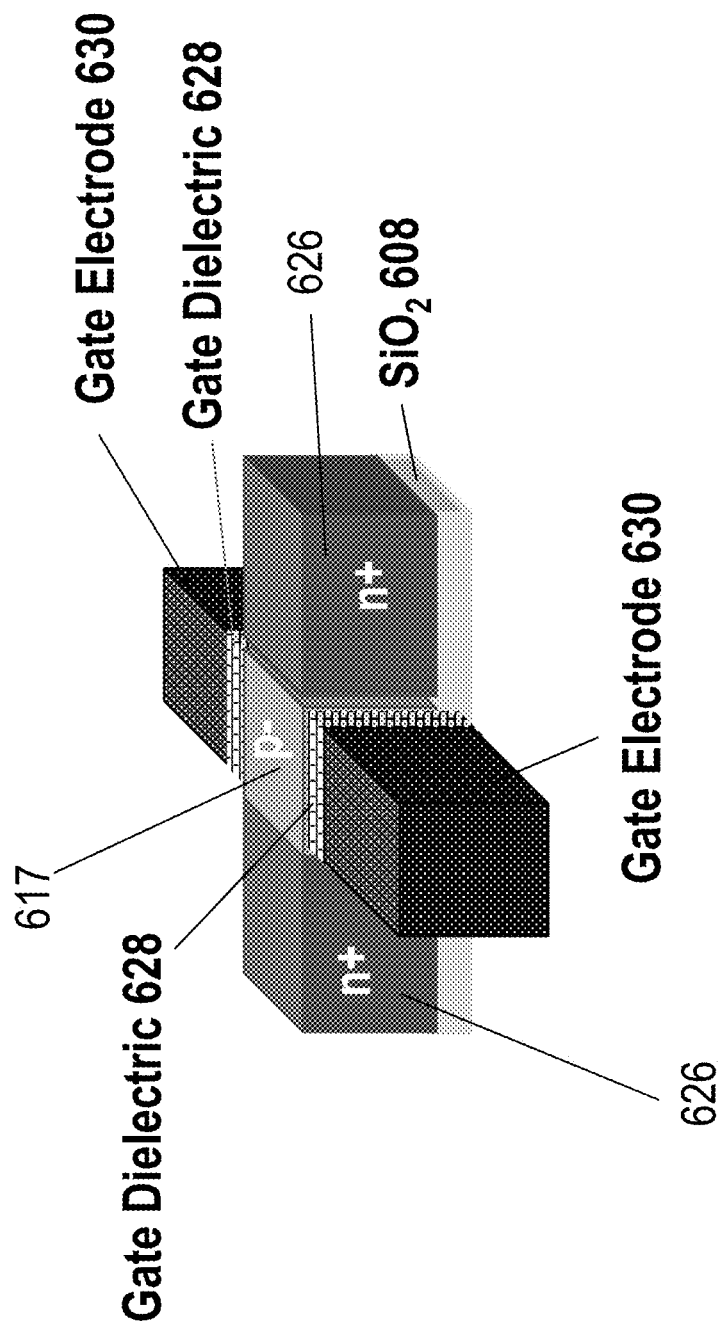

As illustrated in FIG. 6L, a single exemplary floating body two gate transistor on the first $Si/SiO_2$ layer 623 may include P− silicon region 617 (functioning as the floating body transistor channel), N+ silicon regions 626 (functioning as source and drain), and two gate electrodes 630 with associated gate dielectric regions 628. The transistor may be electrically isolated from beneath by oxide layer 608.

This flow enables the formation of a horizontally-oriented monolithic 3D DRAM that utilizes zero additional masking steps per memory layer and may be constructed by layer transfers of wafer sized doped mono-crystalline silicon layers and may be connected to an underlying multi-metal layer semiconductor device.

Persons of ordinary skill in the art will appreciate that the illustrations in FIGS. 6A through 6L are exemplary only and are not drawn to scale. Such skilled persons will further appreciate that many variations are possible such as, for example, the transistors may be of another type such as RCATs, or junction-less. Additionally, the contacts may utilize doped poly-crystalline silicon, or other conductive materials. Moreover, the stacked memory layer may be connected to a periphery circuit that may be above the memory stack. Further, each gate of the double gate 3D DRAM can be independently controlled for increased control of the memory cell. Many other modifications within the scope of the invention will suggest themselves to such skilled persons after reading this specification. Thus the invention is to be limited only by the appended claims.

Novel monolithic 3D memory technologies utilizing material resistance changes may be constructed in a similar manner. There are many types of resistance-based memories including phase change memory, Metal Oxide memory, resistive RAM (RRAM), memristors, solid-electrolyte memory, ferroelectric RAM, and MRAM. Background information on these resistive-memory types is given in "Overview of candidate device technologies for storage-class memory," IBM Journal of Research and Development, vol. 52, no. 4.5, pp. 449-464, July 2008 by Burr, G. W., et al. The contents of this document are incorporated in this specification by reference.

As illustrated in FIGS. 7A to 7K, a resistance-based zero additional masking steps per memory layer 3D memory may be constructed that may be suitable for 3D IC manufacturing. This 3D memory utilizes junction-less transistors and may have a resistance-based memory element in series with a select or access transistor.

Figure 7A:
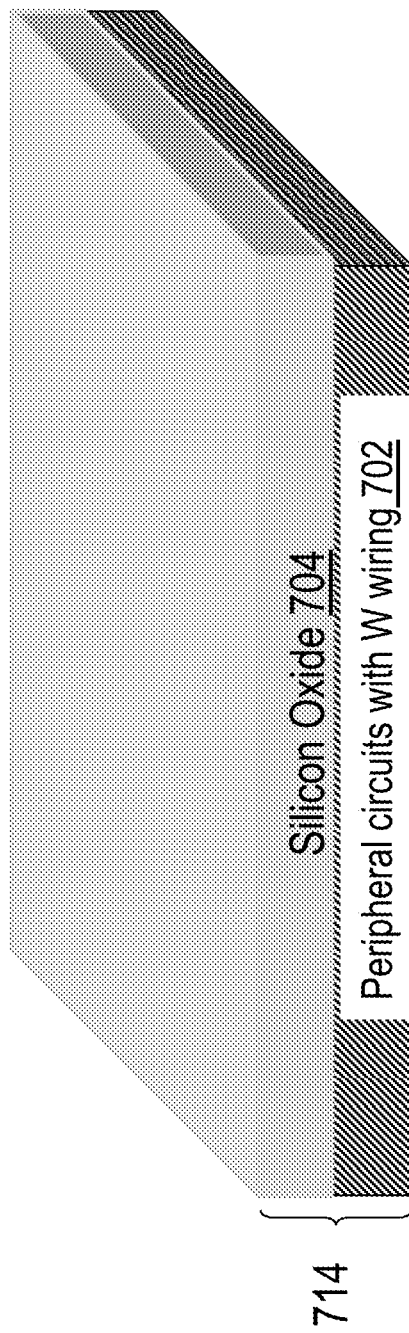

As illustrated in FIG. 7A, a silicon substrate with peripheral circuitry 702 may be constructed with high temperature (greater than approximately 400° C.) resistant wiring, such as, for example, Tungsten. The peripheral circuitry substrate 702 may include memory control circuits as well as circuitry for other purposes and of various types, such as, for example, analog, digital, RF, or memory. The peripheral circuitry substrate 702 may include peripheral circuits that can withstand an additional rapid-thermal-anneal (RTA) and still remain operational and retain good performance. For this purpose, the peripheral circuits may be formed such that they have not been subjected to a weak RTA or no RTA for activating dopants in anticipation of anneals later in the process flow. The top surface of the peripheral circuitry substrate 702 may be prepared for oxide wafer bonding with a deposition of a silicon oxide layer 704, thus forming acceptor wafer 714.

Figure 7B:
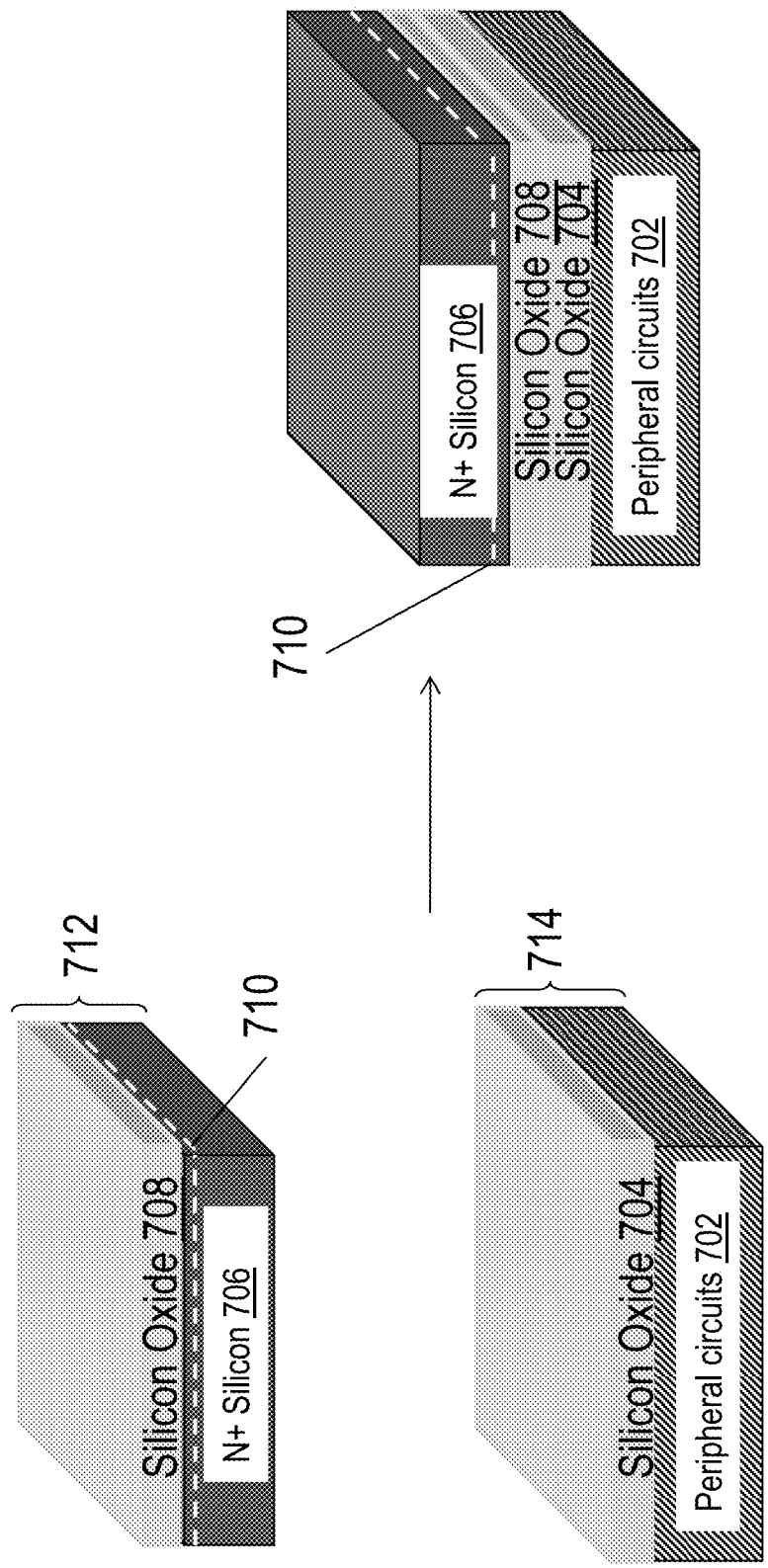

As illustrated in FIG. 7B, a mono-crystalline silicon donor wafer 712 may be processed to include a wafer sized layer of N+ doping (not shown) which may have a different dopant concentration than the N+ substrate 706. The N+ doping layer may be formed by ion implantation and thermal anneal. A screen oxide layer 708 may be grown or deposited prior to the implant to protect the silicon from implant contamination and to provide an oxide surface for later wafer to wafer bonding. A layer transfer demarcation plane 710 (shown as a dashed line) may be formed in donor wafer 712 within the N+ substrate 706 or the N+ doping layer (not shown) by hydrogen implantation or other methods as previously described. Both the donor wafer 712 and acceptor wafer 714 may be prepared for wafer bonding as previously described and then bonded at the surfaces of oxide layer 704 and oxide layer 708, for example, at a low temperature (less than approximately 400° C.) for lowest stresses, or a moderate temperature (less than approximately 900° C.).

Figure 7C:
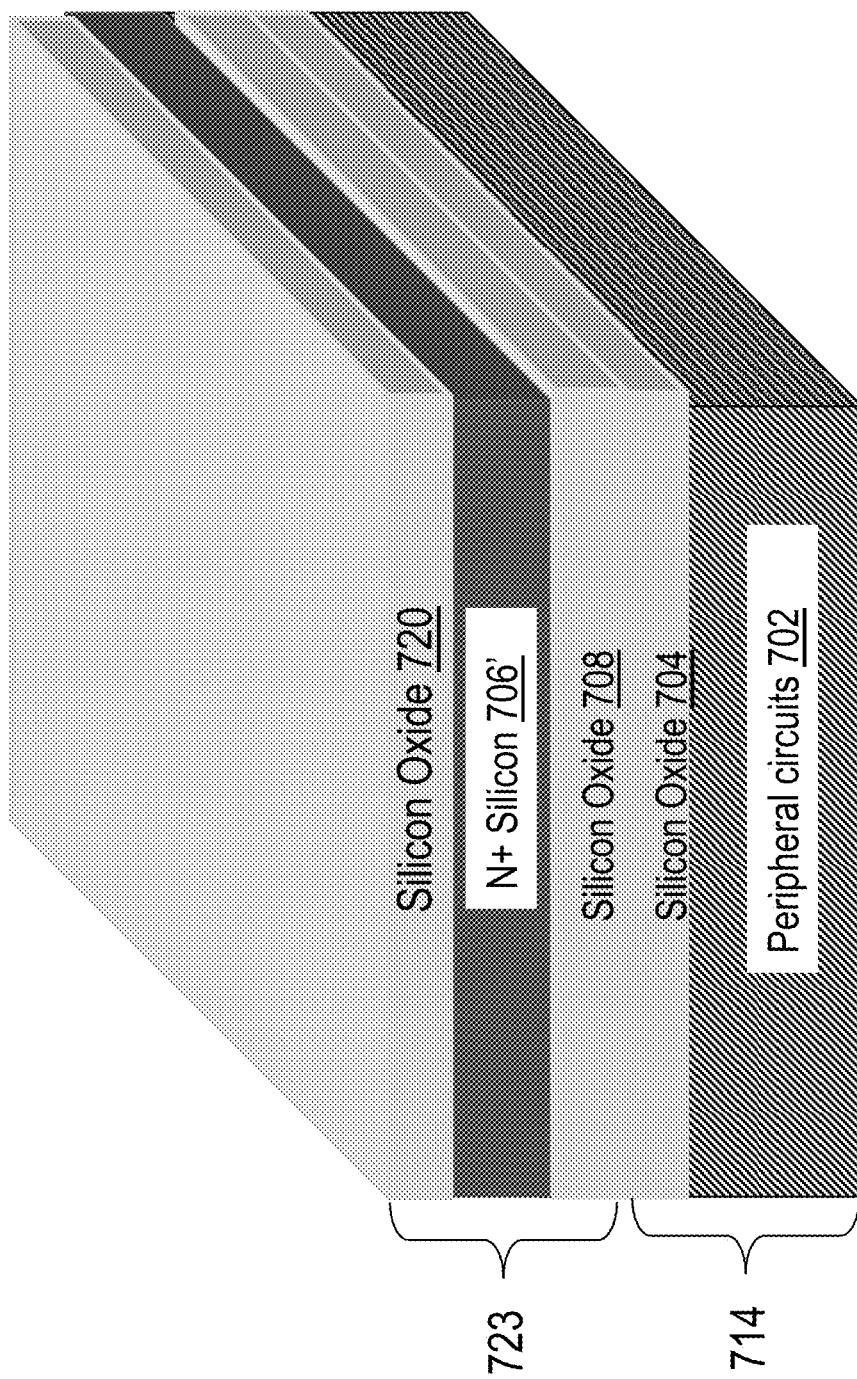

As illustrated in FIG. 7C, the portion of the N+ layer (not shown) and the N+ wafer substrate 706 that may be above the layer transfer demarcation plane 710 may be removed by cleaving and polishing, or other processes as previously described, such as, for example, ion-cut or other methods, thus forming the remaining mono-crystalline silicon N+ layer 706'. Remaining N+ layer 706' and oxide layer 708 have been layer transferred to acceptor wafer 714. The top surface of N+ layer 706' may be chemically or mechanically polished smooth and flat. Now transistors or portions of transistors may be formed and aligned to the acceptor wafer 714 alignment marks (not shown). Oxide layer 720 may be deposited to prepare the surface for later oxide to oxide bonding. This now forms the first Si/SiO$_2$ layer 723 which includes silicon oxide layer 720, N+ silicon layer 706', and oxide layer 708.

Figure 7D:
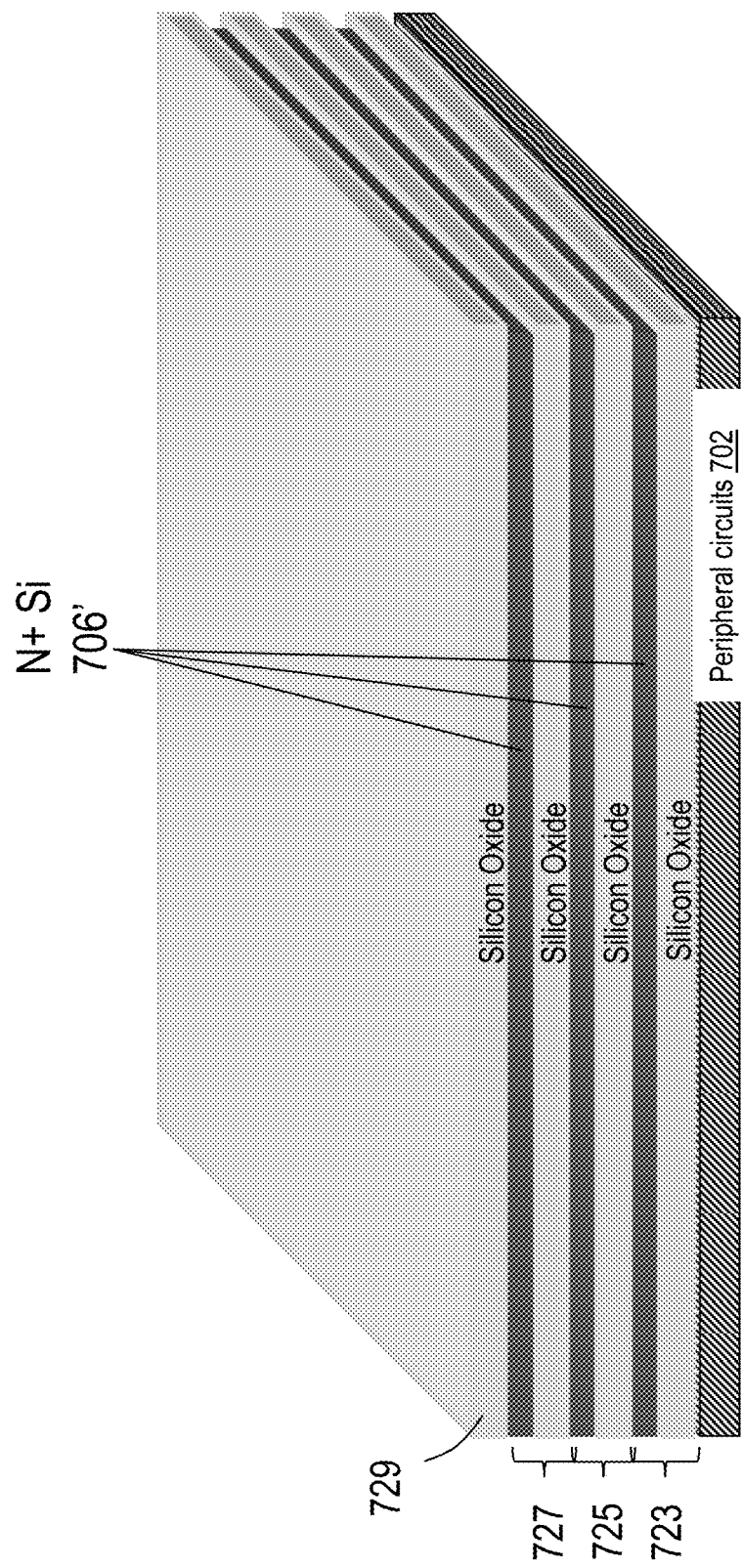

As illustrated in FIG. 7D, additional Si/SiO$_2$ layers, such as, for example, second Si/SiO$_2$ layer 725 and third Si/SiO$_2$ layer 727, may each be formed as described in FIGS. 7A to 7C. Oxide layer 729 may be deposited to electrically isolate the top N+ silicon layer.

Figure 7E:
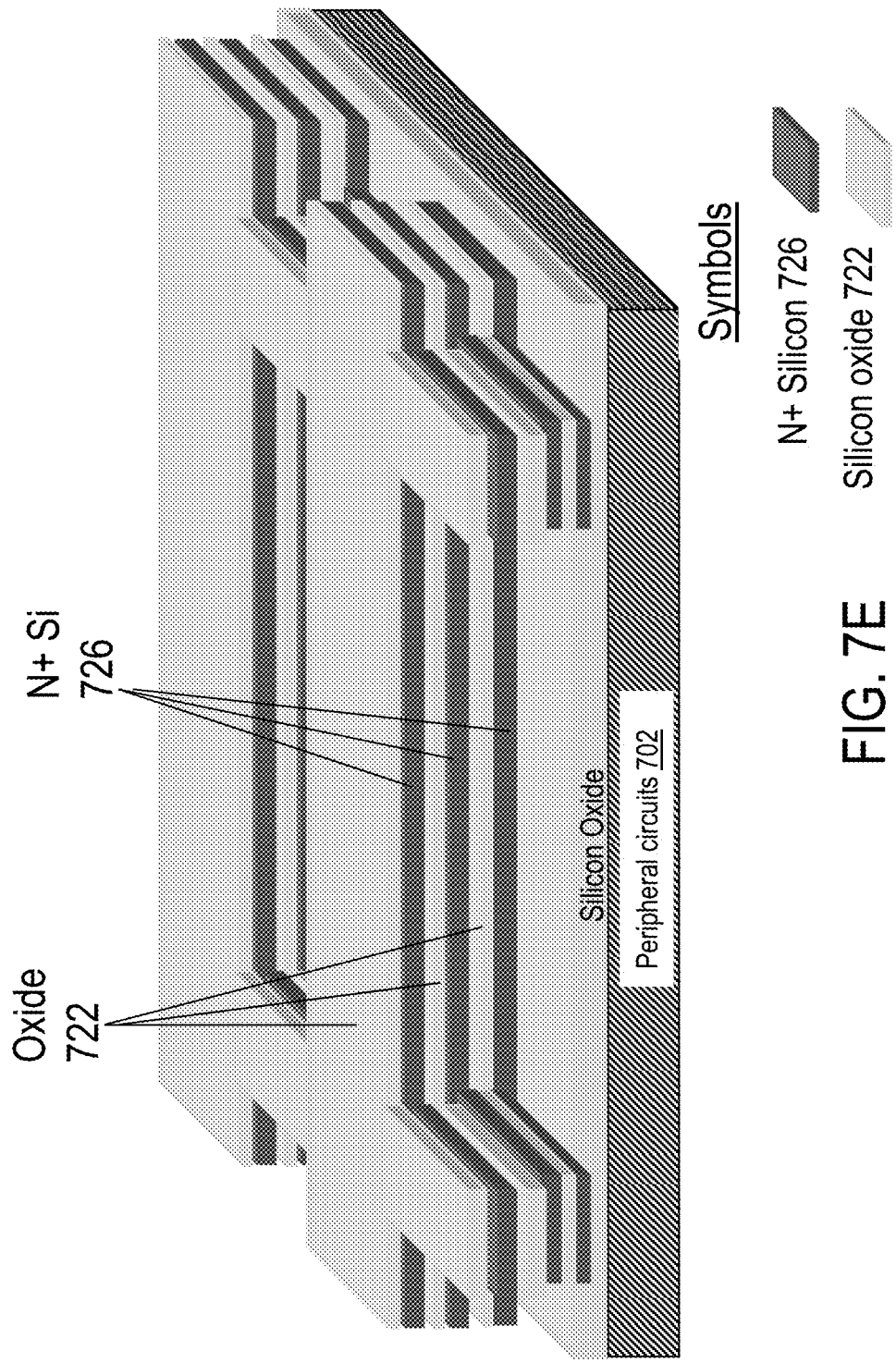

As illustrated in FIG. 7E, oxide layer 729, third Si/SiO$_2$ layer 727, second Si/SiO$_2$ layer 725 and first Si/SiO$_2$ layer 723 may be lithographically defined and plasma/RIE etched to form a portion of the memory cell structure, which now includes regions of N+ silicon 726 and oxide 722.

Figure 7F:
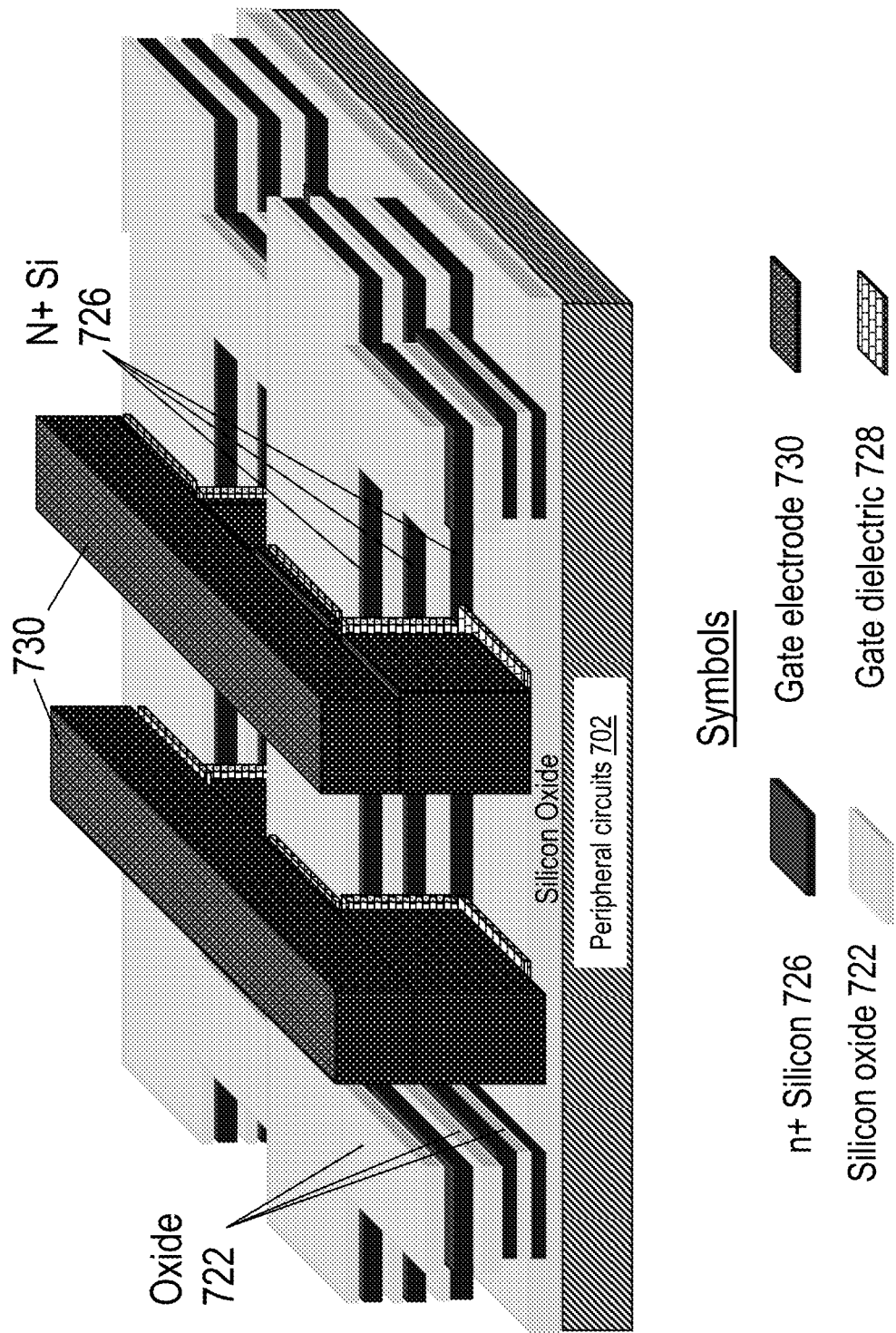

As illustrated in FIG. 7F, a gate dielectric and gate electrode material may be deposited, planarized with a chemical mechanical polish (CMP), and then lithographically defined and plasma/RIE etched to form gate dielectric regions 728 which may either be self-aligned to and substantially covered by gate electrodes 730 (shown), or substantially cover the entire N+ silicon 726 and oxide 722 multi-layer structure. The gate stack including gate electrodes 730 and gate dielectric regions 728 may be formed with a gate dielectric, such as, for example, thermal oxide, and a gate electrode material, such as, for example, polycrystalline silicon. Alternatively, the gate dielectric may be an atomic layer deposited (ALD) material that may be paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 7G:
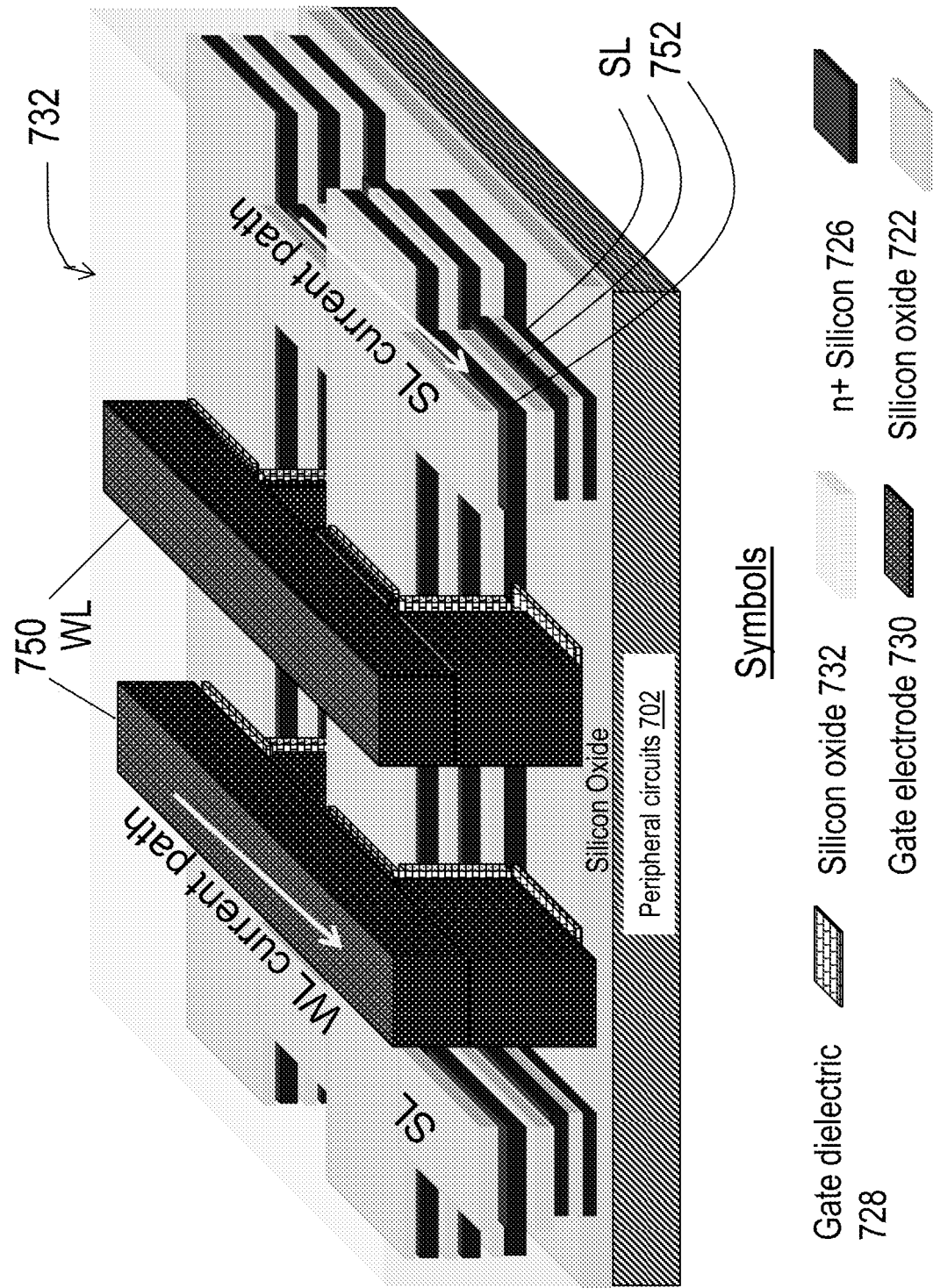

As illustrated in FIG. 7G, the entire structure may be substantially covered with a gap fill oxide 732, which may be planarized with chemical mechanical polishing. The oxide 732 is shown transparent in the figure for clarity. Word-line regions (WL) 750, coupled with and composed of gate electrodes 730, and source-line regions (SL) 752, composed of N+ silicon regions 726, are shown.

Figure 7H:
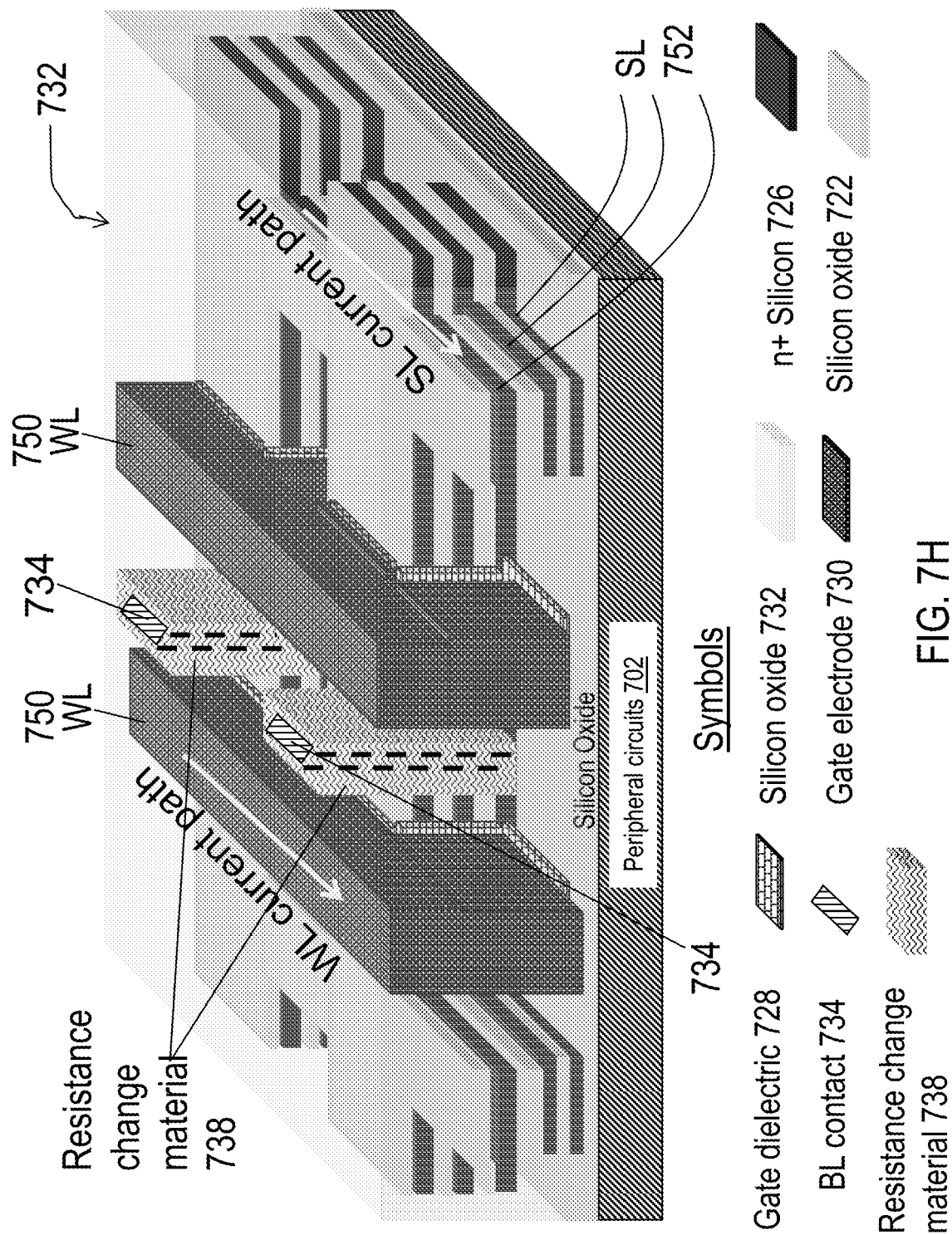
Figure 71:
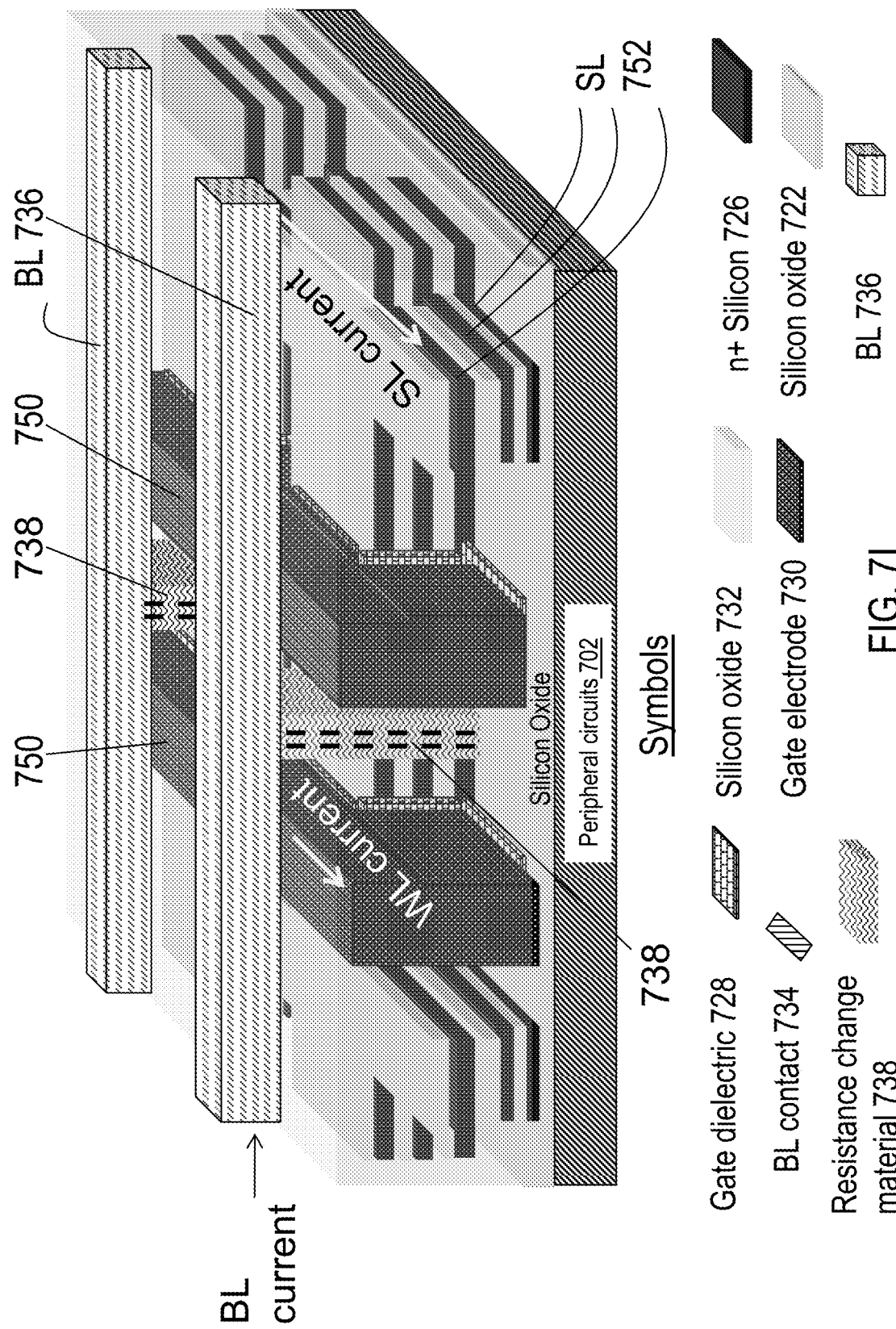

As illustrated in FIG. 7H, bit-line (BL) contacts 734 may be lithographically defined, etched with plasma/RIE through oxide 732, the three N+ silicon regions 726, and associated oxide vertical isolation regions to connect substantially all memory layers vertically, and photoresist removed. Resistance change material 738, such as, for example, hafnium oxide, may then be deposited, for example, with atomic layer deposition (ALD). The electrode for the resistance change memory element may then be deposited by ALD to form the electrode/BL contact 734. The excess deposited material may be polished to planarity at or below the top of oxide 732. Each BL contact 734 with resistive change material 738 may be shared among substantially all layers of memory, shown as three layers of memory in FIG. 7H.

As illustrated in FIG. 7I, BL metal lines 736 may be formed and connect to the associated BL contacts 734 with resistive change material 738. Contacts and associated metal interconnect lines (not shown) may be formed for the WL and SL at the memory array edges. A thru layer via (not shown) may be formed to electrically couple the BL, SL, and WL metallization to the acceptor wafer 714 peripheral circuitry via an acceptor wafer metal connect pad (not shown).

Figure 7J:
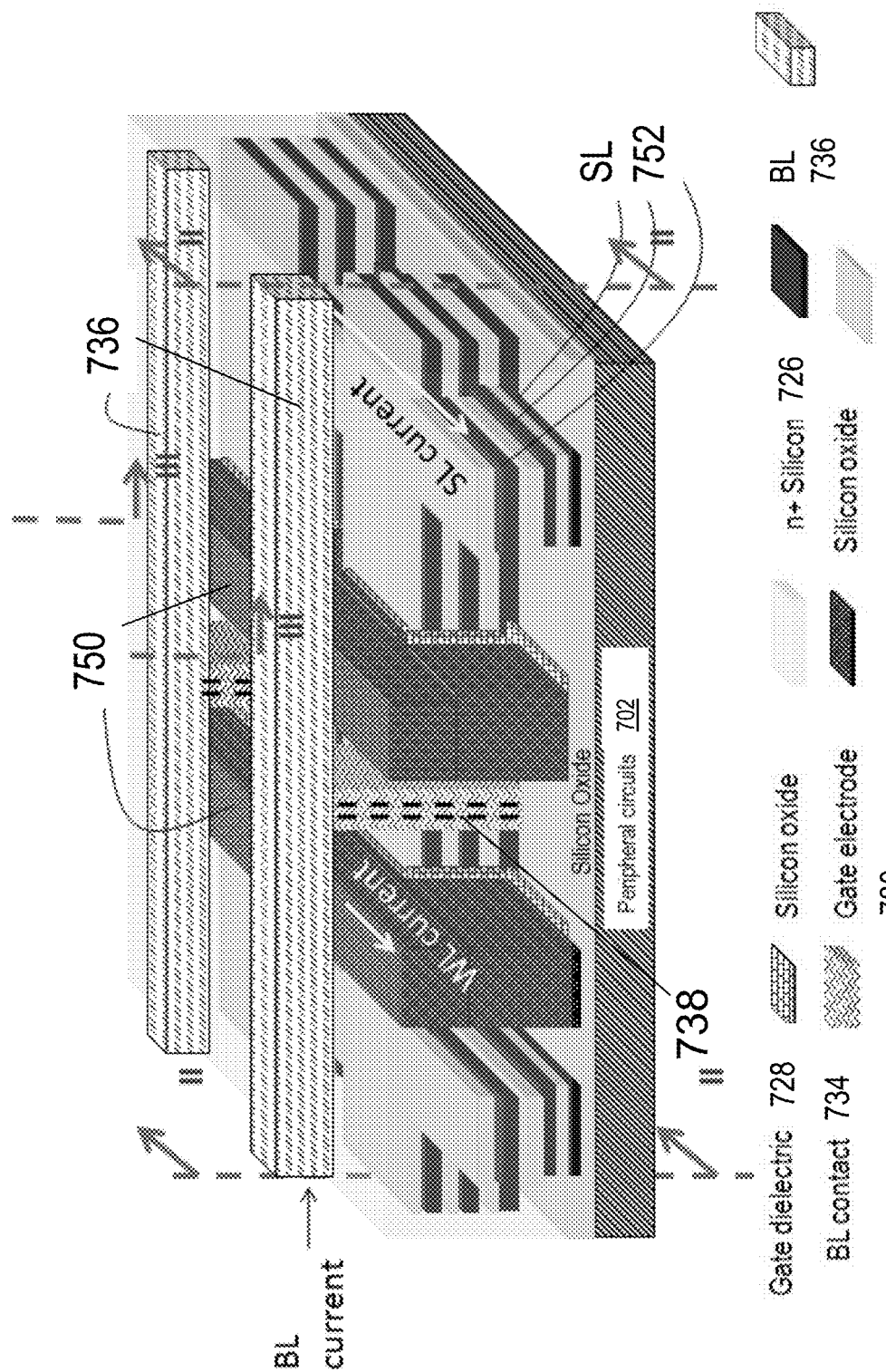

As illustrated in FIGS. 7J, 7J1 and 7J2, cross section cut II of FIG. 7J is shown in FIG. 7J1, and cross section cut III of FIG. 7J is shown in FIG. 7J2. BL metal lines 736, oxide 732, BL contact/electrode 2534, resistive change material 738, WL regions 750, gate dielectric regions 728, N+ silicon regions 726, and peripheral circuitry substrate 702 are shown in FIG. 7J1. The BL contact/electrode 2534 couples to one side of the three levels of resistive change material 738. The other side of the resistive change material 738 may be coupled to N+ regions 726. BL metal lines 736, oxide 732, gate electrodes 730, gate dielectric regions 728, N+ silicon regions 726, interlayer oxide region ('ox'), and peripheral circuitry substrate 702 are shown in FIG. 7J2. The gate electrode 730 may be common to substantially all six N+ silicon regions 726 and forms six two-sided gated junction-less transistors as memory select transistors.

Figure 7K:
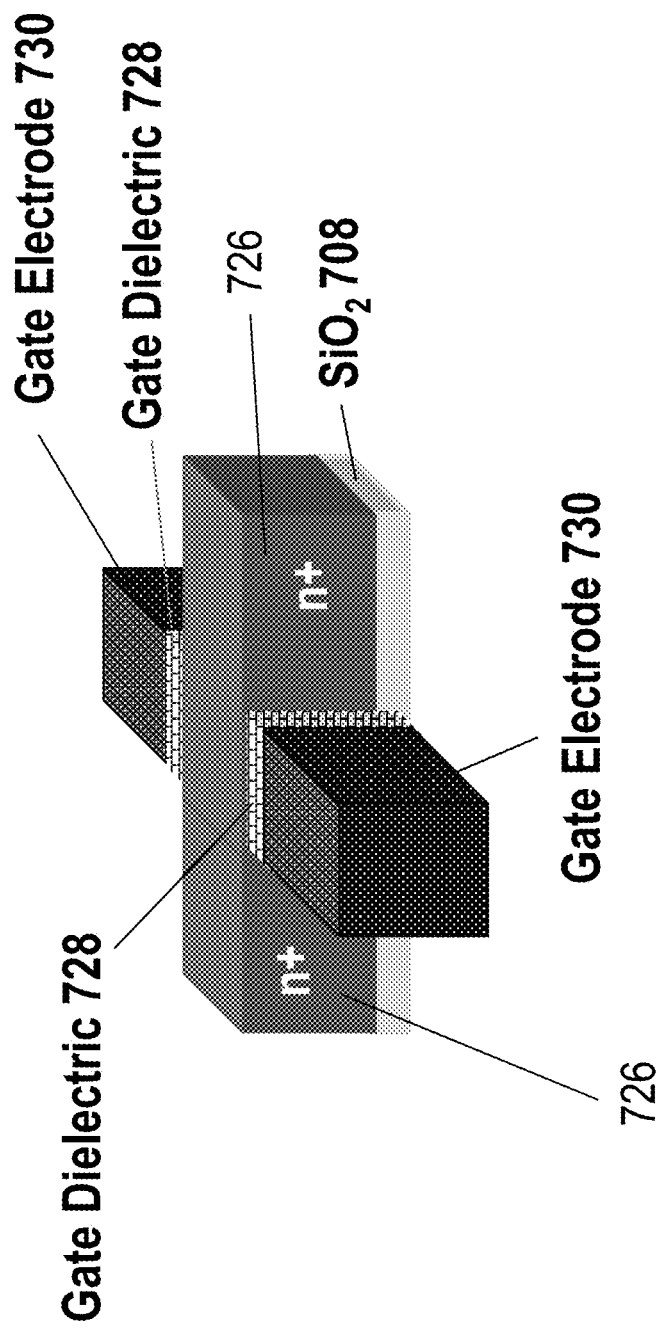

As illustrated in FIG. 7K, a single exemplary two-sided gated junction-less transistor on the first Si/SiO$_2$ layer 723 may include N+ silicon region 726 (functioning as the source, drain, and transistor channel), and two gate electrodes 730 with associated gate dielectric regions 728. The transistor may be electrically isolated from beneath by oxide layer 708.

This flow enables the formation of a resistance-based multi-layer or 3D memory array with zero additional masking steps per memory layer, which utilizes junction-less transistors and may have a resistance-based memory element in series with a select transistor, and may be constructed by layer transfers of wafer sized doped monocrystalline silicon layers, and this 3D memory array may be connected to an underlying multi-metal layer semiconductor device.

Persons of ordinary skill in the art will appreciate that the illustrations in FIGS. 7A through 7K are exemplary only and are not drawn to scale. Such skilled persons will further appreciate that many variations are possible such as, for example, the transistors may be of another type such as RCATs. Additionally, doping of each N+ layer may be slightly different to compensate for interconnect resistances. Moreover, the stacked memory layer may be connected to a periphery circuit that may be above the memory stack. Further, each gate of the double gate 3D resistance based memory can be independently controlled for increased control of the memory cell. Many other modifications within the scope of the invention will suggest themselves to such skilled persons after reading this specification. Thus the invention is to be limited only by the appended claims.

The monolithic 3D integration concepts described in this patent application can lead to novel embodiments of polycrystalline silicon based memory architectures. While the below concepts in FIG. 8 are explained by using resistive memory architectures as an example, it will be clear to one skilled in the art that similar concepts can be applied to the NAND flash, charge trap, and DRAM memory architectures and process flows described previously in this patent application and incorporated by reference co-owned applications.

As illustrated in FIGS. 8A to 8K, a resistance-based 3D memory with zero additional masking steps per memory layer may be constructed with methods that may be suitable for 3D IC manufacturing. This 3D memory utilizes polycrystalline silicon junction-less transistors that may have either a positive or a negative threshold voltage and may have a resistance-based memory element in series with a select or access transistor.

Figure 8A:
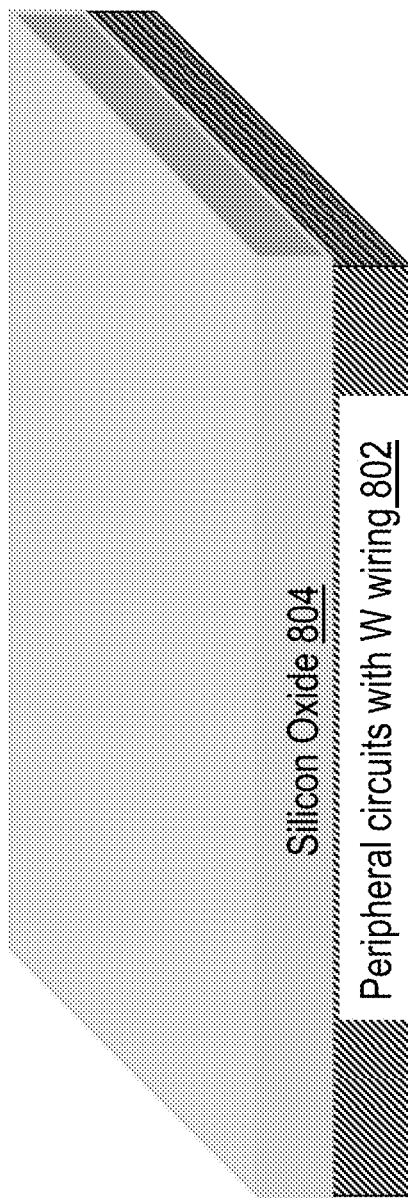

As illustrated in FIG. 8A, a silicon substrate with peripheral circuitry 802 may be constructed with high temperature (greater than approximately 400° C.) resistant wiring, such as, for example, Tungsten. The peripheral circuitry substrate 802 may include memory control circuits as well as circuitry for other purposes and of various types, such as, for example, analog, digital, RF, or memory. The peripheral circuitry substrate 802 may include peripheral circuits that can withstand an additional rapid-thermal-anneal (RTA) and still remain operational and retain good performance. For this purpose, the peripheral circuits may be formed such that they have not been subjected to a weak RTA or no RTA for activating dopants. Silicon oxide layer 804 may be deposited on the top surface of the peripheral circuitry substrate.

Figure 8B:
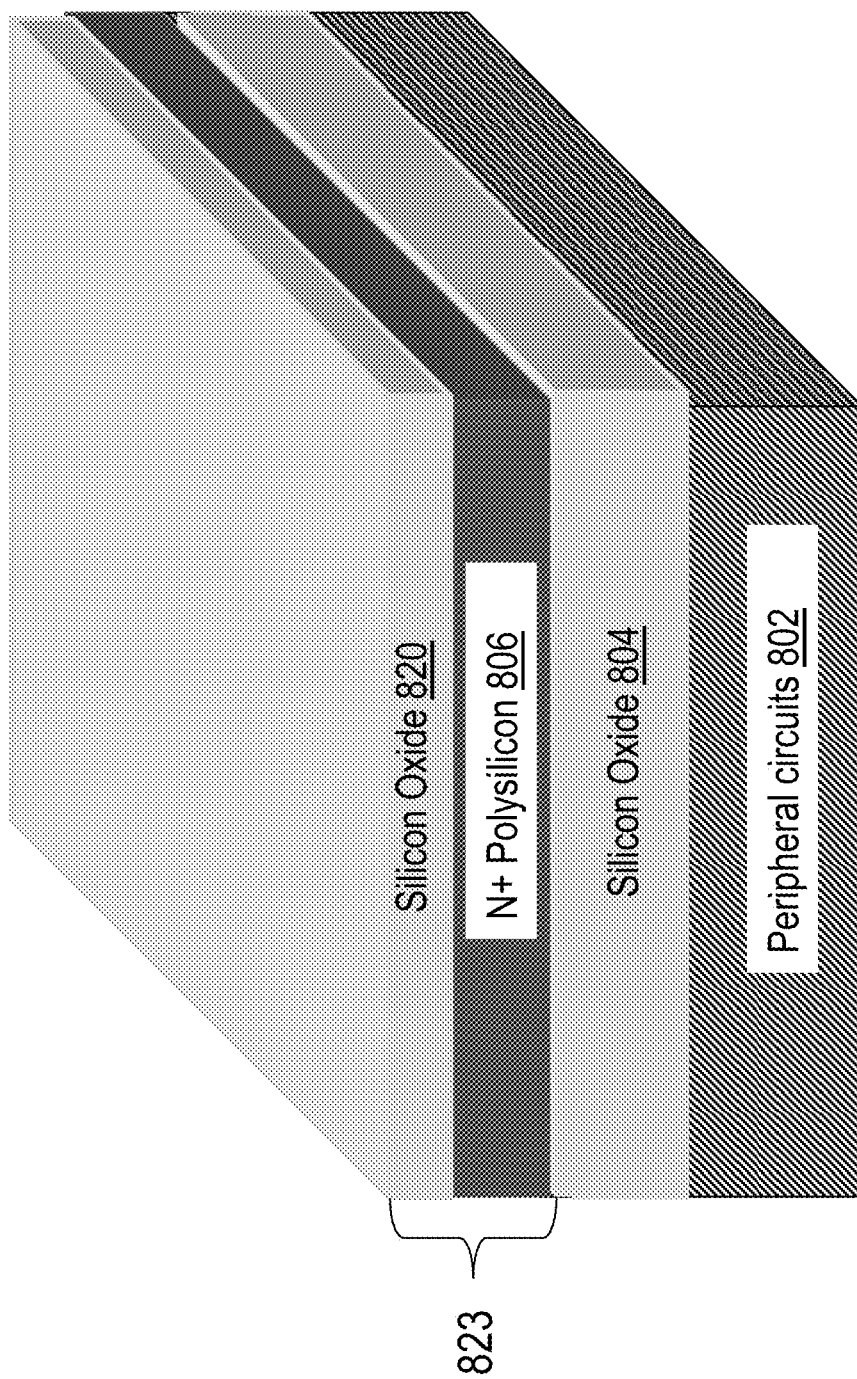

As illustrated in FIG. 8B, a layer of N+ doped poly-crystalline or amorphous silicon 806 may be deposited. The amorphous silicon or poly-crystalline silicon layer 806 may be deposited using a chemical vapor deposition process, such as, for example, LPCVD or PECVD, or other process methods, and may be deposited doped with N+ dopants, such as, for example, Arsenic or Phosphorous, or may be deposited un-doped and subsequently doped with, such as, for example, ion implantation or PLAD (PLasma Assisted Doping) techniques. Silicon Oxide 820 may then be deposited or grown. This now forms the first $Si/SiO_2$ layer 823 which includes N+ doped poly-crystalline or amorphous silicon layer 806 and silicon oxide layer 820.

Figure 8C:
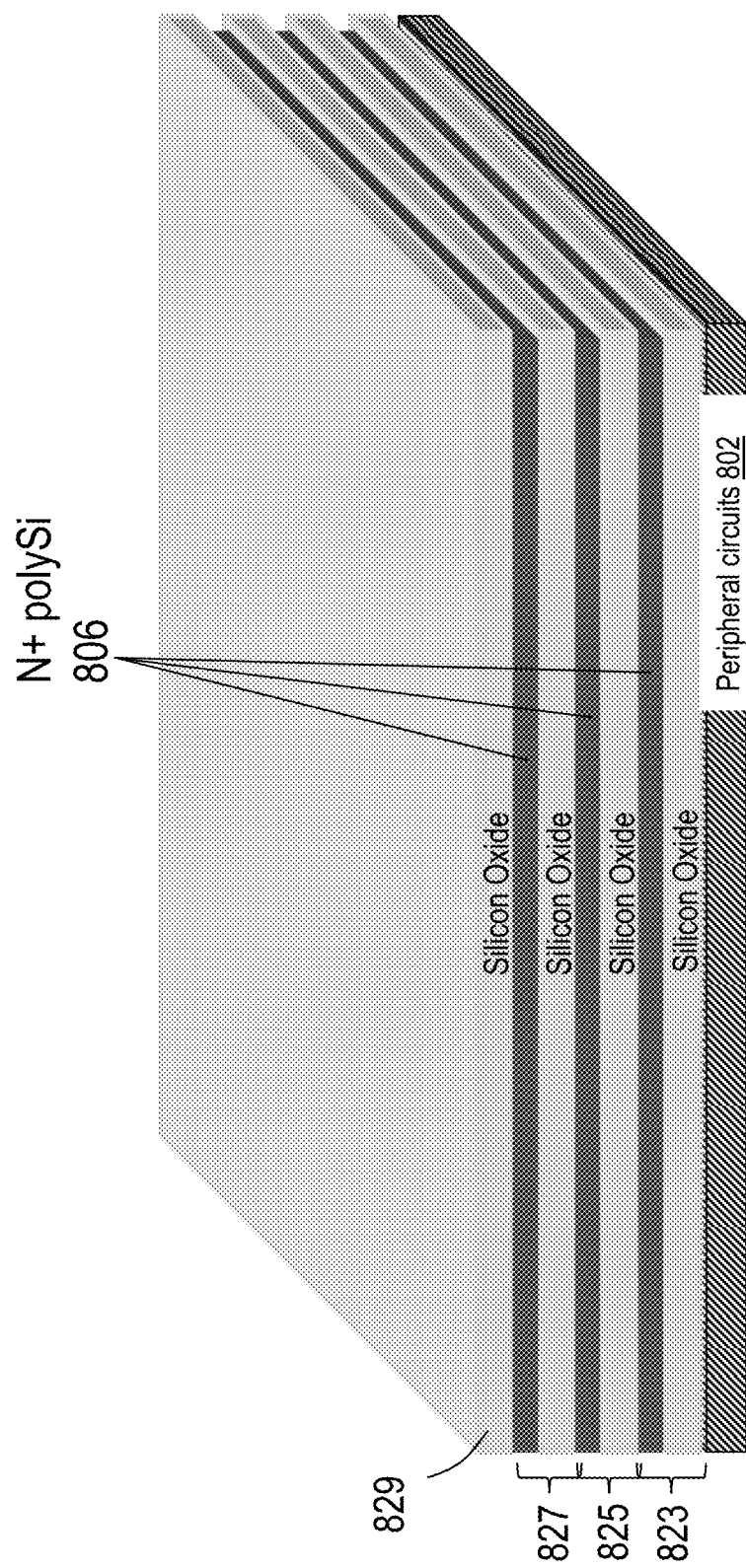

As illustrated in FIG. 8C, additional $Si/SiO_2$ layers, such as, for example, second $Si/SiO_2$ layer 825 and third $Si/SiO_2$ layer 827, may each be formed as described in FIG. 8B. Oxide layer 829 may be deposited to electrically isolate the top N+ doped poly-crystalline or amorphous silicon layer.

Figure 8D:
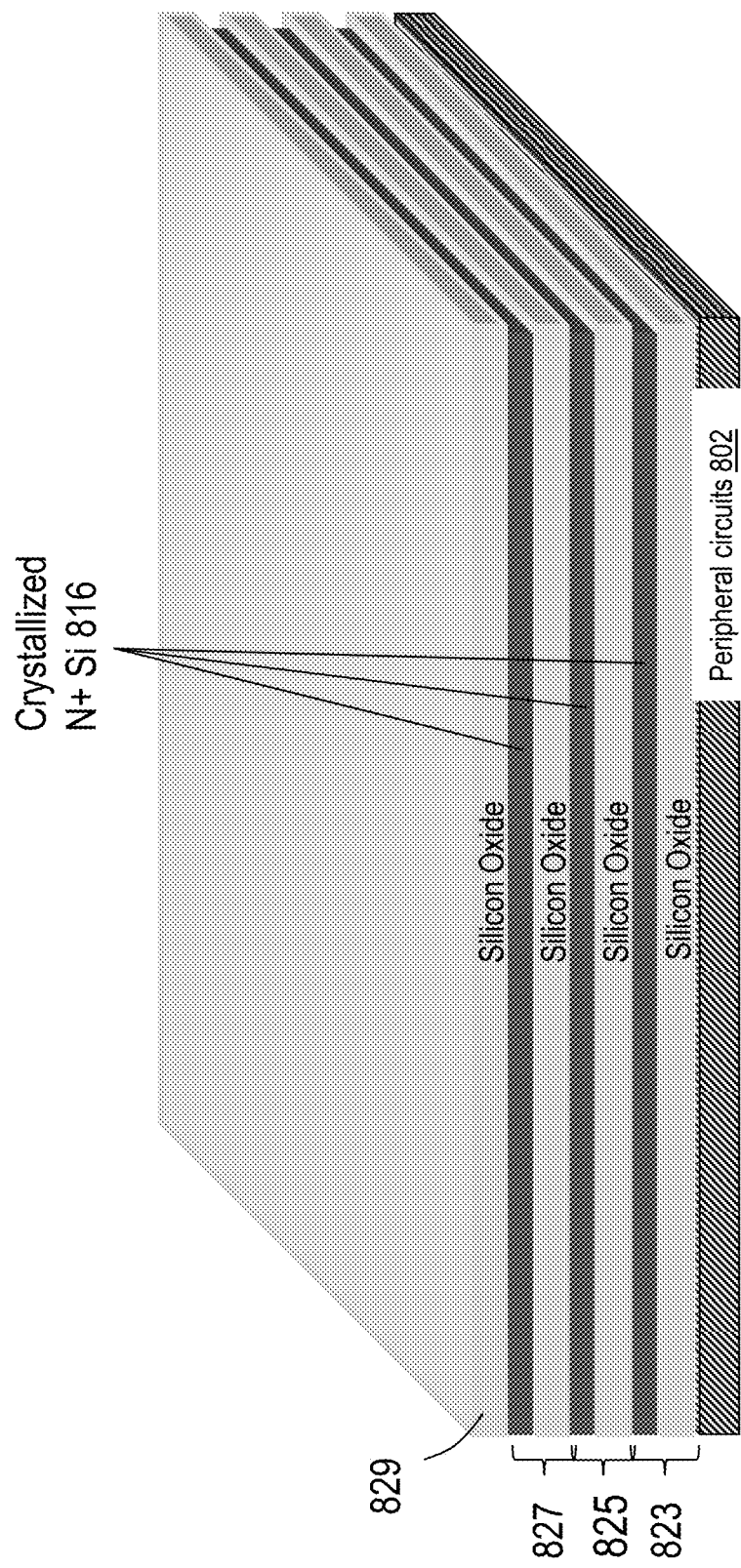

As illustrated in FIG. 8D, a Rapid Thermal Anneal (RTA) may be conducted to crystallize the N+ doped poly-crystalline silicon or amorphous silicon layers 806 of first $Si/SiO_2$ layer 823, second $Si/SiO_2$ layer 825, and third $Si/SiO_2$ layer 827, forming crystallized N+ silicon layers 816. Temperatures during this RTA may be as high as approximately 800° C. Alternatively, an optical anneal, such as, for example, a laser anneal, could be performed alone or in combination with the RTA or other annealing processes.

Figure 8E:
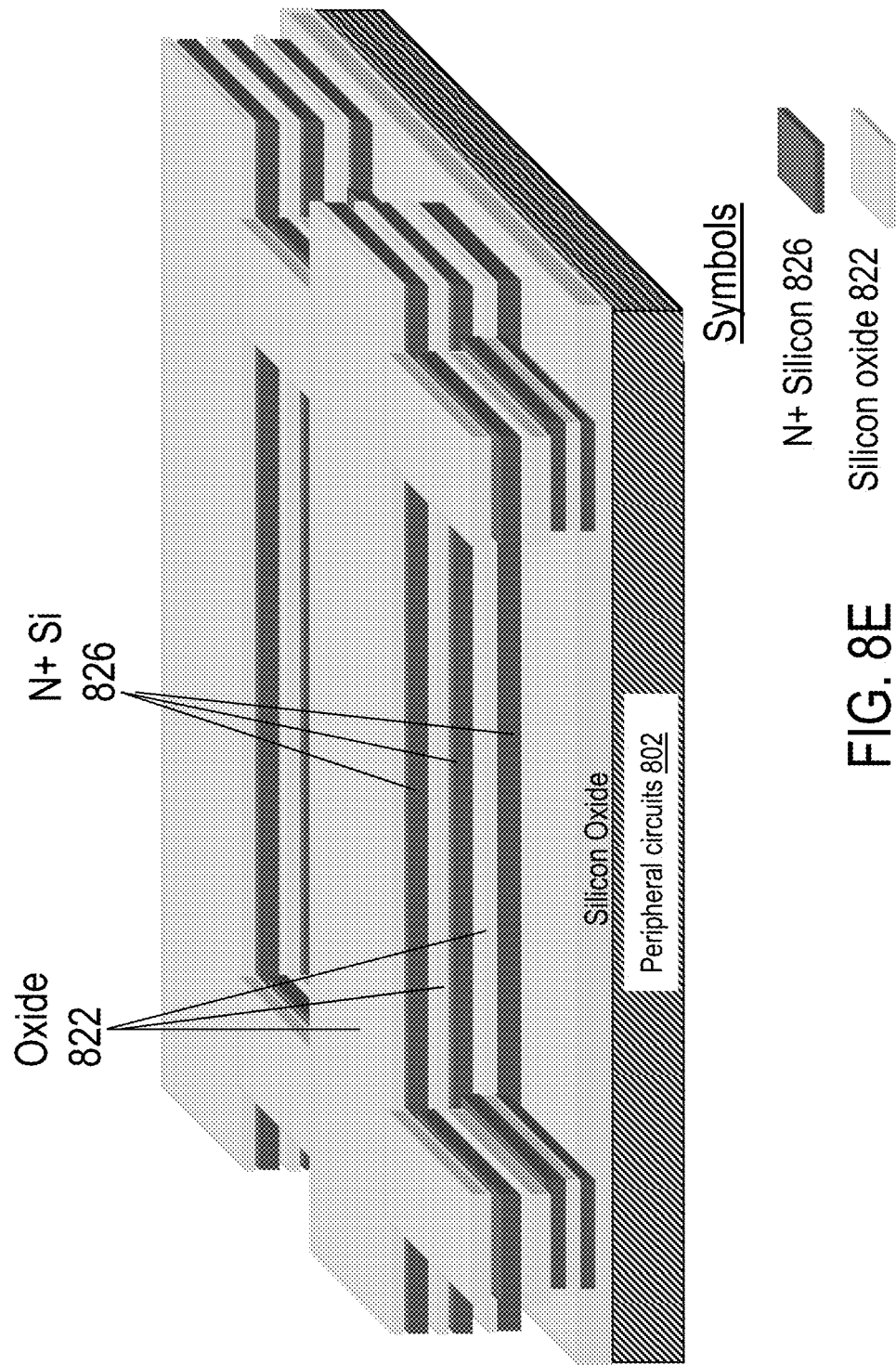

As illustrated in FIG. 8E, oxide layer 829, third $Si/SiO_2$ layer 827, second $Si/SiO_2$ layer 825 and first $Si/SiO_2$ layer 823 may be lithographically defined and plasma/RIE etched to form a portion of the memory cell structure, which now includes multiple layers of regions of crystallized N+ silicon 826 (previously crystallized N+ silicon layers 816) and oxide 822.

Figure 8F:
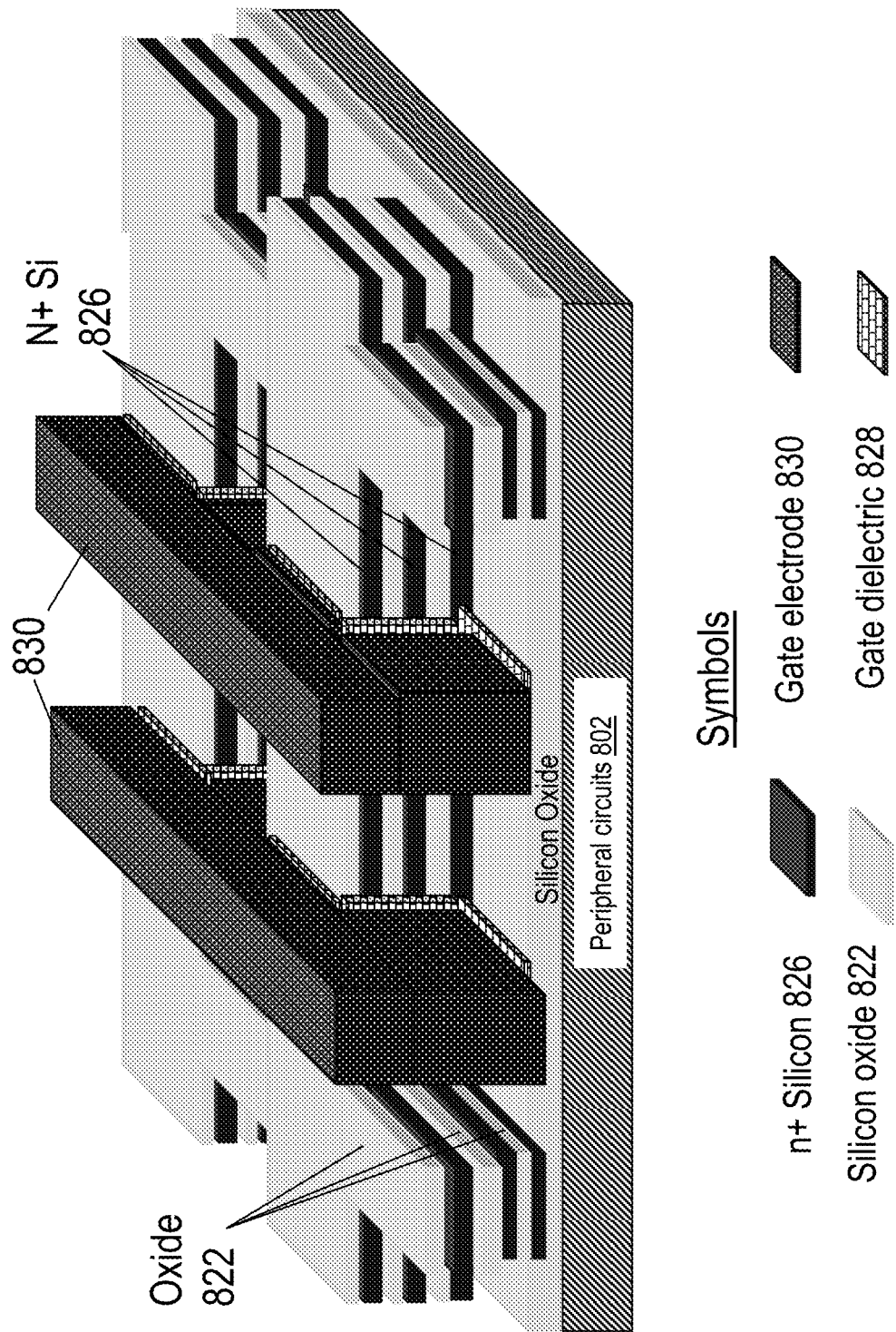

As illustrated in FIG. 8F, a gate dielectric and gate electrode material may be deposited, planarized with a chemical mechanical polish (CMP), and then lithographically defined and plasma/RIE etched to form gate dielectric regions 828 which may either be self-aligned to and substantially covered by gate electrodes 830 (shown), or substantially cover the entire crystallized N+ silicon regions 826 and oxide regions 822 multi-layer structure. The gate stack may include gate electrodes 830 and gate dielectric regions 828, and may be formed with a gate dielectric, such as, for example, thermal oxide, and a gate electrode material, such as, for example, poly-crystalline silicon. Alternatively, the gate dielectric may be an atomic layer deposited (ALD) material that may be paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 8G:
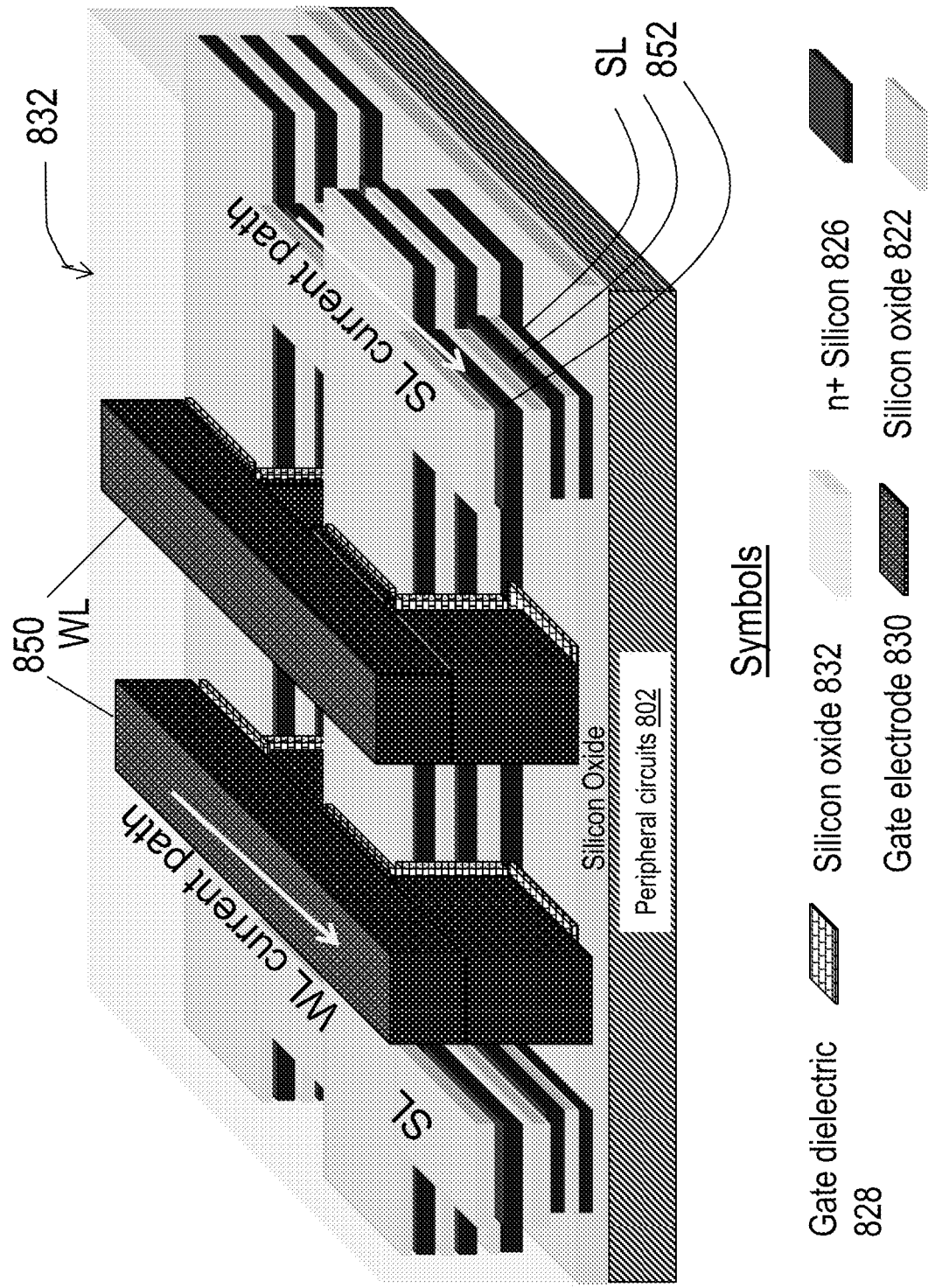

As illustrated in FIG. 8G, the entire structure may be substantially covered with a gap fill oxide 832, which may be planarized with chemical mechanical polishing. The oxide 832 is shown transparently in the figure for clarity. Word-line regions (WL) 850, coupled with and composed of gate electrodes 830, and source-line regions (SL) 852, composed of crystallized N+ silicon regions 826, are shown.

Figure 8H:
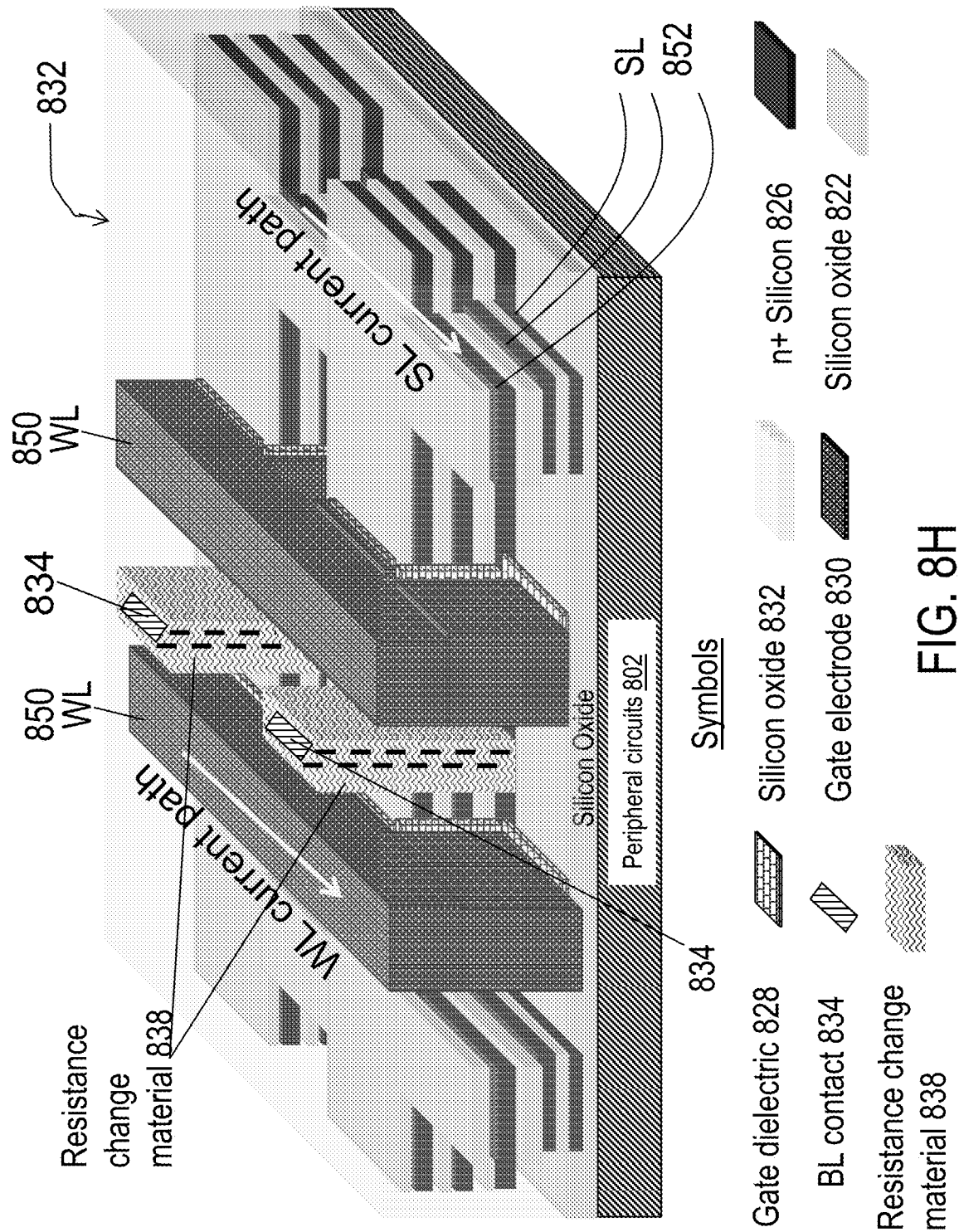

As illustrated in FIG. 8H, bit-line (BL) contacts 834 may be lithographically defined, etched with plasma/RIE through oxide 832, the three crystallized N+ silicon regions 826, and associated oxide vertical isolation regions to connect substantially all memory layers vertically, and photoresist removed. Resistance change material 838, such as, for example, hafnium oxides or titanium oxides, may then be deposited, for example, with atomic layer deposition (ALD). The electrode for the resistance change memory element may then be deposited by ALD to form the electrode/BL contact 834. The excess deposited material may be polished to planarity at or below the top of oxide 832.

Each BL contact 834 with resistive change material 838 may be shared among substantially all layers of memory, shown as three layers of memory in FIG. 8H.

Figure 8I:
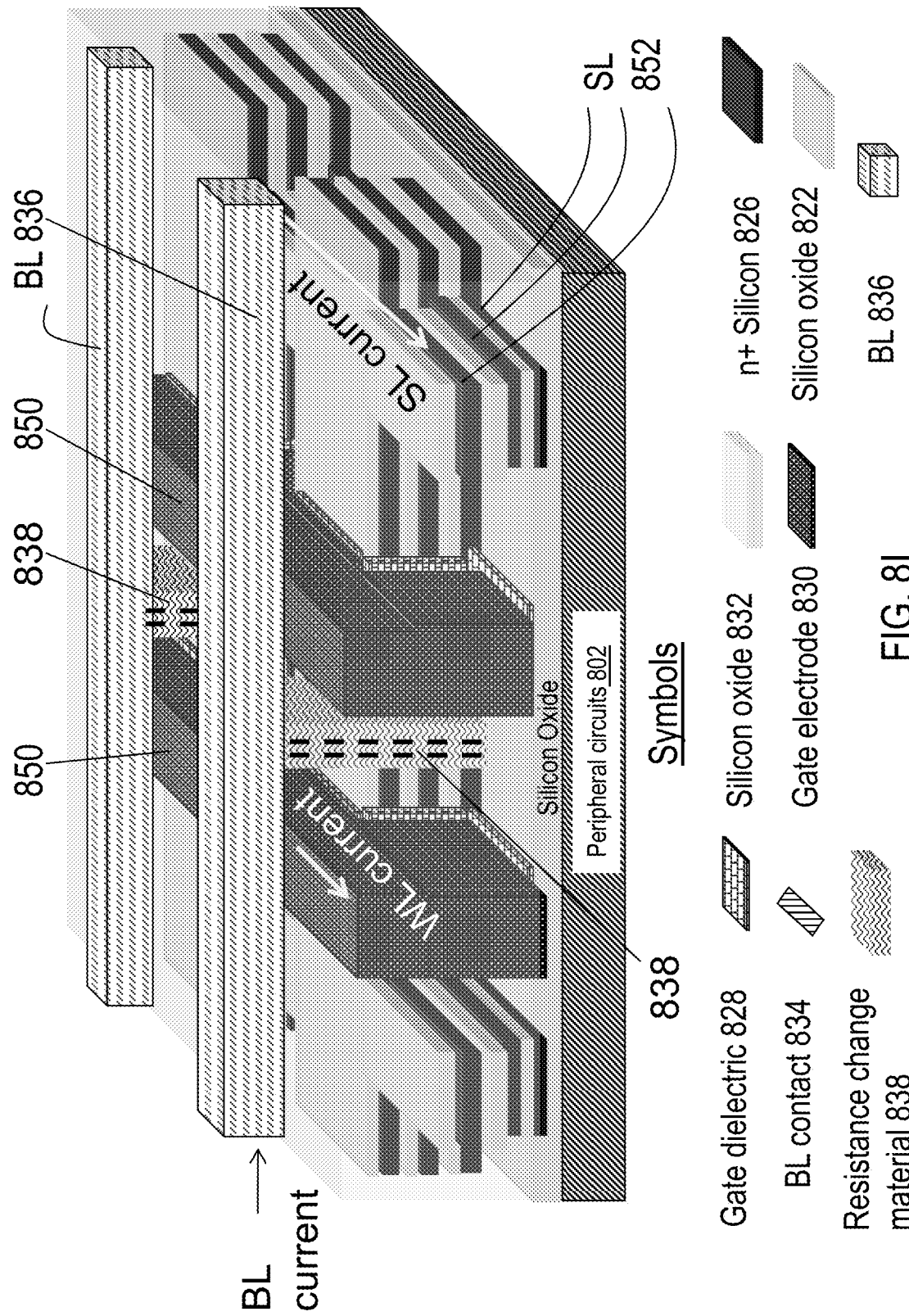

As illustrated in FIG. 8I, BL metal lines 836 may be formed and connect to the associated BL contacts 834 with resistive change material 838. Contacts and associated metal interconnect lines (not shown) may be formed for the WL and SL at the memory array edges. Thru layer vias (not shown) may be formed to electrically couple the BL, SL, and WL metallization to the acceptor substrate peripheral circuitry via acceptor wafer metal connect pads (not shown).

Figure 8J:
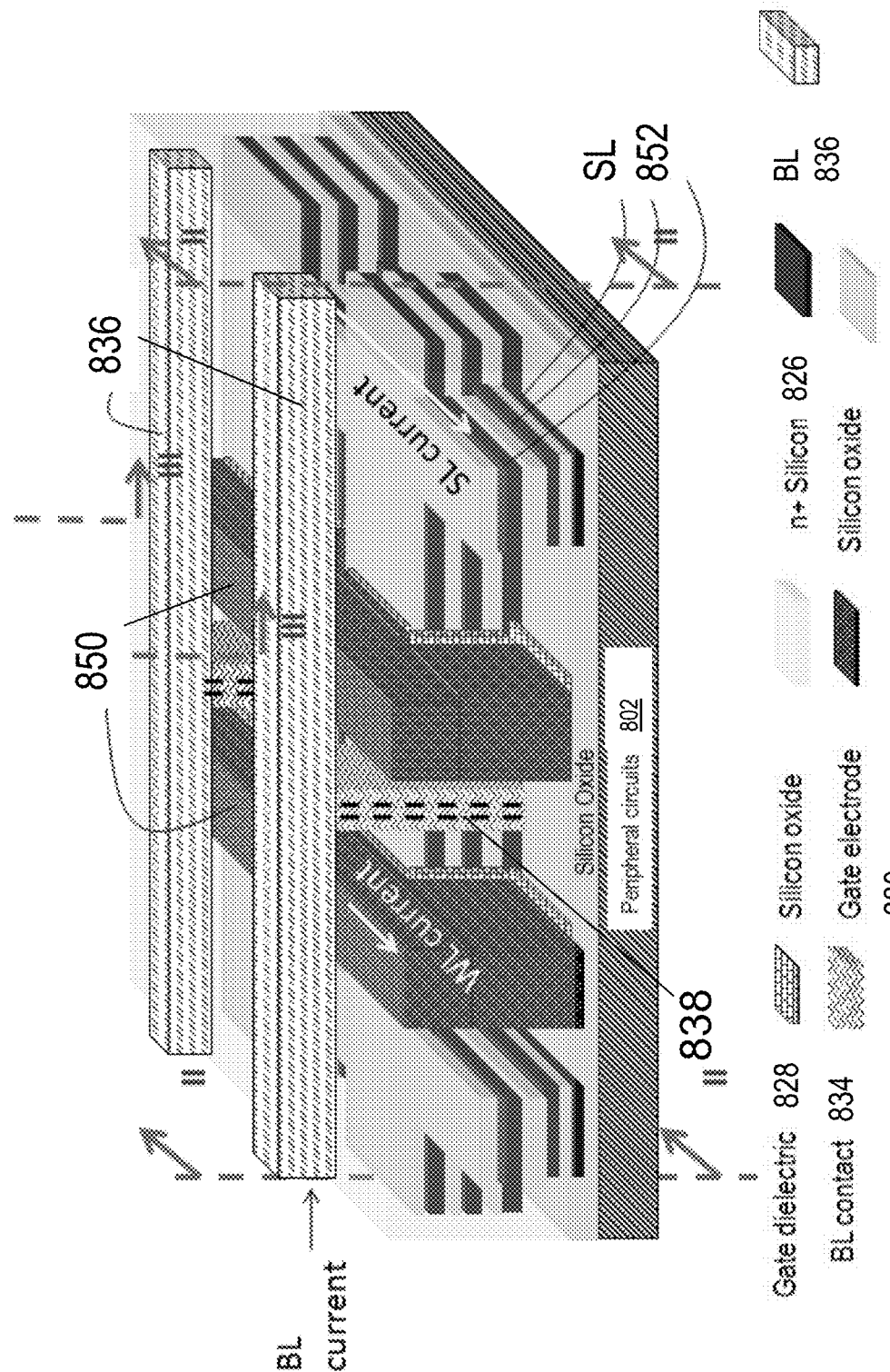

As illustrated in FIGS. 8J, 8J1 and 8J2, cross section cut II of FIG. 8J is shown in FIG. 8J1, and cross section cut III of FIG. 8J is shown in FIG. 8J2. BL metal line 836, oxide 832, BL contact/electrode 4934, resistive change material 838, WL regions 850, gate dielectric regions 828, crystallized N+ silicon regions 826, and peripheral circuitry substrate 802 are shown in FIG. 8J1. The BL contact/electrode 4934 couples to one side of the three levels of resistive change material 838. The other side of the resistive change material 838 may be coupled to crystallized N+ regions 826. BL metal lines 836, oxide 832, gate electrode 830, gate dielectric regions 828, crystallized N+ silicon regions 826, interlayer oxide region (ox'), and peripheral circuitry substrate 802 are shown in FIG. 8J2. The gate electrode 830 may be common to substantially all six crystallized N+ silicon regions 826 and forms six two-sided gated junction-less transistors as memory select transistors.

Figure 8K:
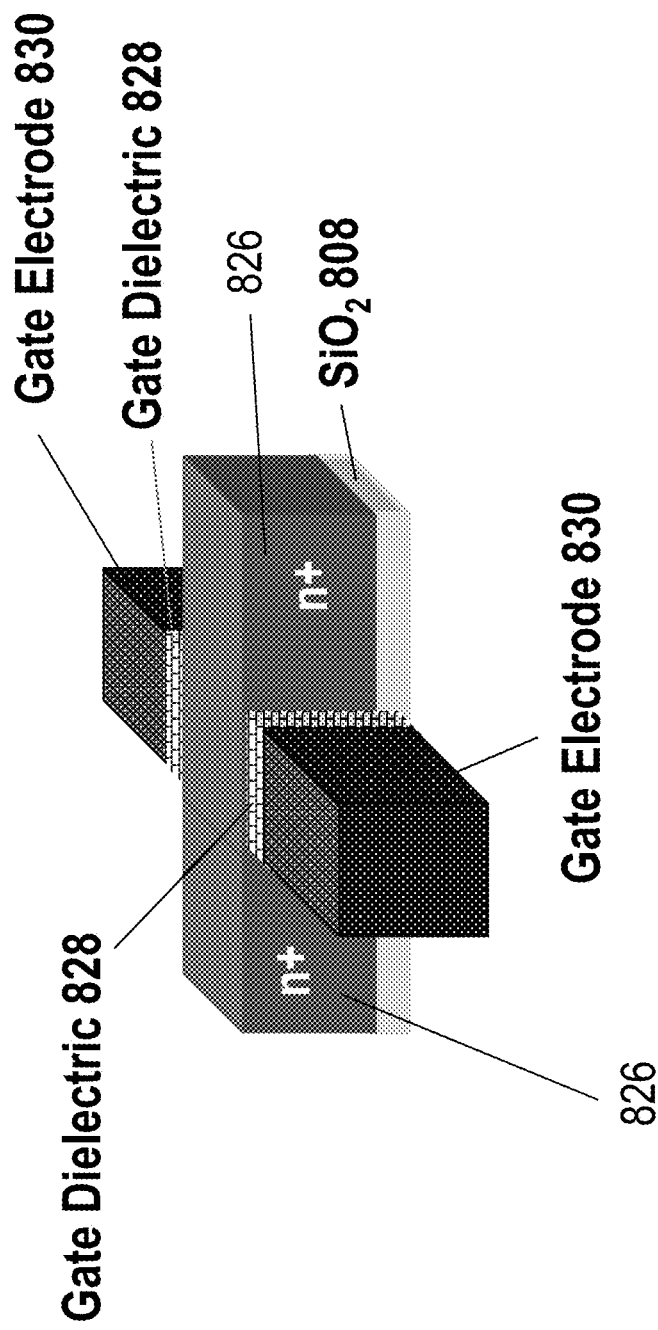

As illustrated in FIG. 8K, a single exemplary two-sided gated junction-less transistor on the first $Si/SiO_2$ layer 823 may include crystallized N+ silicon region 826 (functioning as the source, drain, and transistor channel), and two gate electrodes 830 with associated gate dielectric regions 828. The transistor may be electrically isolated from beneath by oxide layer 808.

This flow enables the formation of a resistance-based multi-layer or 3D memory array with zero additional masking steps per memory layer, which utilizes poly-crystalline silicon junction-less transistors and may have a resistance-based memory element in series with a select transistor, and may be constructed by layer transfers of wafer sized doped poly-crystalline silicon layers, and this 3D memory array may be connected to an underlying multi-metal layer semiconductor device.

Persons of ordinary skill in the art will appreciate that the illustrations in FIGS. 8A through 8K are exemplary only and are not drawn to scale. Such skilled persons will further appreciate that many variations are possible such as, for example, the RTAs and/or optical anneals of the N+ doped poly-crystalline or amorphous silicon layers 806 as described for FIG. 8D may be performed after each Si/SiO$_2$ layer is formed in FIG. 8C. Additionally, N+ doped poly-crystalline or amorphous silicon layers 806 may be doped P$^+$, or with a combination of dopants and other polysilicon network modifiers to enhance the RTA or optical annealing and subsequent crystallization and lower the N+ silicon layer 816 resistivity. Moreover, the doping of each crystallized N+ layer may be slightly different to compensate for interconnect resistances. Further, each gate of the double gated 3D resistance based memory may be independently controlled for increased control of the memory cell. Many other modifications within the scope of the invention will suggest themselves to such skilled persons after reading this specification. Thus the invention is to be limited only by the appended claims.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within these mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention.

In U.S. application Ser. No. 12/903,862, filed by some of the inventors and assigned to the same assignee, a 3D micro display and a 3D image sensor are presented. Integrating one or both of these with complex logic and or memory could be very effective for mobile system. Additionally, mobile systems could be customized to some specific market applications by integrating some embodiments of the invention.

Moreover, utilizing 3D programmable logic or 3D gate array as had been described in some embodiments of the invention could be very effective in forming flexible mobile systems.

The need to reduce power to allow effective use of limited battery energy and also the lightweight and small form factor derived by highly integrating functions with low waste of interconnect and substrate could be highly benefitted by the redundancy and repair idea of the 3D monolithic technology as has been presented in embodiments of the invention. This unique technology could enable a mobile device that would be lower cost to produce or would require lower power to operate or would provide a lower size or lighter carry weight, and combinations of these 3D monolithic technology features may provide a competitive or desirable mobile system.

Another unique market that may be addressed by some of the embodiments of the invention could be a street corner camera with supporting electronics. The 3D image sensor described in the Ser. No. 12/903,862 application would be very effective for day/night and multi-spectrum surveillance applications. The 3D image sensor could be supported by integrated logic and memory such as, for example, a monolithic 3D IC with a combination of image processing and image compression logic and memory, both high speed memory such as 3D DRAM and high density non-volatile memory such as 3D NAND or RRAM or other memory, and other combinations. This street corner camera application would require low power, low cost, and low size or any combination of these features, and could be highly benefitted from the 3D technologies described herein.

3D ICs according to some embodiments of the invention could enable electronic and semiconductor devices with much a higher performance as a result from the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These potential advantages could lead to more powerful computer systems and improved systems that have embedded computers.

Some embodiments of the invention may enable the design of state of the art electronic systems at a greatly reduced non-recurring engineering (NRE) cost by the use of high density 3D FPGAs or various forms of 3D array based ICs with reduced custom masks as described herein. These systems could be deployed in many products and in many market segments. Reduction of the NRE may enable new product family or application development and deployment early in the product lifecycle by lowering the risk of upfront investment prior to a market being developed. The above potential advantages may also be provided by various mixes such as reduced NRE using generic masks for layers of logic and other generic masks for layers of memories and building a very complex system using the repair technology to overcome the inherent yield difficulties. Another form of mix could be building a 3D FPGA and add on it 3D layers of customizable logic and memory so the end system could have field programmable logic on top of the factory customized logic. There may be many ways to mix the many innovative elements to form 3D IC to support the needs of an end system, including using multiple devices wherein more than one device incorporates elements of embodiments of the invention. An end system could benefit from a memory devices utilizing the 3D memory of some embodiments of the invention together with high performance 3D FPGA of some of the embodiments of the invention together with high density 3D logic and so forth. Using devices that can use one or multiple elements according to some embodiments of the invention may allow for increased performance or lower power and other potential advantages resulting from the use of some embodiments of the inventions to provide the end system with a competitive edge. Such end system could be electronic based products or other types of systems that may include some level of embedded electronics, such as, for example, cars and remote controlled vehicles.

Commercial wireless mobile communications have been developed for almost thirty years, and play a special role in today's information and communication technology Industries. The mobile wireless terminal device has become part of our life, as well as the Internet, and the mobile wireless terminal device may continue to have a more important role on a worldwide basis. Currently, mobile (wireless) phones are undergoing much development to provide advanced functionality. The mobile phone network is a network such as a GSM, GPRS, or WCDMA, 3G and 4G standards, and the network may allow mobile phones to communicate with each other. The base station may be for transmitting (and receiving) information to the mobile phone.

A typical mobile phone system may include, for example, a processor, a flash memory, a static random access memory, a display, a removable memory, a radio frequency (RF) receiver/transmitter, an analog base band (ABB), a digital base band (DBB), an image sensor, a high-speed bi-directional interface, a keypad, a microphone, and a speaker. A typical mobile phone system may include a multiplicity of an element, for example, two or more static random access memories, two or more displays, two or more RF receiver/transmitters, and so on.

Conventional radios used in wireless communications, such as radios used in conventional cellular telephones, typically may include several discrete RF circuit components. Some receiver architectures may employ superheterodyne techniques. In a superhetrodyne architecture an incoming signal may be frequency translated from its radio frequency (RF) to a lower intermediate frequency (IF). The signal at IF may be subsequently translated to baseband where further digital signal processing or demodulation may take place. Receiver designs may have multiple IF stages. The reason for using such a frequency translation scheme is that circuit design at the lower IF frequency may be more manageable for signal processing. It is at these IF frequencies that the selectivity of the receiver may be implemented, automatic gain control (AGC) may be introduced, etc.

A mobile phone's need of a high-speed data communication capability in addition to a speech communication capability has increased in recent years. In GSM (Global System for Mobile communications), one of European Mobile Communications Standards, GPRS (General Packet Radio Service) has been developed for speeding up data communication by allowing a plurality of time slot transmissions for one time slot transmission in the GSM with the multiplexing TDMA (Time Division Multiple Access) architecture. EDGE (Enhanced Data for GSM Evolution) architecture provides faster communications over GPRS.

4th Generation (4G) mobile systems aim to provide broadband wireless access with nominal data rates of 100 Mbit/s. 4G systems may be based on the 3GPP LTE (Long Term Evolution) cellular standard, WiMax or Flash-OFDM wireless metropolitan area network technologies. The radio interface in these systems may be based on all-IP packet switching, MIMO diversity, multi-carrier modulation schemes, Dynamic Channel Assignment (DCA) and channel-dependent scheduling.

Prior art such as U.S. application Ser. No. 12/871,984 may provide a description of a mobile device and its block-diagram.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. For example, as utilized herein, the following terms are generally defined:

(1) Mobile computing/communication device (MCD): is a device that may be a mobile communication device, such as a cell phone, or a mobile computer that performs wired and/or wireless communication via a connected wireless/wired network. In some embodiments, the MCD may include a combination of the functionality associated with both types of devices within a single standard device (e.g., a smart phones or personal digital assistant (PDA)) for use as both a communication device and a computing device.

Figure 9:
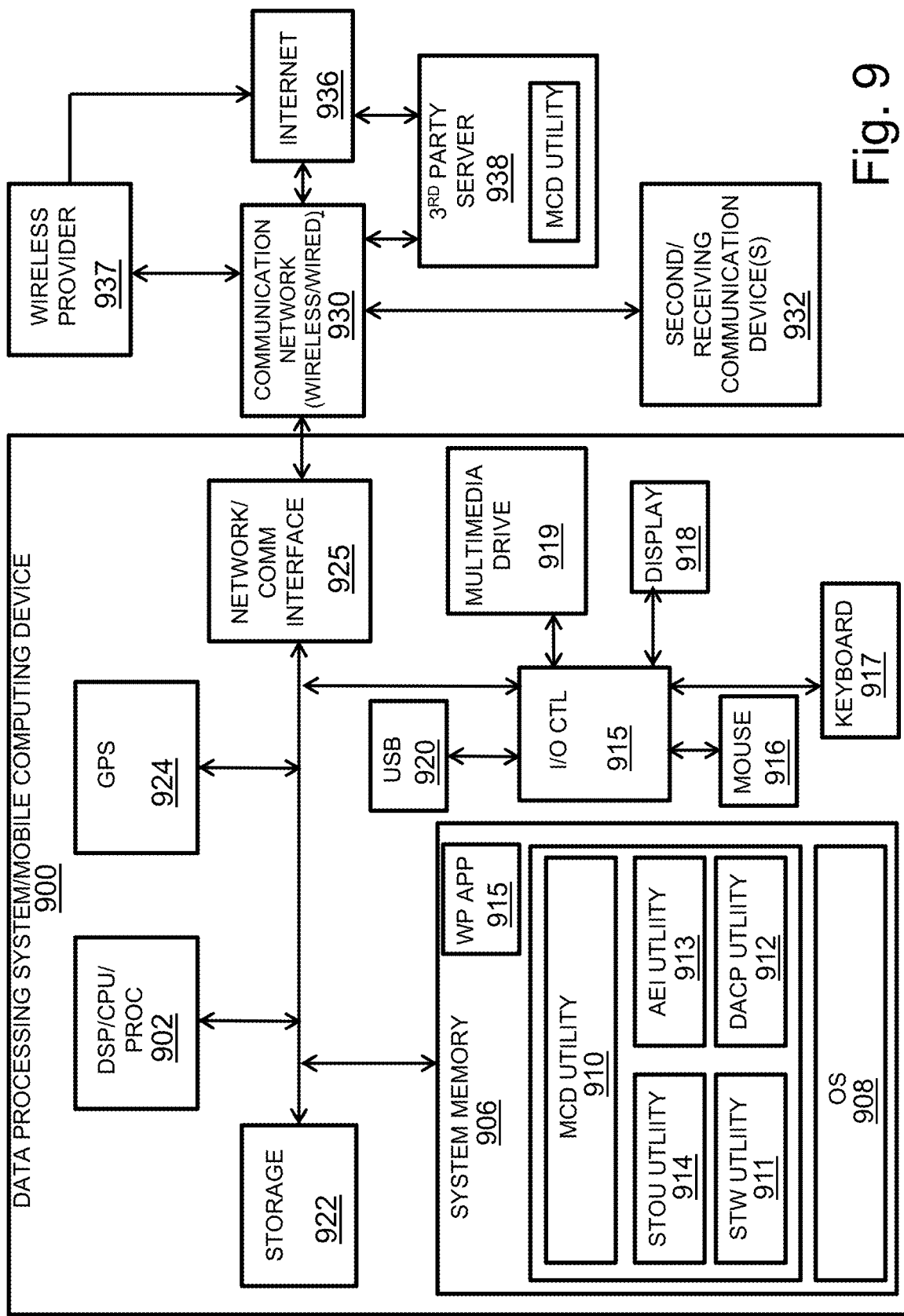
FIG. 9 is a block diagram representation of an exemplary mobile computing device (MCD)

A block diagram representation of an exemplary mobile computing device (MCD) is illustrated in FIG. 9, within which several of the features of the described embodiments may be implemented. MCD 900 may be a desktop computer, a portable computing device, such as a laptop, personal digital assistant (PDA), a smart phone, and/or other types of electronic devices that may generally be considered processing devices. As illustrated, MCD 900 may include at least one processor or central processing unit (CPU) 902 which may be connected to system memory 906 via system interconnect/bus 904. CPU 902 may include at least one digital signal processing unit (DSP). Also connected to system interconnect/bus 904 may be input/output (I/O) controller 915, which may provide connectivity and control for input devices, of which pointing device (or mouse) 916 and keyboard 917 are illustrated. I/O controller 915 may also provide connectivity and control for output devices, of which display 918 is illustrated. Additionally, a multimedia drive 919 (e.g., compact disk read/write (CDRW) or digital video disk (DVD) drive) and USB (universal serial bus) port 920 are illustrated, and may be coupled to I/O controller 915. Multimedia drive 919 and USB port 920 may enable insertion of a removable storage device (e.g., optical disk or "thumb" drive) on which data/instructions/code may be stored and/or from which data/instructions/code may be retrieved. MCD 900 may also include storage 922, within/from which data/instructions/code may also be stored/retrieved. MCD 900 may further include a global positioning system (GPS) or local position system (LPS) detection component 924 by which MCD 900 may be able to detect its current location (e.g., a geographical position) and movement of MCD 900, in real time. MCD 900 may include a network/communication interface 925, by which MCD 900 may connect to one or more second communication devices 932 or to wireless service provider server 937, or to a third party server 938 via one or more access/external communication networks, of which a wireless Communication Network 930 is provided as one example and the Internet 936 is provided as a second example. It is appreciated that MCD 900 may connect to third party server 938 through an initial connection with Communication Network 930, which in turn may connect to third party server 938 via the Internet 936.

In addition to the above described hardware components of MCD 900, various features of the described embodiments may be completed/supported via software (or firmware) code or logic stored within system memory 906 or other storage (e.g., storage 922) and may be executed by CPU 902. Thus, for example, illustrated within system memory 906 are a number of software/firmware/logic components, including operating system (OS) 908 (e.g., Microsoft Windows® or Windows Mobile®, trademarks of Microsoft Corp, or GNU®/Linux®, registered trademarks of the Free Software Foundation and The Linux Mark Institute, and AIX®, registered trademark of International Business Machines), and (word processing and/or other) application(s) 909. Also illustrated are a plurality (four illustrated) software implemented utilities, each providing different one of the various functions (or advanced features) described herein. Including within these various functional utilities are: Simultaneous Text Waiting (STW) utility 911, Dynamic Area Code Pre-pending (DACP) utility 912, Advanced Editing and Interfacing (AEI) utility 912 and Safe Texting Device Usage (STDU) utility 914. In actual implementation and for simplicity in the following descriptions, each of these different functional utilities are assumed to be packaged together as sub-components of a general MCD utility 910, and the various utilities are interchangeably referred to as MCD utility 910 when describing the utilities within the figures and claims. For simplicity, the following description will refer to a single utility, namely MCD utility 910. MCD utility 910 may, in some embodiments, be combined with one or more other software modules, including for example, word processing application(s) 909 and/or OS 908 to provide a single executable component, which then may provide the collective functions of each individual software component when the corresponding combined code of the single executable component is executed by CPU 902. Each separate utility 111/112/113/114 is illustrated and described as a standalone or separate software/firmware component/module, which provides specific functions, as described below. As a standalone component/module, MCD utility 910 may be acquired as an off-the-shelf or aftermarket or downloadable enhancement to existing program applications or device functions, such as voice call waiting functionality (not shown) and user interactive applications with editable content, such as, for example, an application within the Windows Mobile® suite of applications. In at least one implementation, MCD utility 910 may be downloaded from a server or website of a wireless provider (e.g., wireless service provider server 937) or a third party server 938, and either installed on MCD 900 or executed from the wireless service provider server 937 or third party server 913.

CPU 902 may execute MCD utility 910 as well as OS 908, which, in one embodiment, may support the user interface features of MCD utility 910, such as generation of a graphical user interface (GUI), where required/supported within MCD utility code. In several of the described embodiments, MCD utility 910 may generate/provide one or more GUIs to enable user interaction with, or manipulation of, functional features of MCD utility 910 and/or of MCD 900. MCD utility 910 may, in certain embodiments, enable certain hardware and firmware functions and may thus be generally referred to as MCD logic.

Some of the functions supported and/or provided by MCD utility 910 may be enabled as processing code/instructions/logic executing on DSP/CPU 902 and/or other device hardware, and the processor thus may complete the implementation of those function(s). Among, for example, the software code/instructions/logic provided by MCD utility 910, and which are specific to some of the described embodiments of the invention, may be code/logic for performing several (one or a plurality) of the following functions: (1) Simultaneous texting during ongoing voice communication providing a text waiting mode for both single number mobile communication devices and multiple number mobile communication devices; (2) Dynamic area code determination and automatic back-filling of area codes when a requested/desired voice or text communication is initiated without the area code while the mobile communication device is outside of its home-base area code toll area; (3) Enhanced editing functionality for applications on mobile computing devices; (4) Automatic toggle from manual texting mode to voice-to-text based communication mode on detection of high velocity movement of the mobile communication device; and (5) Enhanced e-mail notification system providing advanced e-mail notification via (sender or recipient directed) texting to a mobile communication device.

Utilizing monolithic 3D IC technology described herein and in related application Ser. Nos. 12/903,862, 12/903,847, 12/904,103 and 13/041,405 significant power and cost could be saved. Most of the elements in MCD 900 could be integrated in one 3D IC. Some of the MCD 900 elements may be logic functions which could utilize monolithic 3D transistors such as, for example, RCAT or Gate-Last. Some of the MCD 900 elements are storage devices and could be integrated on a 3D non-volatile memory device, such as, for example, 3D NAND or 3D RRAM, or volatile memory such as, for example, 3D DRAM or SRAM formed from RCAT or gate-last transistors, as been described herein. Storage 922 elements formed in monolithic 3D could be integrated on top or under a logic layer to reduce power and space. Keyboard 917 could be integrated as a touch screen or combination of image sensor and some light projection and could utilize structures described in some of the above mentioned related applications. The network/communication interface 925 could utilize another layer of silicon optimized for RF and gigahertz speed analog circuits or even may be integrated on substrates, such as GaN, that may be a better fit for such circuits. As more and more transistors might be integrated to achieve a high complexity 3D IC system there might be a need to use some embodiments of the invention such as what were called repair and redundancy so to achieve good product yield.

Some of the system elements including non-mobile elements, such as the 3rd Party Server 938, might also make use of some embodiments of the 3D IC inventions including repair and redundancy to achieve good product yield for high complexity and large integration. Such large integration may reduce power and cost of the end product which is most attractive and most desired by the system end-use customers.

Some embodiments of the 3D IC invention could be used to integrate many of the MCD 900 blocks or elements into one or a few devices. As various blocks get tightly integrated, much of the power required to transfer signals between these elements may be reduced and similarly costs associated with these connections may be saved. Form factor may be compacted as the space associated with the individual substrate and the associated connections may be reduced by use of some embodiments of the 3D IC invention. For mobile device these may be very important competitive advantages. Some of these blocks might be better processed in different process flow or wafer fab location. For example the DSP/CPU 902 is a logic function that might use a logic process flow while the storage 922 might better be done using a NAND Flash technology process flow or wafer fab. An important advantage of some of the embodiments of the monolithic 3D inventions may be to allow some of the layers in the 3D structure to be processed using a logic process flow while another layer in the 3D structure might utilize a memory process flow, and then some other function the modems of the GPS or local position system (LPS) detection component 924 might use a high speed analog process flow or wafer fab. As those diverse functions may be structured in one device onto many different layers, these diverse functions could be very effectively and densely vertically interconnected.

Charge trap NAND (Negated AND) memory devices are another form of popular commercial non-volatile memories. Charge trap device store their charge in a charge trap layer, wherein this charge trap layer then influences the channel of a transistor. Background information on charge-trap memory can be found in "*Integrated Interconnect Technologies for 3D Nanoelectronic Systems*", Artech House, 2009 by Bakir and Meindl ("Bakir"), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al., and "Introduction to Flash memory", Proc. IEEE91, 489-502 (2003) by R. Bez, et al. Work described in Bakir utilized selective epitaxy, laser recrystallization, or polysilicon to form the transistor channel, which results in less than satisfactory transistor performance. The architectures shown in FIGS. 10A-10G may be relevant for any type of charge-trap memory.

As illustrated in FIGS. 10A to 10G, a charge trap based 3D memory with zero additional masking steps per memory layer 3D memory may be constructed that may be suitable for 3D IC manufacturing. This 3D memory utilizes NAND strings of charge trap junction-less transistors with junction-less select transistors constructed in mono-crystalline silicon.

Figure 10A:
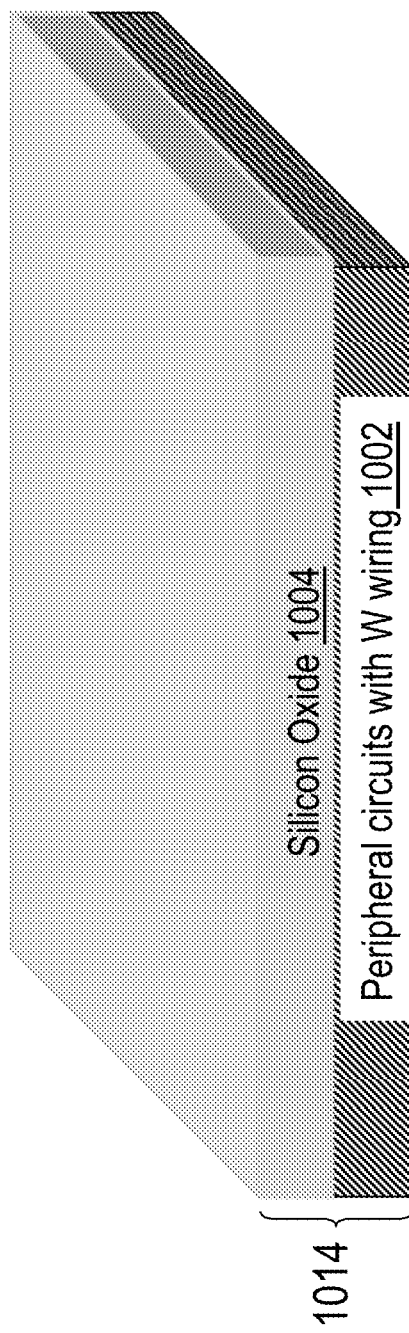
FIGS. 10A-10G are exemplary drawing illustrations of the formation of a charge trap memory transistor, array and device.

As illustrated in FIG. 10A, a silicon substrate with peripheral circuitry 1002 may be constructed with high temperature (greater than approximately 400° C.) resistant wiring, such as, for example, Tungsten. The peripheral circuitry substrate 1002 may include memory control circuits as well as circuitry for other purposes and of various types, such as, for example, analog, digital, RF, or memory. The peripheral circuitry substrate 1002 may include peripheral circuits that can withstand an additional rapid-thermal-anneal (RTA) and still remain operational and retain good performance. For this purpose, the peripheral circuits may be formed such that they have not been subjected to a weak RTA or no RTA for activating dopants in anticipation of anneals later in the process flow. The top surface of the peripheral circuitry substrate 1002 may be prepared for oxide wafer bonding with a deposition of a silicon oxide layer 1004, thus forming acceptor wafer 1014.

Figure 10B:
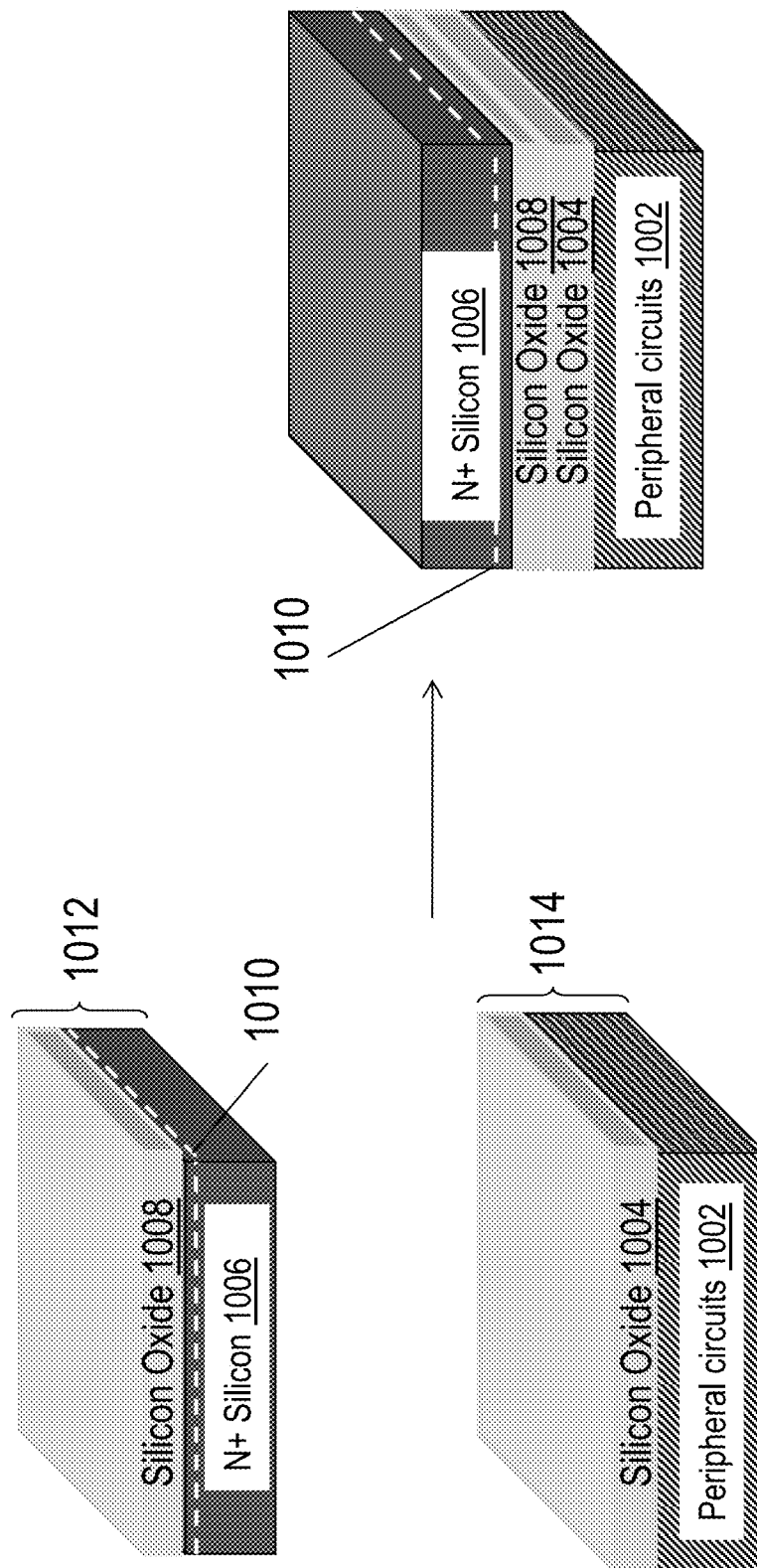

As illustrated in FIG. 10B, a mono-crystalline silicon donor wafer 1012 may be processed to include a wafer sized layer of N+ doping (not shown) which may have a different dopant concentration than the N+ substrate 1006. The N+ doping layer may be formed by ion implantation and thermal anneal. A screen oxide layer 1008 may be grown or deposited prior to the implant to protect the silicon from implant contamination and to provide an oxide surface for later wafer to wafer bonding. A layer transfer demarcation plane 1010 (shown as a dashed line) may be formed in donor wafer 1012 within the N+ substrate 1006 or the N+ doping layer (not shown) by hydrogen implantation or other methods as previously described. Both the donor wafer 1012 and acceptor wafer 1014 may be prepared for wafer bonding as previously described and then bonded at the surfaces of oxide layer 1004 and oxide layer 1008, for example, at a low temperature (less than approximately 400° C.) for lowest stresses, or a moderate temperature (less than approximately 900° C.).

Figure 10C:
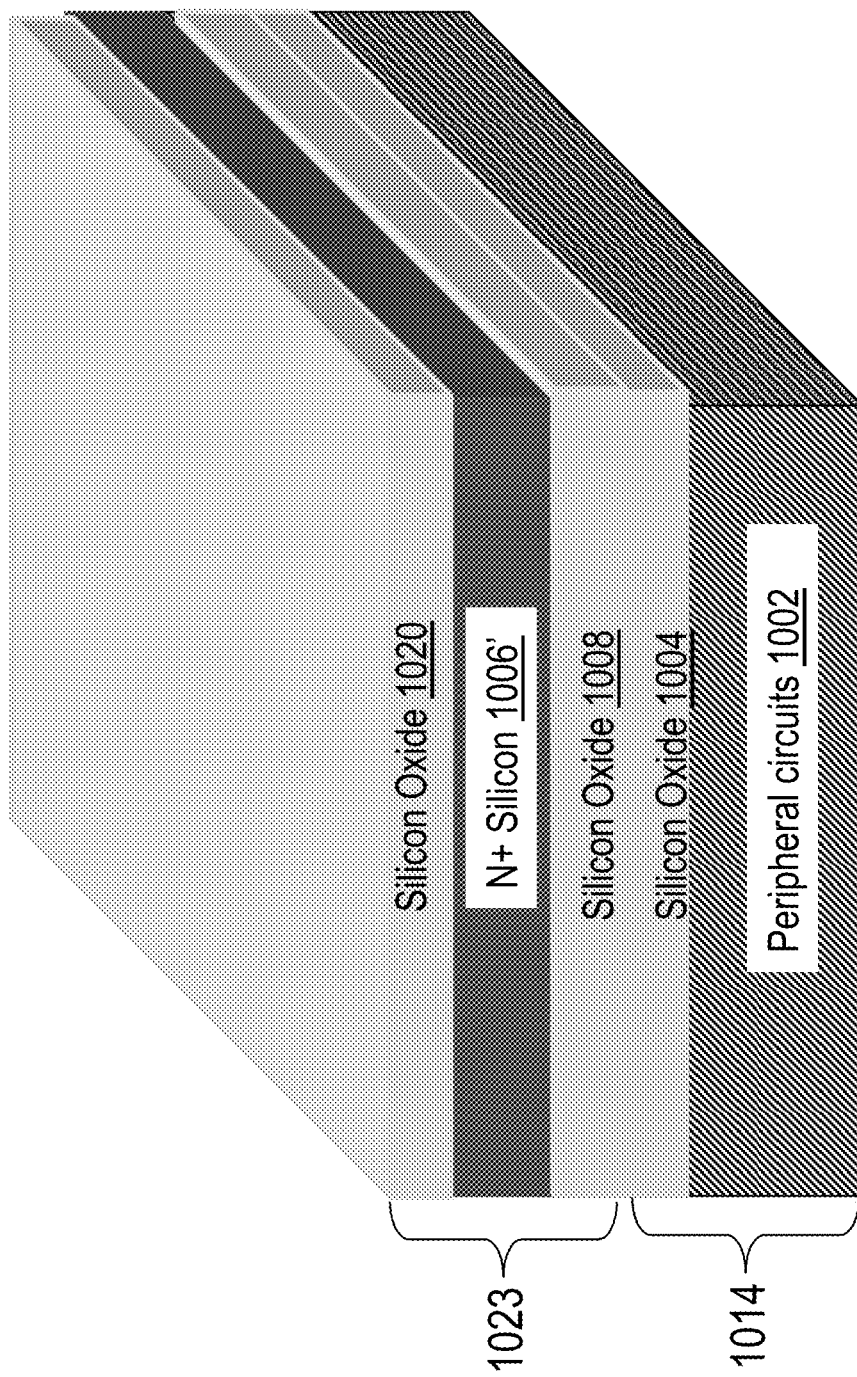

As illustrated in FIG. 10C, the portion of the N+ layer (not shown) and the N+ wafer substrate 1006 that may be above the layer transfer demarcation plane 1010 may be removed by cleaving and polishing, or other processes as previously described, such as, for example, ion-cut or other methods, thus forming the remaining mono-crystalline silicon N+ layer 1006'. Remaining N+ layer 1006' and oxide layer 1008 have been layer transferred to acceptor wafer 1014. The top surface of N+ layer 1006' may be chemically or mechanically polished smooth and flat. Oxide layer 1020 may be deposited to prepare the surface for later oxide to oxide bonding. This now forms the first Si/SiO$_2$ layer 1023 which includes silicon oxide layer 1020, N+ silicon layer 1006', and oxide layer 1008.

Figure 10D:
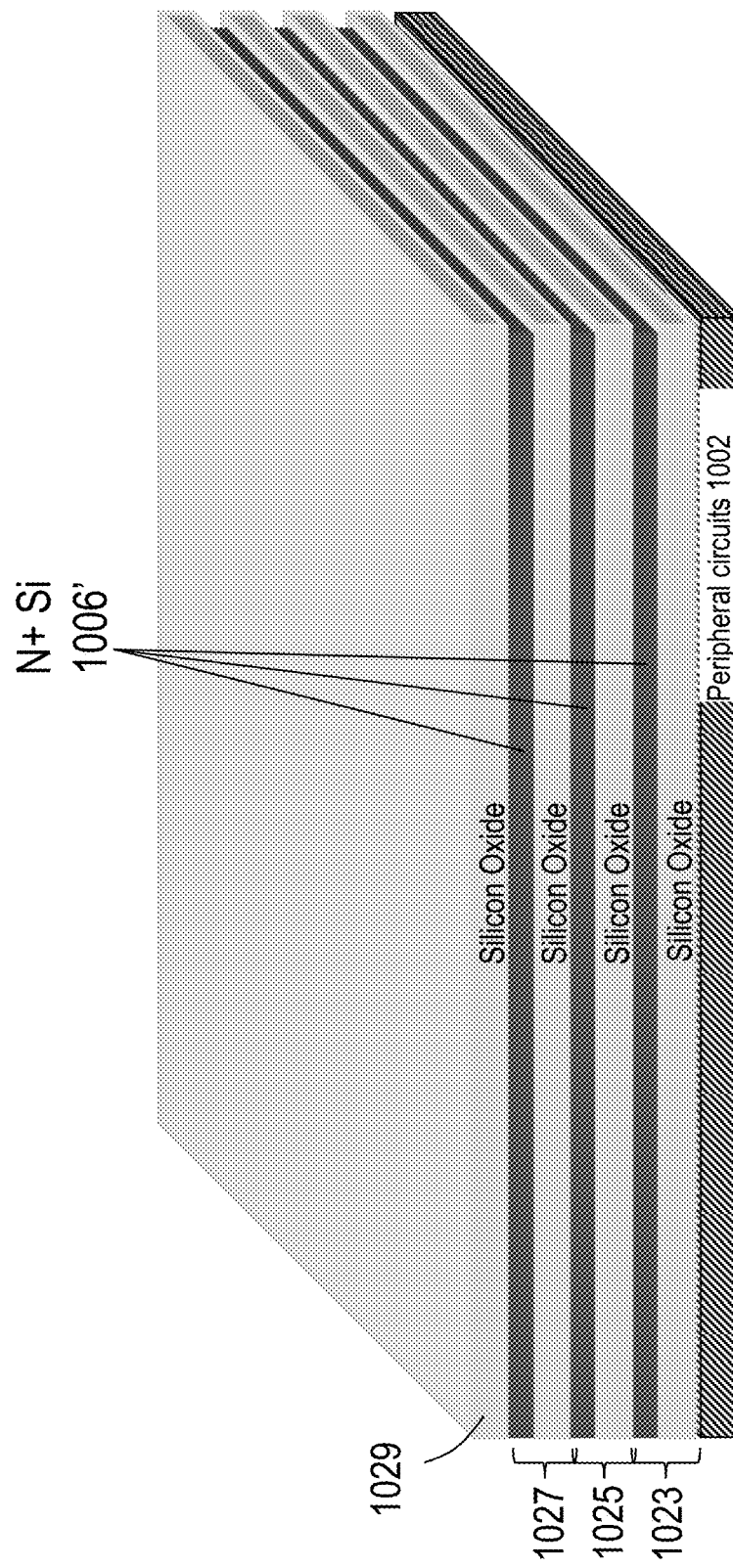

As illustrated in FIG. 10D, additional Si/SiO$_2$ layers, such as, for example, second Si/SiO$_2$ layer 1025 and third Si/SiO$_2$ layer 1027, may each be formed as described in FIGS. 10A to 10C. Oxide layer 1029 may be deposited to electrically isolate the top N+ silicon layer.

Figure 10E:
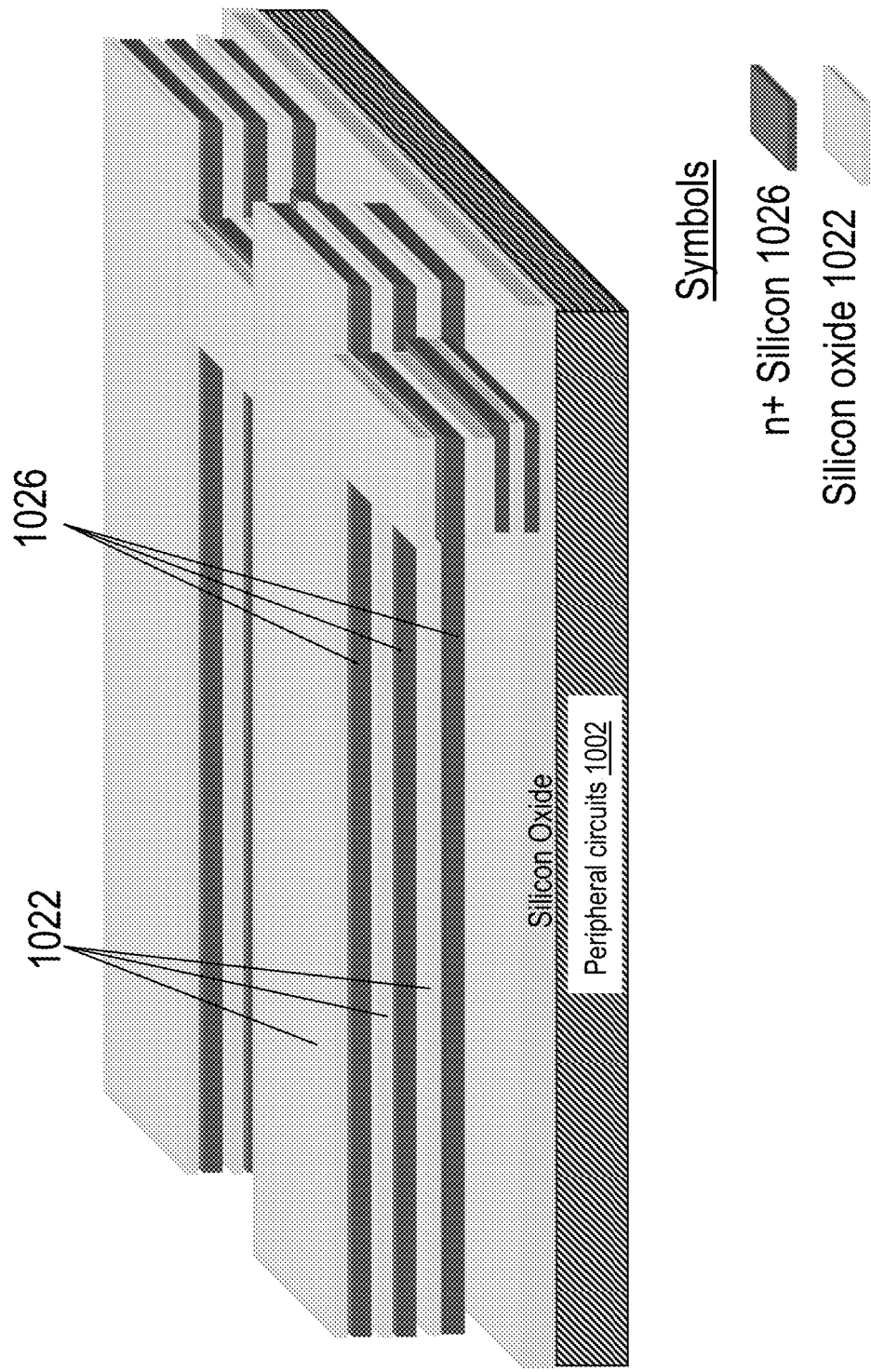

As illustrated in FIG. 10E, oxide layer 1029, third Si/SiO$_2$ layer 1027, second Si/SiO$_2$ layer 1025 and first Si/SiO$_2$ layer 1023 may be lithographically defined and plasma/RIE etched to form a portion of the memory cell structure, which now includes regions of N+ silicon 1026 and oxide 1022.

Figure 10F:
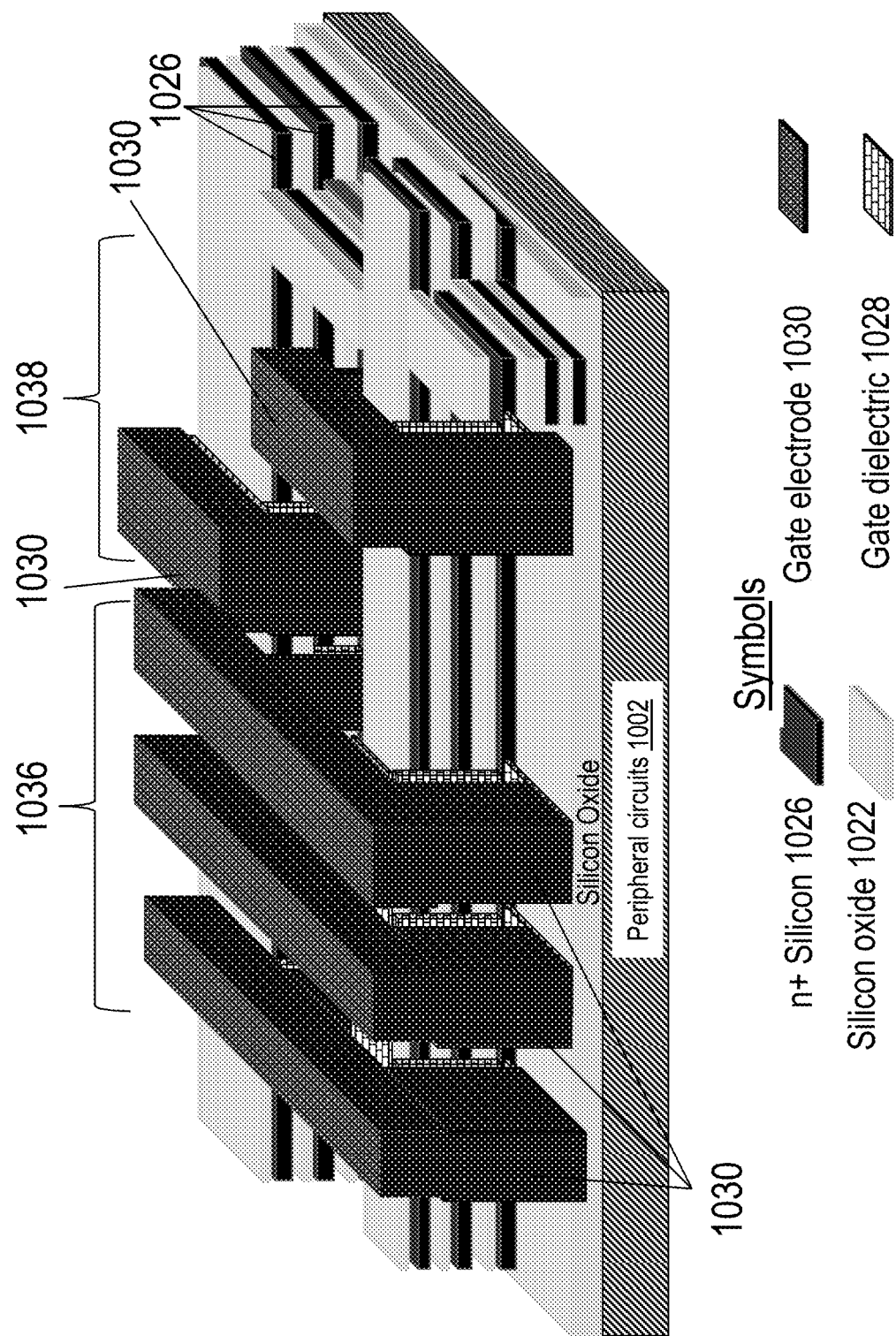

As illustrated in FIG. 10F, a gate stack may be formed with growth or deposition of a charge trap gate dielectric layer, such as, for example, thermal oxide and silicon nitride layers (ONO: Oxide-Nitride-Oxide), and a gate metal electrode layer, such as, for example, doped or undoped polycrystalline silicon. The gate metal electrode layer may then be planarized with chemical mechanical polishing. Alternatively, the charge trap gate dielectric layer may include silicon or III-V nano-crystals encased in an oxide. The select transistor gate area 1038 may include a non-charge trap dielectric. The gate metal electrode regions 1030 and gate dielectric regions 1028 of both the NAND string area 1036 and select transistor gate area 1038 may be lithographically defined and plasma/RIE etched.

Figure 10G:
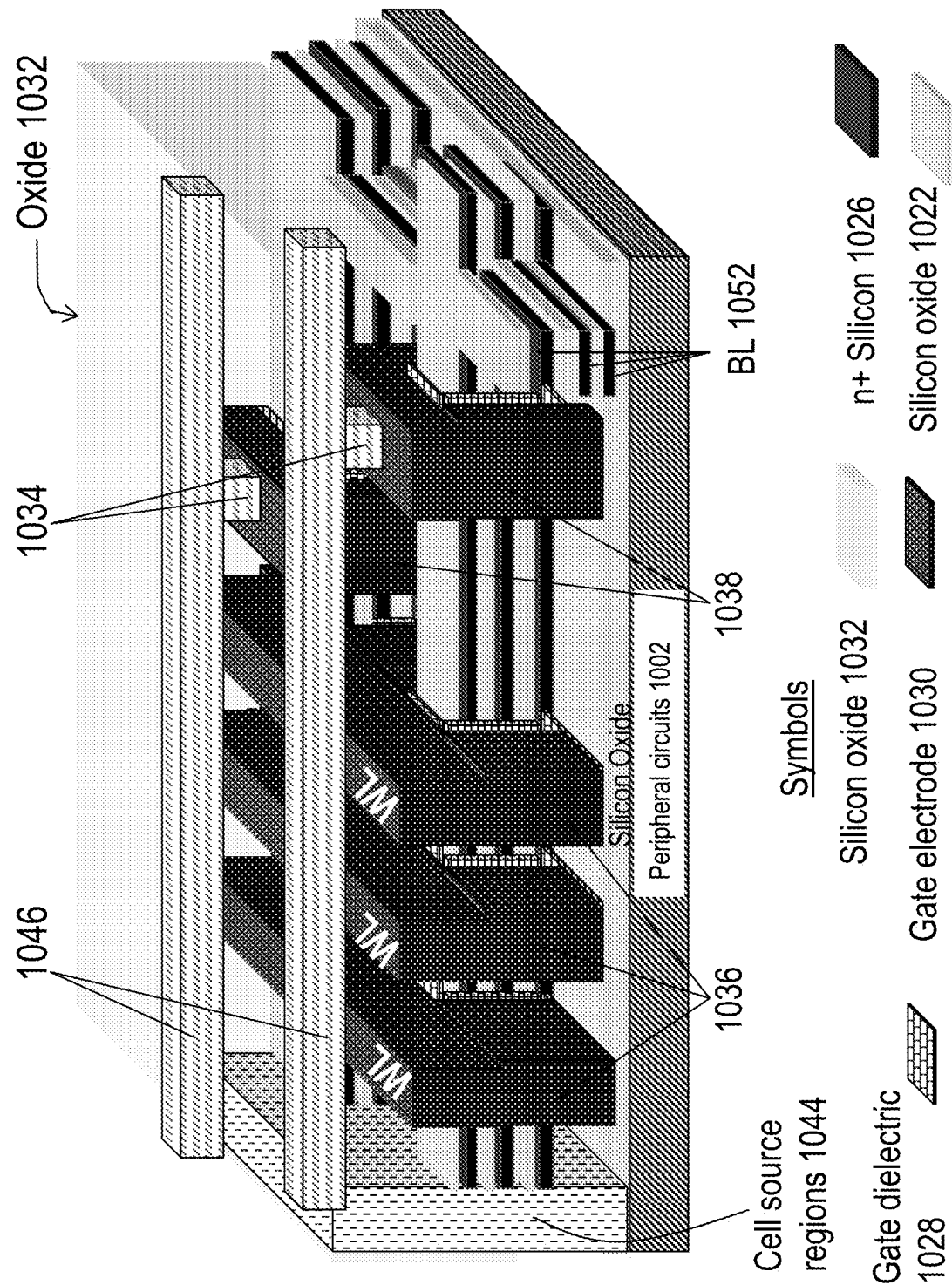

As illustrated in FIG. 10G, the entire structure may be substantially covered with a gap fill oxide 1032, which may be planarized with chemical mechanical polishing. The oxide 1032 is shown transparent in the figure for clarity. Select metal lines 1046 may be formed and connect to the associated select gate contacts 1034. Contacts and associated metal interconnect lines (not shown) may be formed for the WL and SL at the memory array edges. Word-line regions (WL) 1036, coupled with and composed of gate metal electrode regions 1030, and bit-line regions (BL) 1052, composed of indicated N+ silicon regions 1026, are shown. Source regions 1044 may be formed by trench contact etch and fill to couple to the N+ silicon regions on the source end of the NAND string. A thru layer via (not shown) may be formed to electrically couple the BL, SL, and WL metallization to the acceptor wafer 1014 peripheral circuitry via an acceptor wafer metal connect pad (not shown).

This flow enables the formation of a charge trap based 3D memory with zero additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 10A through 10G are exemplary only and are not drawn to scale. Such skilled persons will further appreciate that many variations are possible such as, for example, BL or SL contacts may be constructed in a staircase manner as described previously. Additionally, the stacked memory layer may be connected to a periphery circuit that may be above the memory stack. Moreover, each tier of memory could be configured with a slightly different donor wafer N+ layer doping profile. Further, the memory could be organized in a different manner, such as BL and SL interchanged, or where buried wiring for the memory array may be below the memory layers but above the periphery. Additional types of 3D charge trap memories may be constructed by layer transfer of mono-crystalline silicon; for example, those found in "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. and "Multi-layered Vertical Gate NAND Flash overcoming stacking limit for terabit density storage", Symposium on VLSI Technology, 2009 by W. Kim, S. Choi, et al. Many other modifications within the scope of the invention will suggest themselves to such skilled persons after reading this specification. Thus the invention is to be limited only by the appended claims.

As illustrated in FIGS. 11A to 11J, an n-channel 4-sided gated junction-less transistor (JLT) may be constructed that may be suitable for 3D IC manufacturing. 4-sided gated JLTs can also be referred to as gate-all around JLTs or silicon nanowire JLTs.

Figure 11A:
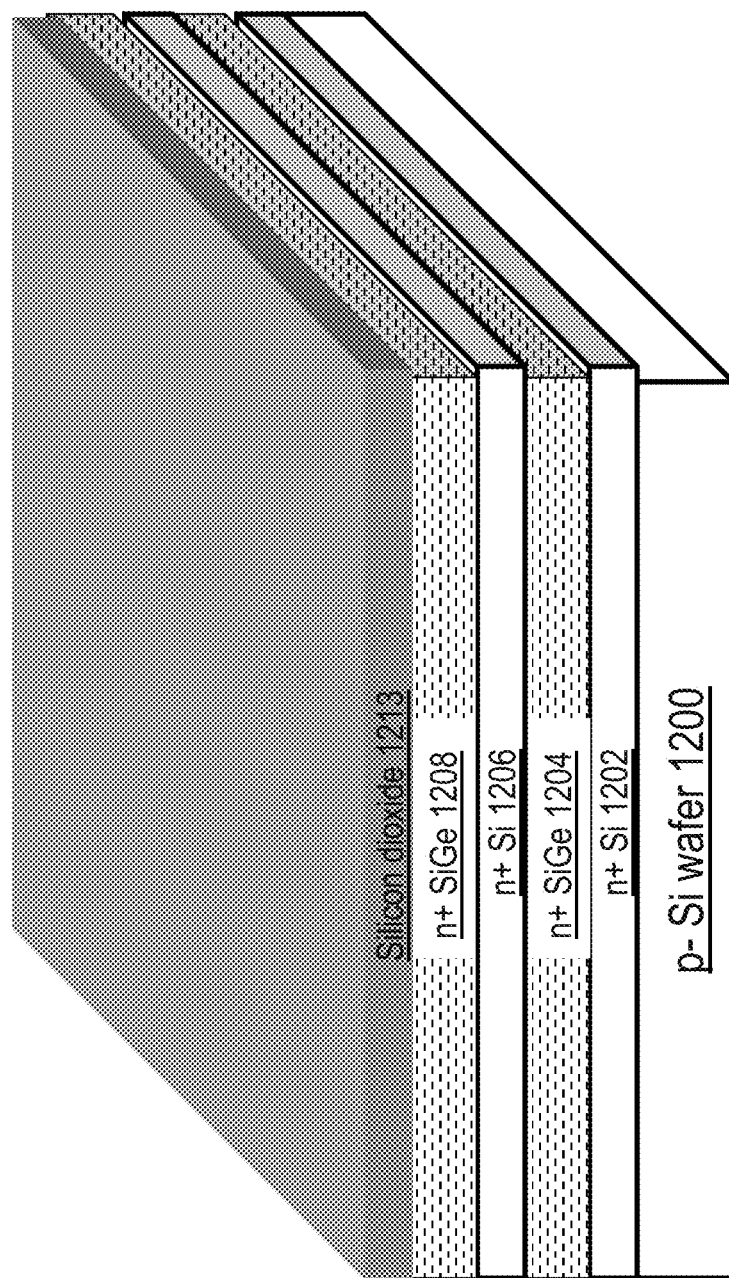
FIGS. 11A-11J are exemplary drawing illustrations of the formation of a junction-less transistor.

As illustrated in FIG. 11A, a P− (shown) or N− substrate donor wafer 1200 may be processed to include wafer sized layers of N+ doped silicon 1202 and 1206, and wafer sized layers of n+ SiGe 1204 and 1208. Layers 1202, 1204, 1206, and 1208 may be grown epitaxially and may be carefully engineered in terms of thickness and stoichiometry to keep the defect density that may result from the lattice mismatch between Si and SiGe low. The stoichiometry of the SiGe may be unique to each SiGe layer to provide for different etch rates as may be described later. Some techniques for achieving this include keeping the thickness of the SiGe layers below the critical thickness for forming defects. The top surface of P− substrate donor wafer 1200 may be prepared for oxide wafer bonding with a deposition of an oxide 1213. These processes may be done at temperatures above approximately 400° C. as the layer transfer to the processed substrate with metal interconnects has yet to be done. The N+ doping layers 1202 and 1206 may have a doping concentration that may be more than 10× the doping concentration of P− substrate donor wafer 1200.

Figure 11B:
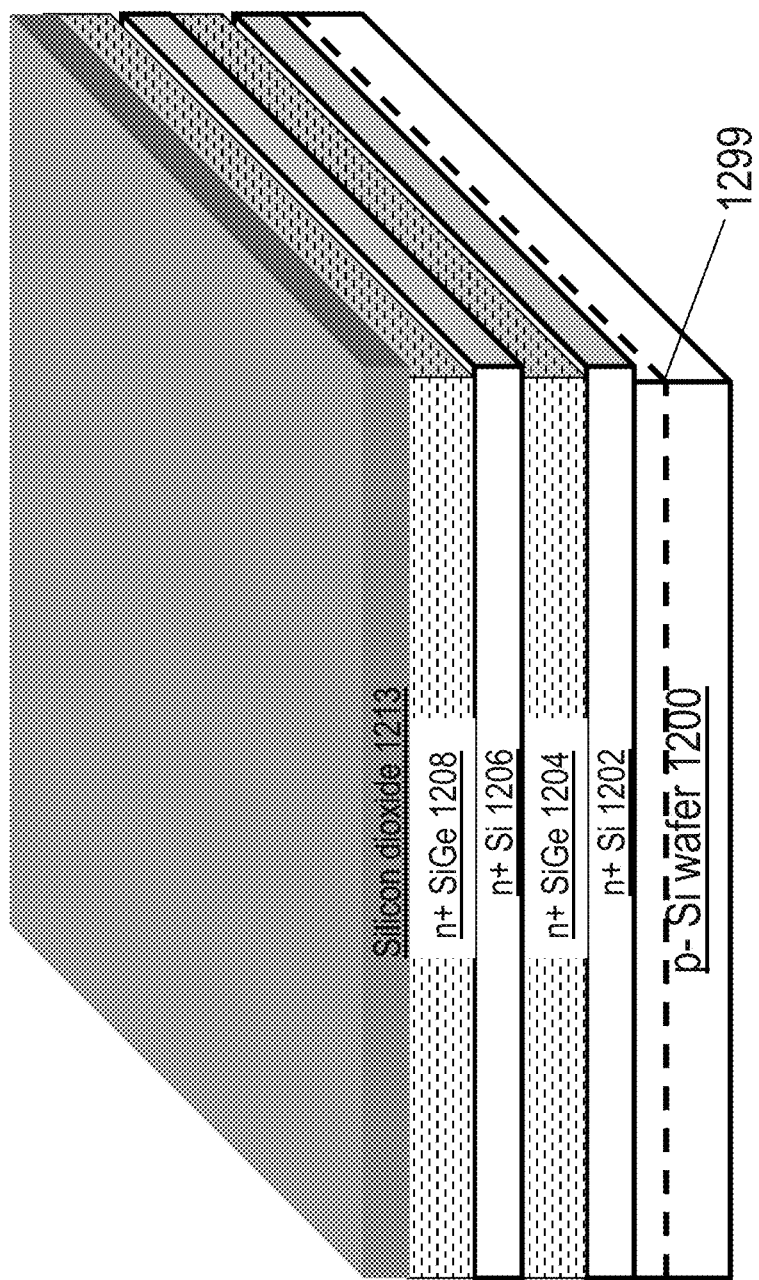

As illustrated in FIG. 11B, a layer transfer demarcation plane 1299 (shown as a dashed line) may be formed in P− substrate donor wafer 1200 by hydrogen implantation or other methods as previously described.

Figure 11C:
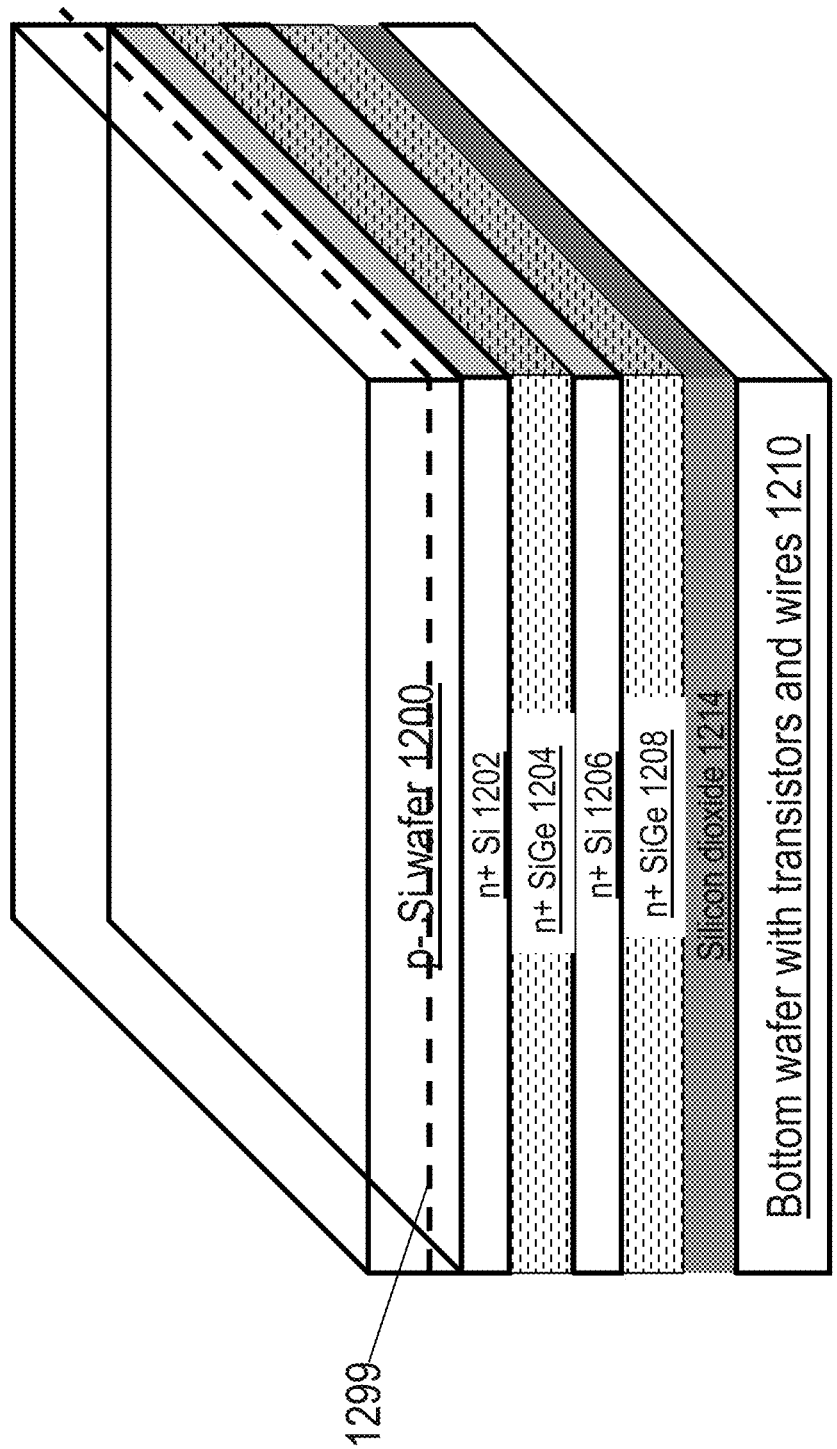

As illustrated in FIG. 11C, both the P− substrate donor wafer 1200 and acceptor wafer 1210 top layers and surfaces may be prepared for wafer bonding as previously described and then P− substrate donor wafer donor wafer 1200 may be flipped over, aligned to the acceptor wafer 1210 alignment marks (not shown) and bonded together at a low temperature (less than approximately 400° C.). Oxide 1213 from the donor wafer and the oxide of the surface of the acceptor wafer 1210 may thus be atomically bonded together are designated as oxide 1214.

Figure 11D:
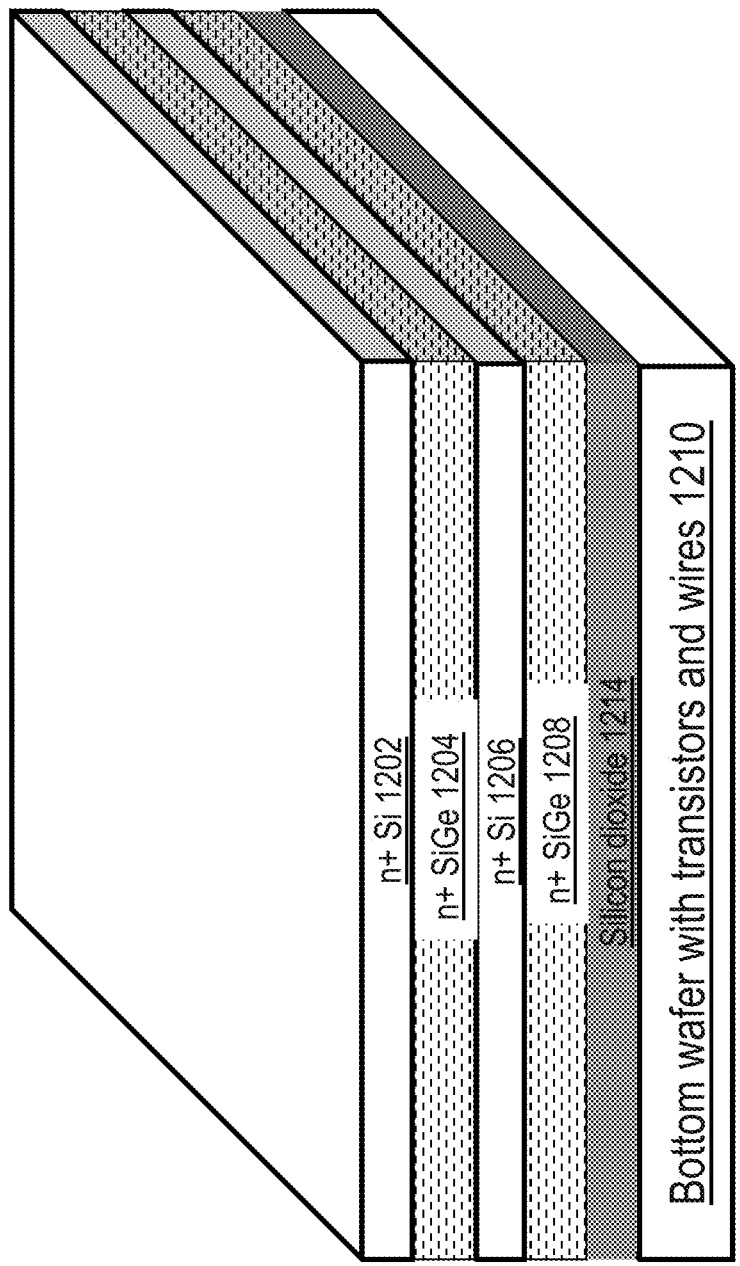

As illustrated in FIG. 11D, the portion of the P− donor wafer substrate 1200 that is above the layer transfer demarcation plane 1299 may be removed by cleaving and polishing, or other low temperature processes as previously described, such as, for example, ion-cut or other layer transfer methods. A CMP process may be used to remove the remaining P− layer until the N+ silicon layer 1202 may be reached.

Figure 11E:
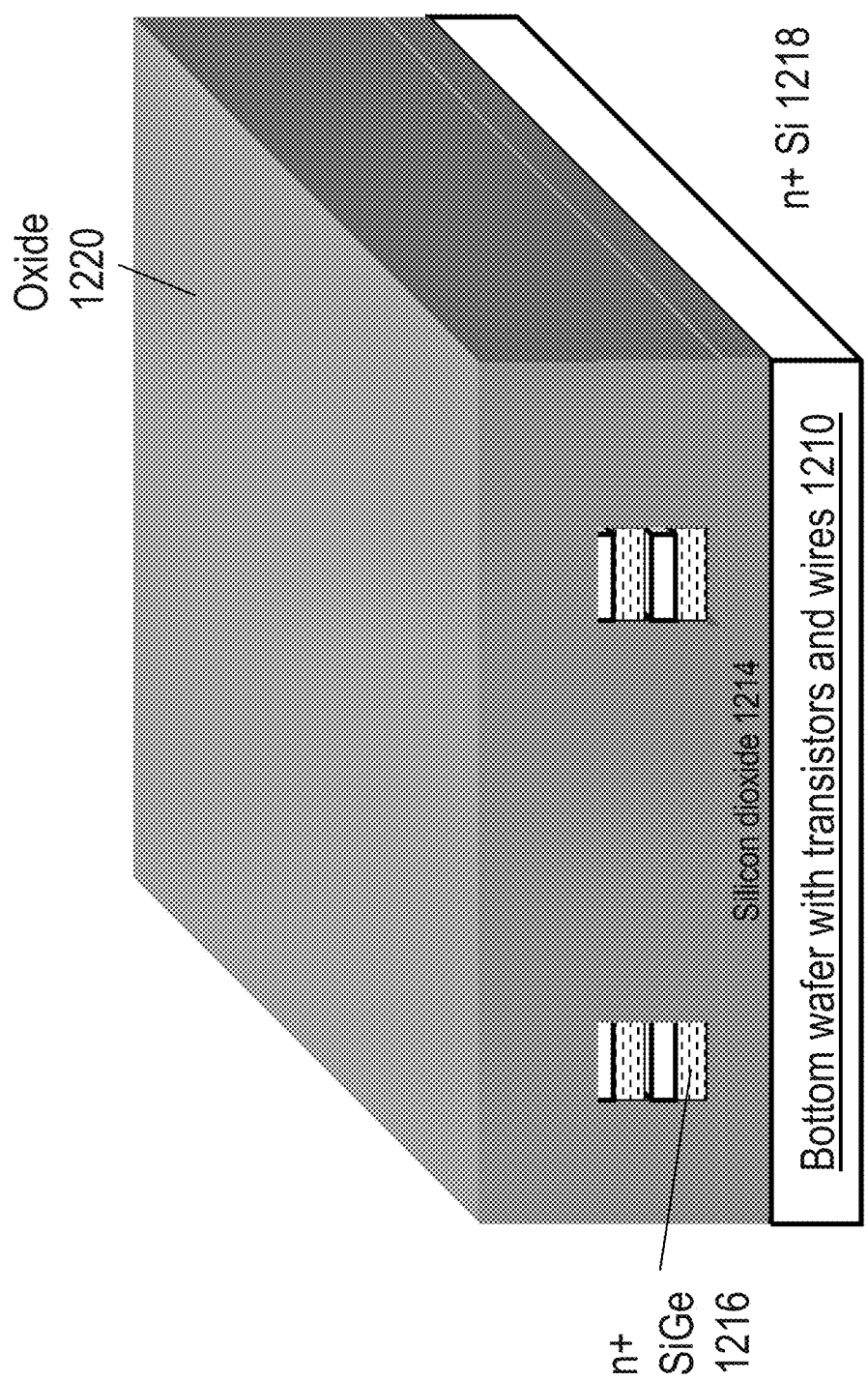

As illustrated in FIG. 11E, stacks of N+ silicon and n+ SiGe regions that may become transistor channels and gate areas may be formed by lithographic definition and plasma/RIE etching of N+ silicon layers 1202 & 1206 and n+ SiGe layers 1204 & 1208. The result may be stacks of n+ SiGe 1216 and N+ silicon 1218 regions. The isolation among stacks may be filled with a low temperature gap fill oxide 1220 and chemically and mechanically polished (CMP'ed) flat. This may fully isolate the transistors from each other. The stack ends are exposed in the illustration for clarity of understanding.

Figure 11F:
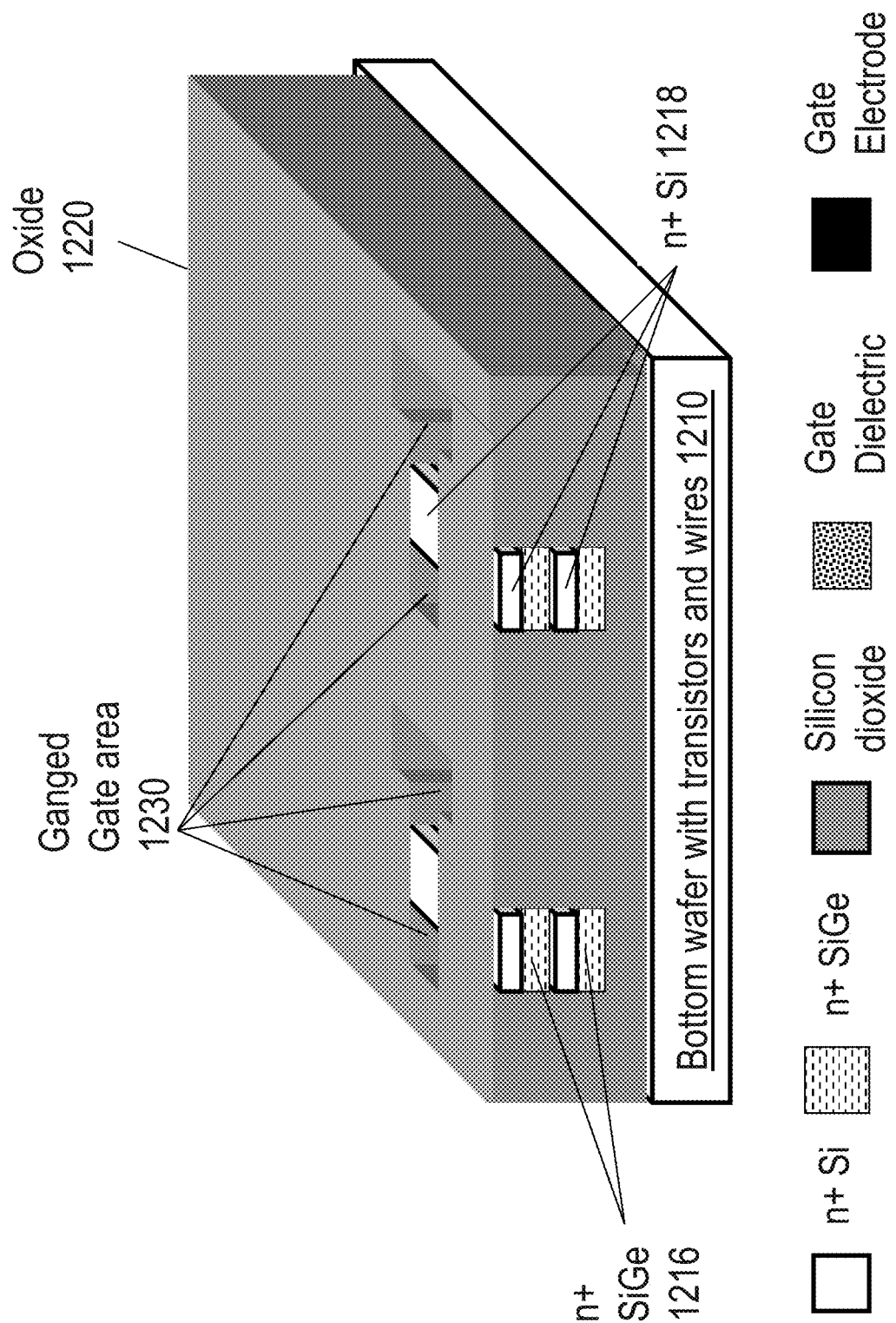

As illustrated in FIG. 11F, eventual ganged or common gate area 1230 may be lithographically defined and oxide etched. This may expose the transistor channels and gate area stack sidewalls of alternating N+ silicon 1218 and n+ SiGe 1216 regions to the eventual ganged or common gate area 1230. The stack ends are exposed in the illustration for clarity of understanding.

Figure 11G:
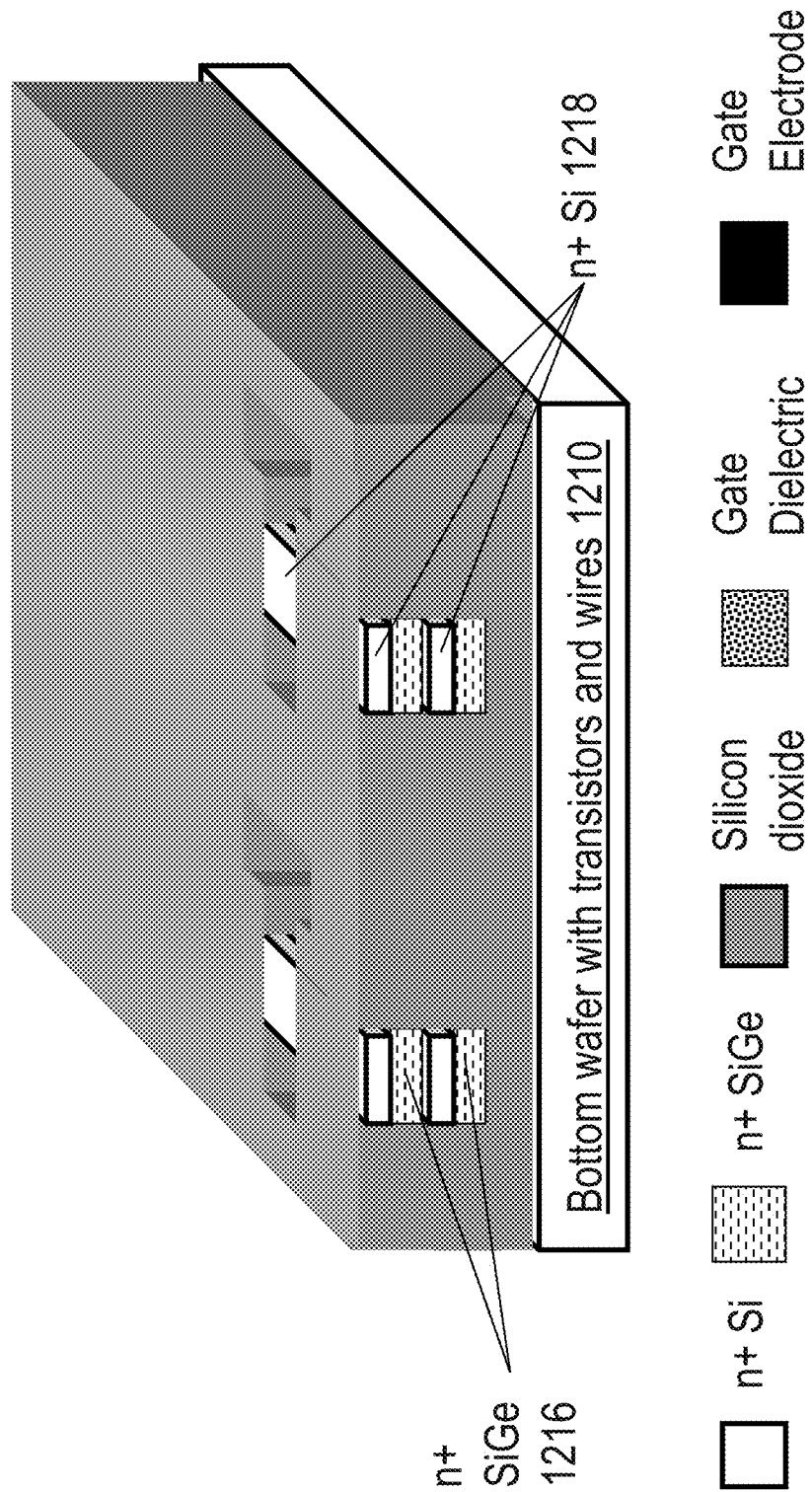

As illustrated in FIG. 11G, the exposed n+ SiGe regions 1216 may be removed by a selective etch recipe that does not attack the N+ silicon regions 1218. This creates air gaps among the N+ silicon regions 1218 in the eventual ganged or common gate area 1230. Such etching recipes are described in at least "High performance 5 nm radius twin silicon nanowire MOSFET (TSNWFET): Fabrication on bulk Si wafer, characteristics, and reliability," in *Proc. IEDMTech. Dig.*, 2005, pp. 717-720 by S. D. Suk, et al. The n+ SiGe layers farthest from the top edge may be stoichiometrically crafted such that the etch rate of the layer (now region) farthest from the top (such as n+ SiGe layer 1208) may etch slightly faster than the layer (now region) closer to the top (such as n+ SiGe layer 1204), thereby equalizing the eventual gate lengths of the two stacked transistors. The stack ends are exposed in the illustration for clarity of understanding.

Figure 11H:
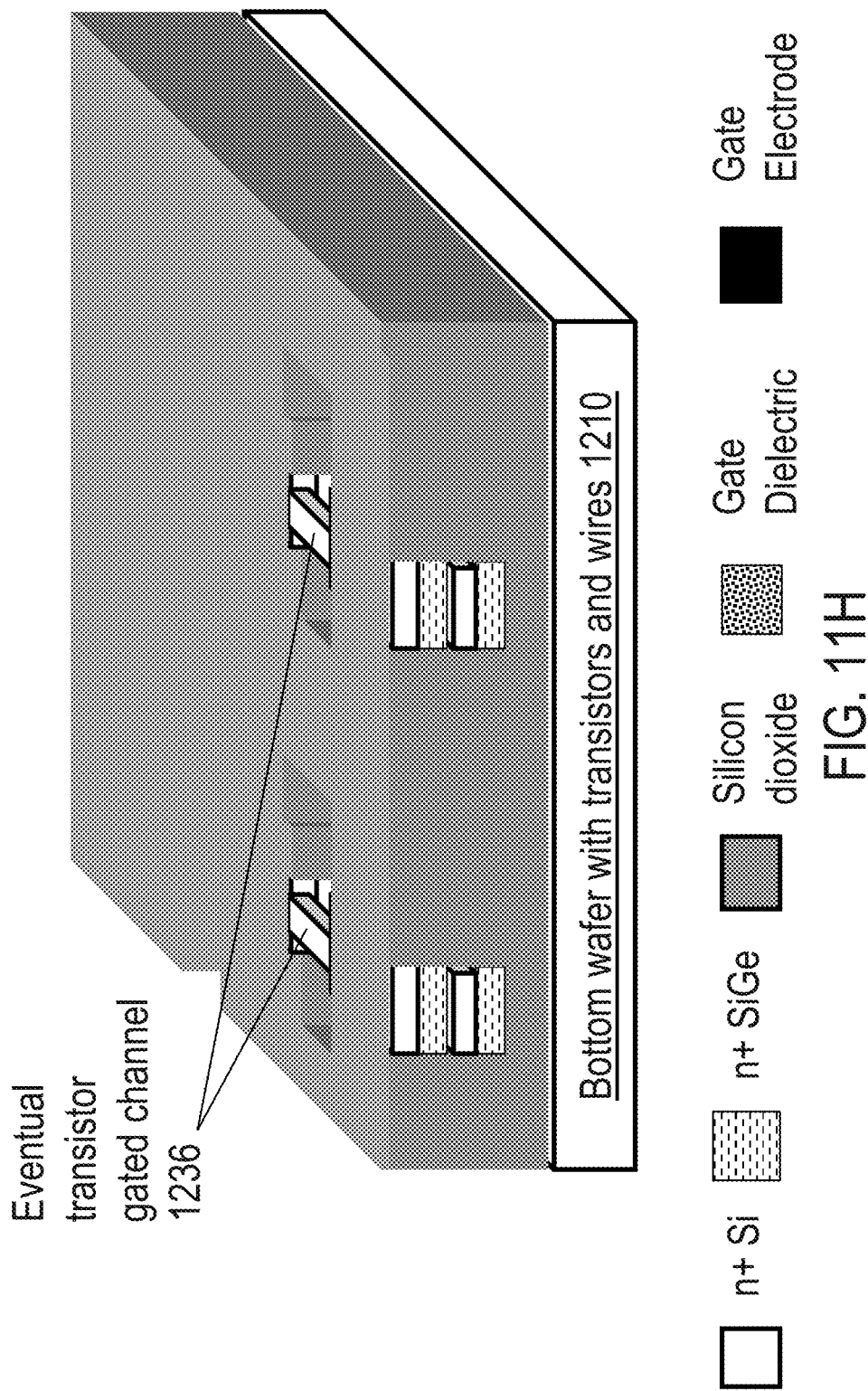

As illustrated in FIG. 11H, a step of reducing the surface roughness, rounding the edges, and thinning the diameter of the N+ silicon regions 1218 that may be exposed in the ganged or common gate area may utilize a low temperature oxidation and subsequent HF etch removal of the oxide just formed. This step may be repeated multiple times. Hydrogen may be added to the oxidation or separately utilized as a plasma treatment to the exposed N+ silicon surfaces. The result may be a rounded silicon nanowire-like structure to form the eventual transistor gated channel 1236. The stack ends are exposed in the illustration for clarity of understanding.

Figure 11I:
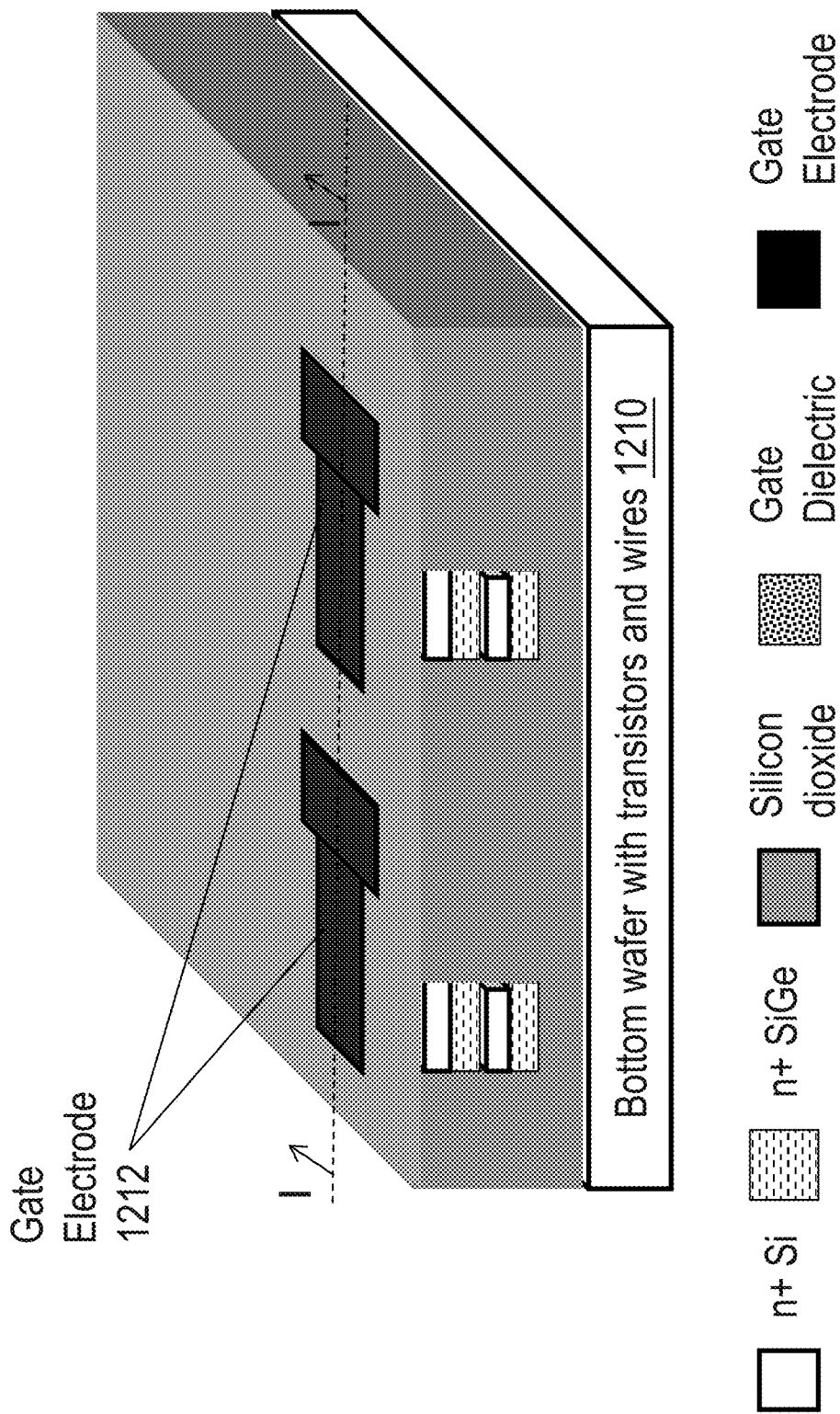

As illustrated in FIG. 11I a low temperature based Gate Dielectric (not shown in this FIG.) may be deposited and densified to serve as the junction-less transistor gate oxide. Alternatively, a low temperature microwave plasma oxidation of the eventual transistor gated channel 1236 silicon surfaces may serve as the JLT gate oxide or an atomic layer deposition (ALD) technique may be utilized to form the HKMG gate oxide as previously described. Then deposition of a low temperature gate material with proper work function and less than approximately 400° C. deposition temperature, such as, for example, P+ doped amorphous silicon, may be performed, to form gate 1212. Alternatively, a HKMG gate structure may be formed as described previously. A CMP may be performed after the gate material deposition. The stack ends are exposed in the illustration for clarity of understanding.

Figure 11J:
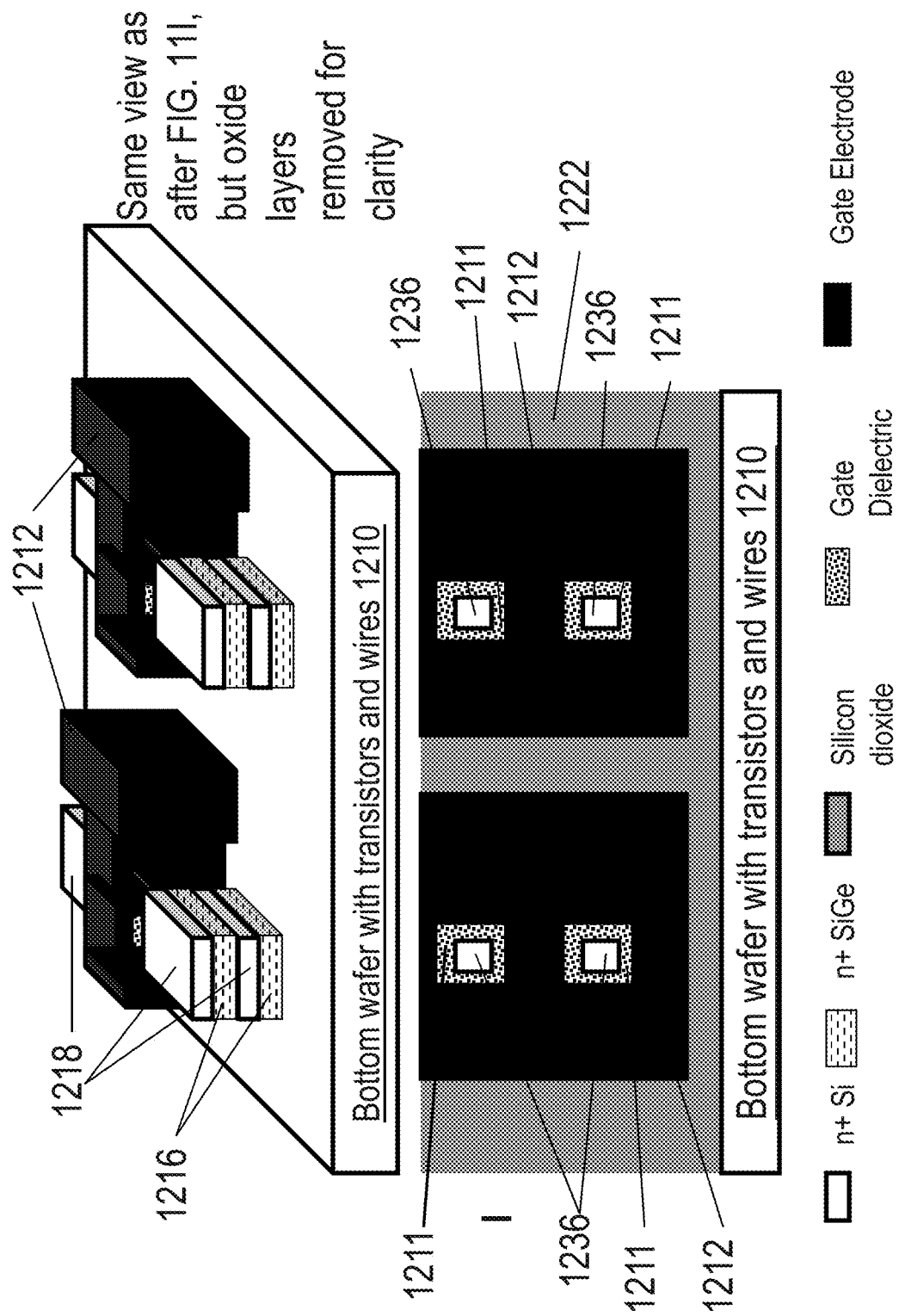

FIG. 11J illustrates the JLT transistor stack formed in FIG. 11I with the oxide removed for clarity of viewing, and a cross-sectional cut I of FIG. 11I. Gate 1212 and gate dielectric 1211 surrounds the transistor gated channel 1236 and each ganged or common transistor stack may be isolated from one another by oxide 1222. The source and drain connections of the transistor stacks can be made to N+ Silicon 1218 & n+ SiGe 1216 regions that may not be covered by the gate 1212.

Contacts to the 4-sided gated JLT source, drain, and gate may be made with conventional Back end of Line (BEOL) processing as described previously and coupling from the formed JLTs to the acceptor wafer may be accomplished with formation of a thru layer via connection to an acceptor wafer metal interconnect pad also described previously. This flow enables the formation of a mono-crystalline silicon channel 4-sided gated junction-less transistor that may be formed and connected to the underlying multi-metal layer semiconductor device without exposing the underlying devices to a high temperature.

A p channel 4-sided gated JLT may be constructed as above with the N+ silicon layers 1202 and 1208 formed as P+ doped, and the gate metals of gate 1212 may be of appropriate work function to shutoff the p channel at a gate voltage of zero.

While the process flow shown in FIGS. 11A-11J illustrates the key steps involved in forming a four-sided gated JLT with 3D stacked components, it is conceivable to one skilled in the art that changes to the process can be made. For example, process steps and additional materials/regions, such as a stressed oxide within the transistor isolation regions, to add strain to JLTs may be added. Additionally, N+ SiGe layers 1204 and 1208 may instead include p+ SiGe or undoped SiGe and the selective etchant formula adjusted. Furthermore, more than two layers of chips or circuits can be 3D stacked. Moreover there may be many methods to construct silicon nanowire transistors. These are described in at least "High performance and highly uniform gate-all-around silicon nanowire MOSFETs with wire size dependent scaling," *Electron Devices Meeting (IEDM)*, 2009 *IEEE International*, vol., no., pp. 1-4, 7-9 Dec. 2009 by Bangsaruntip, S.; Cohen, G. M.; Majumdar, A.; et al. ("Bangsaruntip") and in "High performance 5 nm radius twin silicon nanowire MOSFET (TSNWFET): Fabrication on bulk Si wafer, characteristics, and reliability," in *Proc. IEDM Tech. Dig.*, 2005, pp. 717-720 by S. D. Suk, S.-Y. Lee, S.-M. Kim, et al. ("Suk"). Contents of these publications are incorporated by reference in this document. The techniques described in these publications can be utilized for fabricating four-sided gated JLTs.

Turning the channel off with minimal leakage at an approximately zero gate bias may be a major challenge for a junction-less transistor device. To enhance gate control over the transistor channel, the channel may be doped unevenly; whereby the heaviest doping may be closest to the gate or gates and the channel doping may be lighter farther away from the gate electrode. For example, the cross-sectional center of a 2, 3, or 4 gate sided junction-less transistor channel may be more lightly doped than the edges. This may enable much lower transistor off currents for the same gate work function and control.

It will also be appreciated by persons of ordinary skill in the art that the invention is not limited to what has been particularly shown and described hereinabove. For example, drawings or illustrations may not show n or p wells for clarity in illustration. Further, combinations and sub-combinations of the various features described hereinabove may be utilized to form a 3D IC based system. Rather, the scope of the invention includes both combinations and sub-combinations of the various features described hereinabove as well as modifications and variations which would occur to such skilled persons upon reading the foregoing description. Thus the invention is to be limited only by the appended claims.

We claim:

1. A 3D semiconductor device, the device comprising:
 a first level comprising a plurality of first metal layers;
 a second level,
  wherein said second level overlays said first level,
  wherein said second level comprises at least one single crystal silicon layer,
  wherein said second level comprises a plurality of transistors,
  wherein each transistor of said plurality of transistors comprises a single crystal channel,
  wherein said second level comprises a plurality of second metal layers,
  wherein said plurality of second metal layers comprise interconnections between said transistors of said plurality of transistors, and
  wherein said second level is overlaid by a first isolation layer; and
 a connective path from said plurality of transistors to said plurality of first metal layers,
  wherein said connective path comprises at least one via disposed through at least said single crystal silicon layer,
  wherein at least one of said at least one via comprises a contact to at least one of said transistors,
  wherein at least one of said plurality of transistors comprises a first channel and a second channel, and
  wherein said second channel overlays said first channel.

2. A 3D semiconductor device, the device comprising:
 a first level comprising a plurality of first metal layers;
 a second level,
  wherein said second level overlays said first level,
  wherein said second level comprises at least one single crystal silicon layer,
  wherein said second level comprises a plurality of transistors,
  wherein each transistor of said plurality of transistors comprises a single crystal channel,
  wherein said second level comprises a plurality of second metal layers,
  wherein said plurality of second metal layers comprise interconnections between said transistors of said plurality of transistors, and
  wherein said second level is overlaid by a first isolation layer; and
 a connective path from said plurality of transistors to said plurality of first metal layers,
  wherein said connective path comprises at least one via disposed through at least said single crystal silicon layer,
  wherein at least one of said at least one via comprises a contact to at least one of said transistors, and
  wherein at least one of said transistors comprises a four sided gate.

3. A 3D semiconductor device, the device comprising:
 a first level comprising a plurality of first metal layers;
 a second level,
  wherein said second level overlays said first level,
  wherein said second level comprises at least one single crystal silicon layer,
  wherein said second level comprises a plurality of transistors,
  wherein each transistor of said plurality of transistors comprises a single crystal channel,
  wherein said second level comprises a plurality of second metal layers,
  wherein said plurality of second metal layers comprise interconnections between said transistors of said plurality of transistors, and
  wherein said second level is overlaid by a first isolation layer; and a connective path from said plurality of transistors to said plurality of first metal layers,
  wherein said connective path comprises a via disposed through at least said single crystal silicon layer,
  wherein said via comprises tungsten, and
  wherein said single crystal silicon layer thickness is less than two microns.

4. The device according to claim 3,
wherein said transistors of said plurality of transistors are aligned to said first metal layers with a less than 40 nm alignment error.

5. The device according to claim 3, further comprising:
a third level comprising single crystal third transistors,
  wherein said first isolation layer is overlaid by said third level,
  wherein said third level is overlaid by a second isolation layer,
  wherein said third level is bonded to said first isolation layer, and
    wherein said bonded comprises at least one oxide-to-oxide bond.

6. The device according to claim 3,
wherein said via has a diameter of less than 400 nm and greater than 5 nm.

7. The device according to claim 3,
wherein at least one of said plurality of transistors comprises a gate all around (GAA) structure.

8. The device according to claim 3,
wherein said first metal layers comprise Vdd supply lines.

9. The device according to claim 3,
wherein said via is part of a connective path from at least one of said transistors to at least one of said first metal layers, and
wherein at least one of said via comprises a contact to at least one of said transistors.

10. A 3D semiconductor device, the device comprising:
a first level comprising a plurality of first metal layers;
a second level,
  wherein said second level overlays said first level,
  wherein said second level comprises at least one single crystal silicon layer,
  wherein said second level comprises a plurality of transistors,
  wherein each transistor of said plurality of transistors comprises a single crystal channel,
  wherein said second level comprises a plurality of second metal layers,
  wherein said plurality of second metal layers comprise interconnections between said transistors of said plurality of transistors, and
  wherein said second level is overlaid by a first isolation layer; and
a connective path from said plurality of transistors to said plurality of first metal layers,
  wherein said connective path comprises a via disposed through at least said single crystal silicon layer,
  wherein said second level comprises a plurality of capacitors, and
  wherein said first metal layers comprise Vdd supply lines and Vss supply lines.

11. The device according to claim 10,
wherein said single crystal silicon layer has a thickness of less than 2,000 nm and greater than 5 nm.

12. The device according to claim 10, further comprising:
a third level comprising single crystal third transistors,
  wherein said first isolation layer is overlaid by said third level,
  wherein said third level is overlaid by a second isolation layer,
  wherein said third level is bonded to said first isolation layer, and
    wherein said bonded comprises at least one oxide-to-oxide bond.

13. The device according to claim 10,
wherein at least one of said plurality of transistors comprises a first single crystal channel and a second single crystal channel, and
wherein said second single crystal channel overlays said first single crystal channel.

14. The device according to claim 10,
wherein said transistors are aligned to said first metal layers with a less than 40 nm alignment error.

15. The device according to claim 10, further comprising:
a plurality of capacitors.

* * * * *